(12) United States Patent
Huang et al.

(10) Patent No.: US 11,188,703 B2
(45) Date of Patent: Nov. 30, 2021

(54) INTEGRATED CIRCUIT, SYSTEM, AND METHOD OF FORMING THE SAME

(71) Applicant: TAIWAN SEMICONDUCTOR MANUFACTURING COMPANY, LTD., Hsinchu (TW)

(72) Inventors: Sang-Chi Huang, Hsinchu (TW); Hui-Zhong Zhuang, Kaohsiung (TW); Jung-Chan Yang, Longtan Township (TW); Pochun Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/579,138

(22) Filed: Sep. 23, 2019

(65) Prior Publication Data

US 2020/0104451 A1    Apr. 2, 2020

Related U.S. Application Data

(60) Provisional application No. 62/738,776, filed on Sep. 28, 2018.

(51) Int. Cl.
*G06F 30/394* (2020.01)
*H01L 27/02* (2006.01)
*G06F 30/392* (2020.01)

(52) U.S. Cl.
CPC .......... *G06F 30/394* (2020.01); *G06F 30/392* (2020.01); *H01L 27/0207* (2013.01)

(58) Field of Classification Search
CPC ...... G06F 30/394; G06F 30/392; G06F 30/39; H01L 27/0207; H01L 2027/11875; H01L 23/50

See application file for complete search history.

(56) References Cited

U.S. PATENT DOCUMENTS 7,260,442 B2    8/2007  Hwang et al.
8,264,044 B2 *  9/2012  Becker .............. H01L 23/49844
                                                    257/369

(Continued)

FOREIGN PATENT DOCUMENTS

DE    102013106383    1/2014
TW    201544981      12/2015
TW    201820541       6/2018

OTHER PUBLICATIONS

Office Action dated Feb. 17, 2021 for corresponding case No. 10-2019125632.1. (pp. 1-13).

(Continued)

*Primary Examiner* — Nha T Nguyen
(74) *Attorney, Agent, or Firm* — Hauptman Ham, LLP

(57) ABSTRACT

A method of forming an integrated circuit includes generating a first and a second standard cell layout design, generating a first set of cut feature layout patterns extending in a first direction, and manufacturing the integrated circuit based on the first or second standard cell layout design. Generating the first standard cell layout design includes generating a first set of conductive feature layout patterns extending in the first direction, and overlapping a first set of gridlines extending in the first direction. Generating the second standard cell layout design includes generating a second set of conductive feature layout patterns extending in the first direction and overlapping a second set of gridlines extending in the first direction. A side of a first cut feature layout pattern extending in the first direction is aligned with a first gridline of the first or second set of gridlines.

20 Claims, 17 Drawing Sheets

(56) References Cited

U.S. PATENT DOCUMENTS

| | | | |
|---|---|---|---|
| 8,495,549 B2* | 7/2013 | Maruyama | B82Y 10/00 716/126 |
| 8,621,406 B2* | 12/2013 | Lei | H01L 27/0207 716/110 |
| 8,667,443 B2* | 3/2014 | Smayling | G06F 30/39 716/119 |
| 8,918,746 B1* | 12/2014 | Yuan | H01L 27/0207 716/54 |
| 9,213,793 B1* | 12/2015 | Salowe | G06F 30/394 |
| 9,256,709 B2 | 2/2016 | Yu et al. | |
| 9,529,954 B1* | 12/2016 | Haigh | H01L 27/11807 |
| 10,192,021 B1* | 1/2019 | Raj | G06F 30/392 |
| 10,229,239 B2* | 3/2019 | Pandey | G06F 30/394 |
| 10,747,937 B2* | 8/2020 | Park | G06F 30/392 |
| 2003/0155587 A1 | 8/2003 | Smith et al. | |
| 2004/0195690 A1 | 10/2004 | Flohr | |
| 2012/0124528 A1* | 5/2012 | Wang | G06F 30/39 716/52 |
| 2012/0249182 A1* | 10/2012 | Sherlekar | G06F 30/394 326/101 |
| 2013/0019220 A1* | 1/2013 | Maruyama | B82Y 10/00 716/126 |
| 2013/0126978 A1* | 5/2013 | Becker | H01L 21/823821 257/369 |
| 2013/0187237 A1* | 7/2013 | Yu | H01L 29/785 257/369 |
| 2013/0207199 A1 | 8/2013 | Becker et al. | |
| 2013/0334576 A1* | 12/2013 | Park | G06F 30/394 257/204 |
| 2014/0040838 A1 | 2/2014 | Liu et al. | |
| 2014/0181774 A1* | 6/2014 | Hatamian | G06F 30/392 716/122 |
| 2014/0346662 A1* | 11/2014 | Rashed | G06F 30/392 257/734 |
| 2015/0048425 A1* | 2/2015 | Park | H01L 27/11807 257/211 |
| 2015/0278429 A1 | 10/2015 | Chang | |
| 2015/0286764 A1* | 10/2015 | Yuan | G06F 30/392 716/55 |
| 2015/0347659 A1 | 12/2015 | Chiang et al. | |
| 2016/0300840 A1* | 10/2016 | Seo | H01L 23/528 |
| 2016/0335389 A1* | 11/2016 | Yuan | G06F 30/398 |
| 2016/0378906 A1* | 12/2016 | Yuan | G06F 30/398 716/52 |
| 2017/0300608 A1* | 10/2017 | Narisetty | G06F 30/394 |
| 2018/0144082 A1 | 5/2018 | Hanchinal et al. | |
| 2018/0341735 A1* | 11/2018 | Chang | H01L 27/0886 |
| 2019/0065654 A1* | 2/2019 | Liao | G06F 30/398 |

OTHER PUBLICATIONS

Office Action dated Dec. 25, 2020 for corresponding case No. TW 10921253740. (pp. 1-4).

* cited by examiner

INTEGRATED CIRCUIT, SYSTEM, AND METHOD OF FORMING THE SAME

PRIORITY CLAIM

This application claims the benefit of U.S. Provisional Application No. 62/738,776, filed Sep. 28, 2018, which is herein incorporated by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
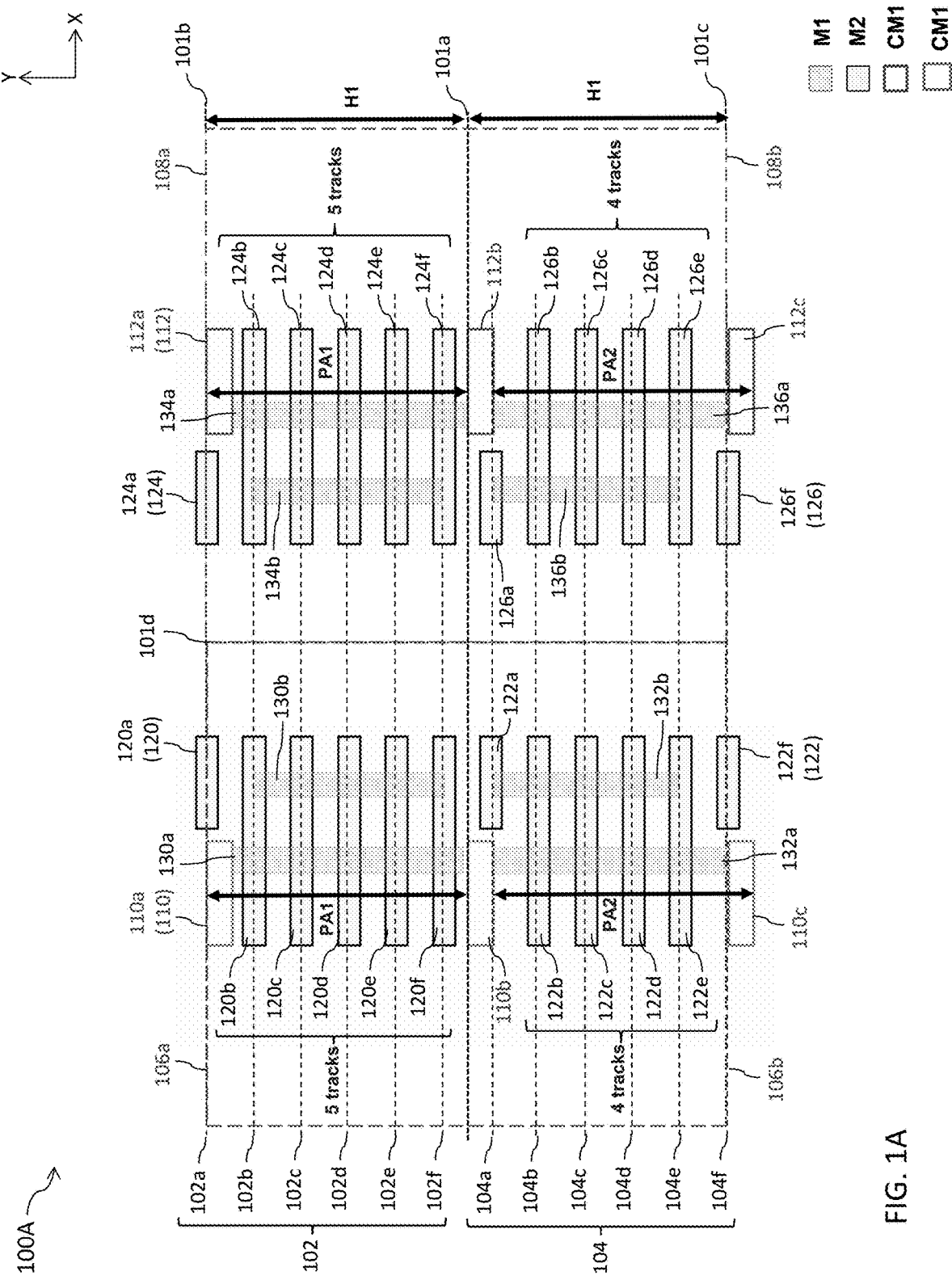
FIGS. 1A-1B are diagrams of a layout design, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a method of forming an IC includes generating a first standard cell layout design of the IC, generating a second standard cell layout design of the IC, generating a first set of cut feature layout patterns, and manufacturing the IC circuit based on at least the first standard cell layout design or the second standard cell layout design.

In some embodiments, the second standard cell layout design abuts the first standard cell layout design in a first direction.

In some embodiments, generating the first standard cell layout design includes generating a first set of conductive feature layout patterns extending in the first direction, being located on a first metal level and overlapping a first set of gridlines extending in the first direction. In some embodiments, the first set of conductive feature layout patterns correspond to fabricating a first set of conductive structures.

In some embodiments, generating the second standard cell layout design includes generating a second set of conductive feature layout patterns extending in the first direction, being located on a first metal level and overlapping a second set of gridlines extending in the first direction. In some embodiments, the second set of gridlines is separated from the first set of gridlines in a second direction different from the first direction. In some embodiments, the second set of conductive feature layout patterns correspond to fabricating a second set of conductive structures.

In some embodiments, a side of a first cut feature layout pattern of the first set of cut feature layout patterns extending in the first direction is aligned with a first gridline of the first set of gridlines or the second set of gridlines. In some embodiments, by positioning the side of the first cut feature layout pattern of the first set of cut feature layout patterns to be aligned with corresponding gridlines in the first or second set of gridlines, the first cut feature layout pattern is sufficiently separated from a conductive feature layout pattern of the first or second set of conductive feature layout patterns to not violate via landing spot design rules, and the first conductive feature layout pattern is useable to manufacture a corresponding conductive structure. In some embodiments, the first conductive feature layout pattern is an additional conductive feature layout pattern that is useable as an additional metal routing track layout pattern in the first or second standard cell layout pattern resulting in additional routing resources that are more efficiently utilized than other approaches.

Layout Design of an Integrated Circuit

Figure 1B:
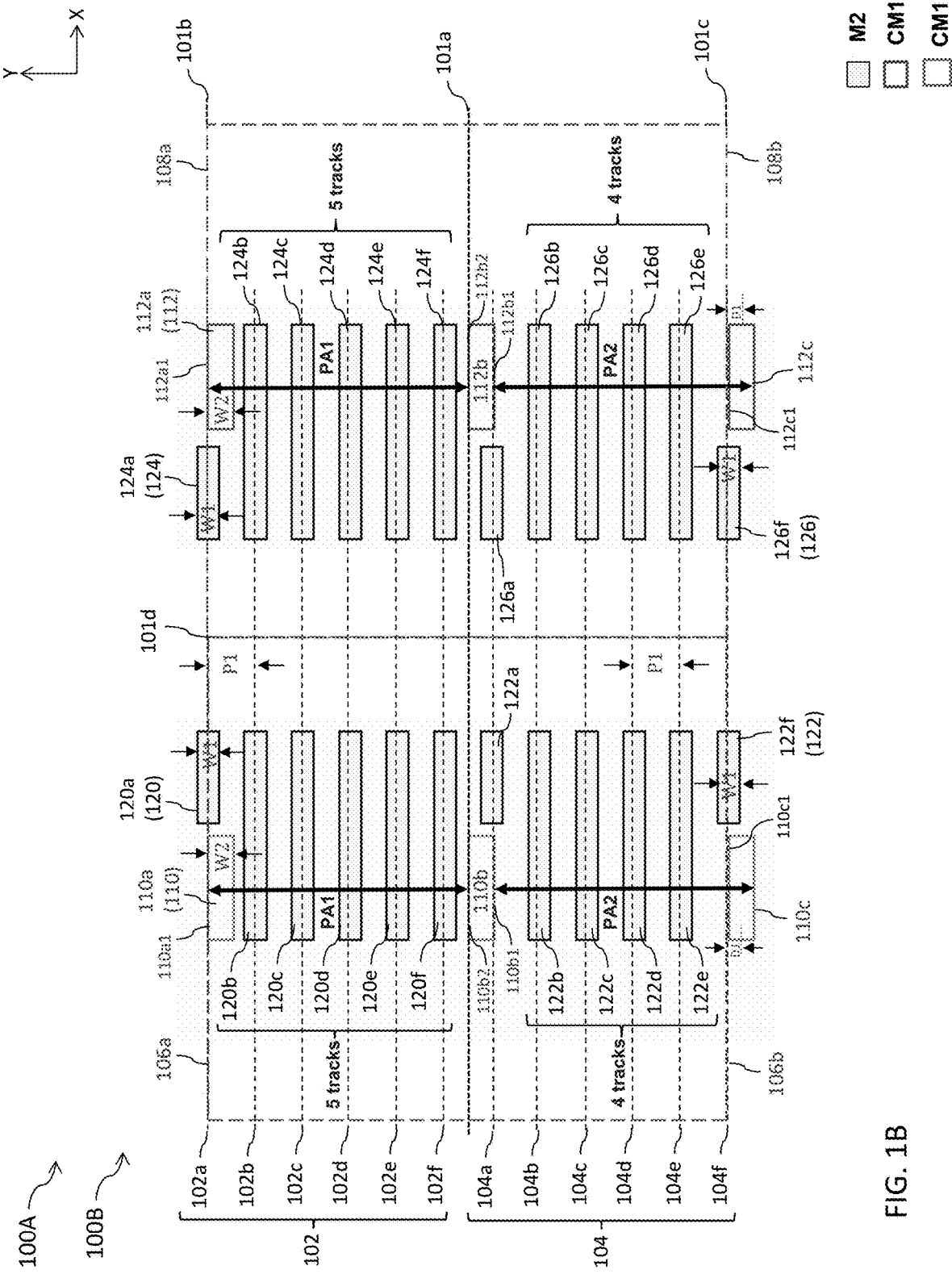

FIGS. 1A-1B are diagrams of a layout design 100A, in accordance with some embodiments. Layout design 100A is a layout diagram of an integrated circuit 100C of FIG. 1C. Layout design 100A is usable to manufacture an integrated circuit, such as integrated circuit 100C of FIG. 1C. In some embodiments, FIGS. 1A-1B include additional elements not shown in FIGS. 1A-1B.

FIG. 1B is a diagram of a corresponding portion 100B of layout design 100A of FIG. 1A, simplified for ease of illustration. Portion 100B includes one or more features of layout design 100A of FIG. 1A from the cut metal one (M1) level to the metal two (M2) level of layout design 100A. In other words, in some embodiments, portion 100B does not show the metal one (M1) level of layout design 100A for ease of illustration.

In some embodiments, portion 100B also includes one or more labelled, dimensional features (e.g., widths, pitches or the like) of layout design 100A of FIG. 1A, as well as layout design 200A (FIG. 2A), layout design 300A (FIG. 3A), layout design 400A (FIG. 4A), layout design 500A (FIG. 5A), layout design 600A (FIG. 6A) that are not labelled in layout design 100A of FIG. 1A, layout design 200A (FIG. 2A), layout design 300A (FIG. 3A), layout design 400A (FIG. 4A), layout design 500A (FIG. 5A), layout design 600A (FIG. 6A) for ease of illustration. However, it is understood that each of layout design 100A of FIG. 1A, layout design 200A (FIG. 2A), layout design 300A (FIG. 3A), layout design 400A (FIG. 4A), layout design 500A (FIG. 5A) or layout design 600A (FIG. 6A) also includes the one or more labelled, dimensional features (e.g., widths, pitches or the like) of portion 100B of FIG. 1B, and similar detailed description is therefore omitted for brevity.

Layout design 100A includes standard cell layout patterns 106a, 106b, 108a and 108b. Standard cell layout patterns 106a, 106b, 108a and 108b are useable to manufacture corresponding standard cells 106a', 106b', 108a' and 108b' of integrated circuit 100C of FIG. 1C.

Standard cell layout patterns 106a, 108a abut corresponding standard cell layout patterns 106b, 108b in a first direction X along a cell boundary 101a. Standard cell layout patterns 106a, 106b abut corresponding standard cell layout patterns 108a, 108b in a second direction Y along a cell boundary 101d. In some embodiments, the second direction Y is different from the first direction X. In some embodiments, each of standard cell layout patterns 106a, 106b, 108a and 108b has a same corresponding height (not labelled) in the second direction Y.

In some embodiments, one or more of standard cell layout patterns 106a, 106b, 108a or 108b is a layout design of a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, one or more of standard cell layout patterns 106a, 106b, 108a or 108b is a layout design of a memory cell. In some embodiments, a memory cell includes a static random access memory (SRAM), a dynamic RAM (DRAM), a resistive RAM (RRAM), a magnetoresistive RAM (MRAM) or read only memory (ROM). In some embodiments, one or more of standard cell layout patterns 106a, 106b, 108a or 108b includes layout designs of one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, and planar MOS transistors with raised source/drain. Examples of passive elements include, but are not limited to, capacitors, inductors, fuses, and resistors.

In some embodiments, standard cell layout pattern 106a includes at least a cut feature layout pattern 110a, a set of conductive feature layout patterns 120 or conductive feature layout patterns 130a and 130b (described below).

In some embodiments, standard cell layout pattern 106b includes at least cut feature layout patterns 110b and 110c, a set of conductive feature layout patterns 122 or conductive feature layout patterns 132a and 132b (described below).

In some embodiments, standard cell layout pattern 108a includes at least a cut feature layout pattern 112a, a set of conductive feature layout patterns 124 or conductive feature layout patterns 134a and 134b (described below).

In some embodiments, standard cell layout pattern 108b includes at least cut feature layout patterns 112b and 112c, a set of conductive feature layout patterns 126 or conductive feature layout patterns 136a and 136b (described below).

Layout design 100A further includes a set of gridlines 102, a set of gridlines 104, a set of conductive feature layout patterns 120, a set of conductive feature layout patterns 122, a set of conductive feature layout patterns 124, a set of conductive feature layout patterns 126, a set of conductive feature layout patterns 130, a set of conductive feature layout patterns 132, a set of conductive feature layout patterns 134 and a set of conductive feature layout patterns 136.

Each of the set of gridlines 102 and the set of gridlines 104 extend in the first direction X. The set of gridlines 102 includes at least gridline 102a, gridline 102b, gridline 102c, gridline 102d, gridline 102e or gridline 102f. Each gridline of the set of gridlines 102 is separated from an adjacent gridline of the set of gridlines 102 in the second direction Y by a pitch P1.

In some embodiments, each gridline 102a, 102b, 102c, 102d, 102e, 102f of the set of gridlines 102 defines regions where corresponding conductive feature layout patterns 120a, 120b, 120c, 120d, 120e, 120f in the set of conductive feature layout patterns 120 or corresponding conductive feature layout patterns 124a, 124b, 124c, 124d, 124e, 124f in the set of conductive feature layout patterns 124 are positioned. In some embodiments, gridline 102a is aligned with a cell boundary 101b of standard cell layouts 106a and 108a.

The set of gridlines 104 includes at least gridline 104a, gridline 104b, gridline 104c, gridline 104d, gridline 104e or gridline 104f. Each gridline of the set of gridlines 104 is separated from an adjacent gridline of the set of gridlines 104 in the second direction Y by the pitch P1. The set of gridlines 102 is separated from the set of gridlines 104 in the second direction Y. In some embodiments, gridline 102f is separated from gridline 104a in the second direction Y by the pitch P1. In some embodiments, gridline 104f is aligned with a cell boundary 101c of standard cell layouts 106b and 108b.

In some embodiments, the set of gridlines 102 are also referred to as a first set of routing tracks. In some embodiments, the set of gridlines 102 or the first set of routing tracks correspond to metal 2 (M2) routing tracks.

In some embodiments, each gridline 104a, 104b, 104c, 104d, 104e, 104f of the set of gridlines 104 defines regions where corresponding conductive feature layout patterns 122a, 122b, 122c, 122d, 122e, 122f in the set of conductive feature layout patterns 122 or corresponding conductive feature layout patterns 126a, 126b, 126c, 126d, 126e, 126f in the set of conductive feature layout patterns 126 are positioned. In some embodiments, the set of gridlines 104 are also referred to as a second set of routing tracks. In some embodiments, the set of gridlines 104 or the second set of routing tracks correspond to M2 routing tracks.

The set of conductive feature layout patterns 120 extends in the first direction X. The set of conductive feature layout patterns 120 includes at least conductive feature layout pattern 120a, 120b, 120c, 120d, 120e or 120f The set of conductive feature layout patterns 120 is located on a first layout level. In some embodiments, the first layout level is a metal two (M2) layout level.

Figure 1C:
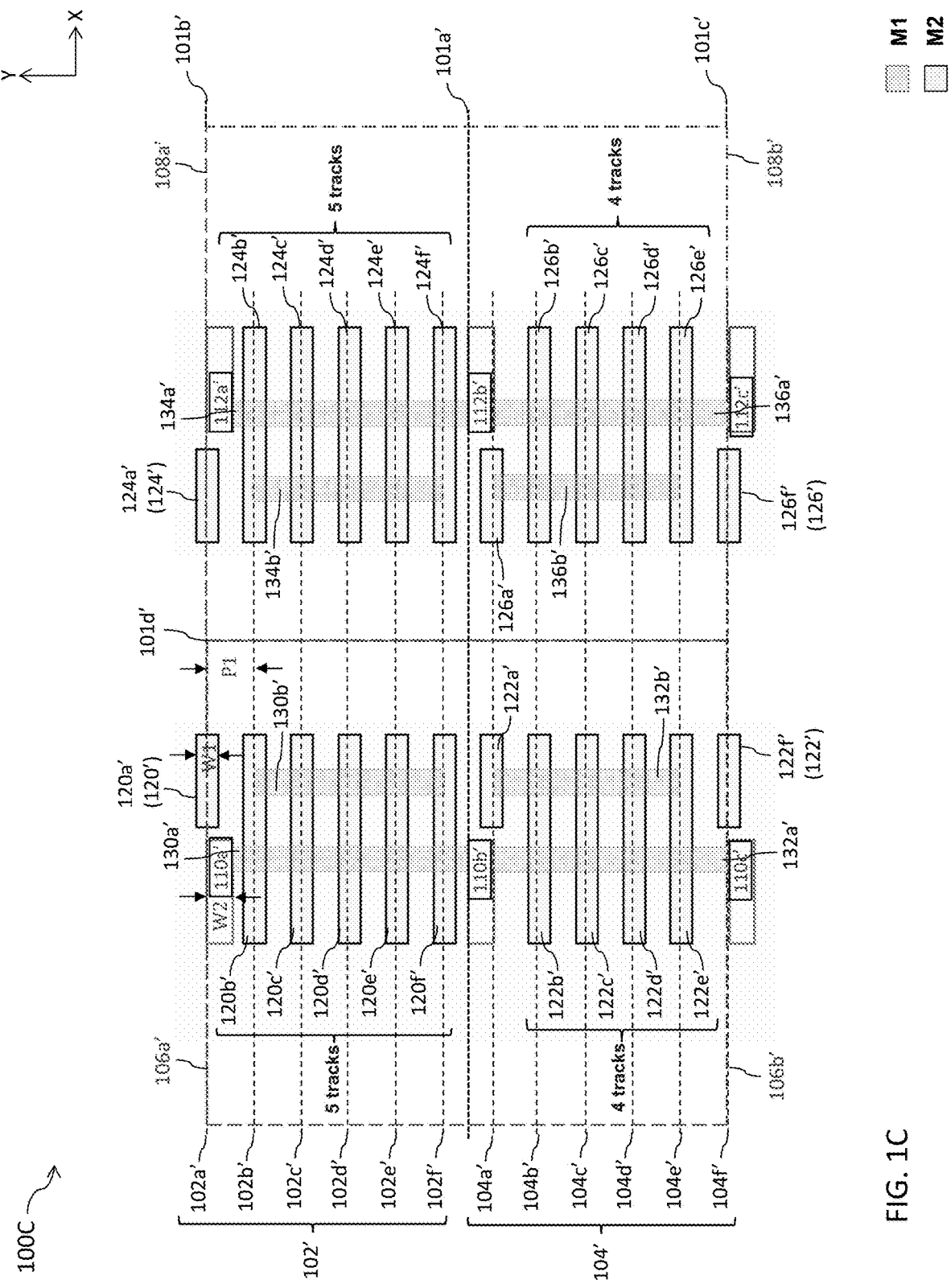
FIG. 1C is a diagram of a top view of an integrated circuit, in accordance with some embodiments.

The set of conductive feature layout patterns 120 is usable to manufacture a corresponding set of conductive structures 120' (FIG. 1C) of an integrated circuit 100C. Conductive feature layout patterns 120a, 120b, 120c, 120d, 120e, 120f are usable to manufacture corresponding conductive structures 120a', 120b', 120c', 120d', 120e', 120f' (FIG. 1C).

The set of conductive feature layout patterns 120 overlaps a set of conductive feature layout patterns 130 (described below). In some embodiments, the set of conductive feature layout patterns 120 overlaps other underlying layout patterns (not shown) of other layout levels (e.g., Active, MD, M0, M1 or the like) of layout design 100A. In some embodiments, each layout pattern 120a, 120b, 120c, 120d, 120e, 120f of the set of conductive feature layout patterns 120 has a width W1 in the second direction Y.

In some embodiments, each layout pattern 120a, 120b, 120c, 120d, 120e, 120f of the set of conductive feature layout patterns 120 overlaps a corresponding gridline 102a, 102b, 102c, 102d, 102e, 102f of the set of gridlines 102. In some embodiments, a center of each layout pattern 120a, 120b, 120c, 120d, 120e, 120f of the set of conductive feature layout patterns 120 is aligned in the first direction X with a corresponding gridline 102a, 102b, 102c, 102d, 102e, 102f of the set of gridlines 102.

In some embodiments, layout patterns 120b, 120c, 120d, 120e and 120f of the set of conductive feature layout patterns 120 correspond to 5 M2 routing tracks in standard cell layout 106a. Conductive feature layout pattern 120a is located above cell boundary 101b of standard cell layout pattern 106a.

Other configurations or quantities of patterns in the set of conductive feature layout patterns 120 are within the scope of the present disclosure.

The set of conductive feature layout patterns 122 extends in the first direction X. The set of conductive feature layout patterns 122 includes at least conductive feature layout pattern 122a, 122b, 122c, 122d, 122e or 122f The set of conductive feature layout patterns 122 is located on the first layout level.

The set of conductive feature layout patterns 122 is usable to manufacture a corresponding set of conductive structures 122' (FIG. 1C) of an integrated circuit 100C. Conductive feature layout patterns 122a, 122b, 122c, 122d, 122e, 122f are usable to manufacture corresponding conductive structures 122a', 122b', 122c', 122d', 122e', 122f(FIG. 1C).

The set of conductive feature layout patterns 122 overlaps a set of conductive feature layout patterns 132 (described below). In some embodiments, the set of conductive feature layout patterns 122 overlaps other underlying layout patterns (not shown) of other layout levels (e.g., Active, MD, M0, M1 or the like) of layout design 100A. In some embodiments, each layout pattern 122a, 122b, 122c, 122d, 122e, 122f of the set of conductive feature layout patterns 122 has width W1 in the second direction Y.

In some embodiments, each layout pattern 122a, 122b, 122c, 122d, 122e, 122f of the set of conductive feature layout patterns 122 overlaps a corresponding gridline 104a, 104b, 104c, 104d, 104e, 104f of the set of gridlines 104. In some embodiments, a center of each layout pattern 122a, 122b, 122c, 122d, 122e, 122f of the set of conductive feature layout patterns 122 is aligned in the first direction X with a corresponding gridline 104a, 104b, 104c, 104d, 104e, 104f of the set of gridlines 104.

In some embodiments, layout patterns 122b, 122c, 122d and 122e of the set of conductive feature layout patterns 122 correspond to 4 M2 routing tracks in standard cell layout 106b. In some embodiments, conductive feature layout patterns 122f and 120a are located above corresponding cell boundaries 101c and 101b of corresponding standard cell layout patterns 106b and 106a, and are referred to as "sharing width" within corresponding standard cell layout patterns 106b and 106a.

In some embodiments, conductive feature layout patterns 120f and 122a are offset in the second direction Y from cell boundary 101a of abutting standard cell layout patterns 106a and 106b, and conductive feature layout patterns 120f and 122a are referred to as "sharing space" within the respective standard cell layout patterns 106a and 106b.

In some embodiments, each of the set of conductive feature layout patterns 120 and 122 are regular layout patterns within corresponding standard cell layout patterns 106a and 106b. In some embodiments, regular layout patterns are layout patterns that are symmetric with respect to the first direction X.

Other configurations or quantities of patterns in the set of conductive feature layout patterns 122 are within the scope of the present disclosure.

The set of conductive feature layout patterns 124 extends in the first direction X. The set of conductive feature layout patterns 124 includes at least conductive feature layout pattern 124a, 124b, 124c, 124d, 124e or 124f The set of conductive feature layout patterns 124 is located on the first layout level.

The set of conductive feature layout patterns 124 is usable to manufacture a corresponding set of conductive structures 124' (FIG. 1C) of an integrated circuit 100C. Conductive feature layout patterns 124a, 124b, 124c, 124d, 124e, 124f are usable to manufacture corresponding conductive structures 124a', 124b', 124c', 124d', 124e', 124f' (FIG. 1C).

The set of conductive feature layout patterns 124 overlaps a set of conductive feature layout patterns 134 (described below). In some embodiments, the set of conductive feature layout patterns 124 overlaps other underlying layout patterns (not shown) of other layout levels (e.g., Active, MD, M0, M1 or the like) of layout design 100A. In some embodiments, each layout pattern 124a, 124b, 124c, 124d, 124e, 124f of the set of conductive feature layout patterns 124 has width W1 in the second direction Y.

In some embodiments, each layout pattern 124a, 124b, 124c, 124d, 124e, 124f of the set of conductive feature layout patterns 124 overlaps a corresponding gridline 102a, 102b, 102c, 102d, 102e, 102f of the set of gridlines 102. In some embodiments, a center of each layout pattern 124a, 124b, 124c, 124d, 124e, 124f of the set of conductive feature layout patterns 124 is aligned in the first direction X with a corresponding gridline 102a, 102b, 102c, 102d, 102e, 102f of the set of gridlines 102.

In some embodiments, layout patterns 124b, 124c, 124d, 124e and 124f of the set of conductive feature layout patterns 124 correspond to 5 M2 routing tracks in standard cell layout 108a. Conductive feature layout pattern 124a is located above cell boundary 101b of standard cell layout pattern 108a.

Other configurations or quantities of patterns in the set of conductive feature layout patterns 124 are within the scope of the present disclosure.

The set of conductive feature layout patterns 126 extends in the first direction X. The set of conductive feature layout patterns 126 includes at least conductive feature layout pattern 126a, 126b, 126c, 126d, 126e or 126f The set of conductive feature layout patterns 126 is located on the first layout level.

The set of conductive feature layout patterns 126 is usable to manufacture a corresponding set of conductive structures 126' (FIG. 1C) of an integrated circuit 100C. Conductive feature layout patterns 126a, 126b, 126c, 126d, 126e, 126f are usable to manufacture corresponding conductive structures 126a', 126b', 126c', 126d', 126e', 126f (FIG. 1C).

The set of conductive feature layout patterns 126 overlaps a set of conductive feature layout patterns 136 (described below). In some embodiments, the set of conductive feature layout patterns 126 overlaps other underlying layout patterns (not shown) of other layout levels (e.g., Active, MD, M0, M1 or the like) of layout design 100A. In some embodiments, each layout pattern 126a, 126b, 126c, 126d, 126e, 126f of the set of conductive feature layout patterns 126 has width W1 in the second direction Y.

In some embodiments, each layout pattern 126a, 126b, 126c, 126d, 126e, 126f of the set of conductive feature layout patterns 126 overlaps a corresponding gridline 104a, 104b, 104c, 104d, 104e, 104f of the set of gridlines 104. In some embodiments, a center of each layout pattern 126a, 126b, 126c, 126d, 126e, 126f of the set of conductive feature layout patterns 126 is aligned in the first direction X with a corresponding gridline 104a, 104b, 104c, 104d, 104e, 104f of the set of gridlines 104.

In some embodiments, layout patterns 126b, 126c, 126d and 126e of the set of conductive feature layout patterns 126 correspond to 4 M2 routing tracks in standard cell layout 108b.

In some embodiments, conductive feature layout patterns 126f and 124a are located above corresponding cell boundaries 101c and 101b of corresponding standard cell layout patterns 108b and 108a, and are referred to as "sharing width" within corresponding standard cell layout patterns 108b and 108a.

In some embodiments, conductive feature layout patterns 126f and 124a are offset in the second direction Y from cell boundary 101a of abutting standard cell layout patterns 108a and 108b, and conductive feature layout patterns 126f and 124a are referred to as "sharing space" within the respective standard cell layout patterns 108a and 108b. In some embodiments, each of the set of conductive feature layout patterns 124 and 126 are regular layout patterns within corresponding standard cell layout patterns 108a and 108b.

Other configurations or quantities of patterns in the set of conductive feature layout patterns 126 are within the scope of the present disclosure.

The set of conductive feature layout patterns 130 extends in the second direction Y. The set of conductive feature layout patterns 130 includes at least conductive feature layout pattern 130a or 130b. The set of conductive feature layout patterns 130 is located on a second layout level. In some embodiments, the second layout level is a metal one (M1) layout level. In some embodiments, the second layout level is below the first layout level.

The set of conductive feature layout patterns 130 is usable to manufacture a corresponding set of conductive structures 130' (FIG. 1C) of integrated circuit 100C. Conductive feature layout patterns 130a, 130b are usable to manufacture corresponding conductive structures 130a', 130b' (FIG. 1C).

The set of conductive feature layout patterns 130 is overlapped by the set of conductive feature layout patterns 120. In some embodiments, layout patterns 130a and 130b are overlapped by at least conductive feature layout pattern 120b, 120c, 120d, 120e or 120f.

In some embodiments, layout pattern 130a or 130b overlaps at least gridline 102b, 102c, 102d, 102e or 102f. In some embodiments, the set of conductive feature layout patterns 130 overlaps other underlying layout patterns (not shown) of other layout levels (e.g., Active, MD, M0 or the like) of layout design 100A. In some embodiments, each conductive feature layout pattern 130a, 130b of the set of conductive feature layout patterns 130 is separated from an adjacent layout pattern in the first direction X.

Other configurations or quantities of patterns in the set of conductive feature layout patterns 130 are within the scope of the present disclosure.

The set of conductive feature layout patterns 132 extends in the second direction Y. The set of conductive feature layout patterns 132 includes at least conductive feature layout pattern 132a or 132b. The set of conductive feature layout patterns 132 is located on the second layout level.

The set of conductive feature layout patterns 132 is usable to manufacture a corresponding set of conductive structures 132' (FIG. 1C) of integrated circuit 100C.

Conductive feature layout patterns 132a, 132b are usable to manufacture corresponding conductive structures 132a', 132b' (FIG. 1C).

The set of conductive feature layout patterns 132 is overlapped by the set of conductive feature layout patterns 122. In some embodiments, layout patterns 132a and 132b are overlapped by at least conductive feature layout pattern 122a, 122b, 122c, 122d or 122e.

In some embodiments, layout pattern 132a or 132b overlaps at least gridline 104a, 104b, 104c, 104d, 104e or 104f. In some embodiments, the set of conductive feature layout patterns 132 overlaps other underlying layout patterns (not shown) of other layout levels (e.g., Active, MD, M0 or the like) of layout design 100A. In some embodiments, each conductive feature layout pattern 132a, 132b of the set of conductive feature layout patterns 132 is separated from an adjacent layout pattern in the first direction X.

Other configurations or quantities of patterns in the set of conductive feature layout patterns 132 are within the scope of the present disclosure.

The set of conductive feature layout patterns 134 extends in the second direction Y. The set of conductive feature layout patterns 134 includes at least conductive feature layout pattern 134a or 134b. The set of conductive feature layout patterns 134 is located on the second layout level.

The set of conductive feature layout patterns 134 is usable to manufacture a corresponding set of conductive structures 134' (FIG. 1C) of integrated circuit 100C. Conductive feature layout patterns 134a, 134b are usable to manufacture corresponding conductive structures 134a', 134b' (FIG. 1C).

The set of conductive feature layout patterns 134 is overlapped by the set of conductive feature layout patterns 124. In some embodiments, layout patterns 134a and 134b are overlapped by at least conductive feature layout pattern 124b, 124c, 124d, 124e or 124f.

In some embodiments, layout pattern 134a or 134b overlaps at least gridline 102b, 102c, 102d, 102e or 102f. In some embodiments, the set of conductive feature layout patterns 134 overlaps other underlying layout patterns (not shown) of other layout levels (e.g., Active, MD, M0 or the like) of layout design 100A. In some embodiments, each conductive feature layout pattern 134a, 134b of the set of conductive feature layout patterns 134 is separated from an adjacent layout pattern in the first direction X.

Other configurations or quantities of patterns in the set of conductive feature layout patterns 134 are within the scope of the present disclosure.

The set of conductive feature layout patterns 136 extends in the second direction Y. The set of conductive feature layout patterns 136 includes at least conductive feature layout pattern 136a or 136b. The set of conductive feature layout patterns 136 is located on the second layout level.

The set of conductive feature layout patterns 136 is usable to manufacture a corresponding set of conductive structures 136' (FIG. 1C) of integrated circuit 100C. Conductive feature layout patterns 136a, 136b are usable to manufacture corresponding conductive structures 136a', 136b' (FIG. 1C).

The set of conductive feature layout patterns 136 is overlapped by the set of conductive feature layout patterns 126. In some embodiments, layout patterns 136a and 136b are overlapped by at least conductive feature layout pattern 126a, 126b, 126c, 126d or 126e.

In some embodiments, layout pattern 136a or 136b overlaps at least gridline 104a, 104b, 104c, 104d, 104e or 104f. In some embodiments, the set of conductive feature layout patterns 136 overlaps other underlying layout patterns (not shown) of other layout levels (e.g., Active, MD, M0 or the like) of layout design 100A. In some embodiments, each conductive feature layout pattern 136a, 136b of the set of conductive feature layout patterns 136 is separated from an adjacent layout pattern in the first direction X.

Other configurations or quantities of patterns in the set of conductive feature layout patterns 136 are within the scope of the present disclosure.

Layout design 100A further includes a set of cut feature layout patterns 110 and a set of cut feature layout patterns 112.

The set of cut feature layout patterns 110 extends in the first direction X. The set of cut feature layout patterns 110 includes at least cut feature layout pattern 110a, 110b or 110c. In some embodiments, each cut feature layout pattern 110a, 110b, 110c of the set of cut feature layout patterns 110 is separated from an adjacent cut feature layout pattern in the second direction Y. The set of cut feature layout patterns 110 is located on the second layout level.

In some embodiments, the set of cut feature layout patterns 110 overlaps at least a portion of a layout pattern of the set of conductive feature layout patterns 130 or 132. In some embodiments, the set of cut feature layout patterns 110 overlaps other underlying layout patterns (not shown) of other layout levels (e.g., Active, MD, M0 or the like) of layout design 100A.

Figure 7:
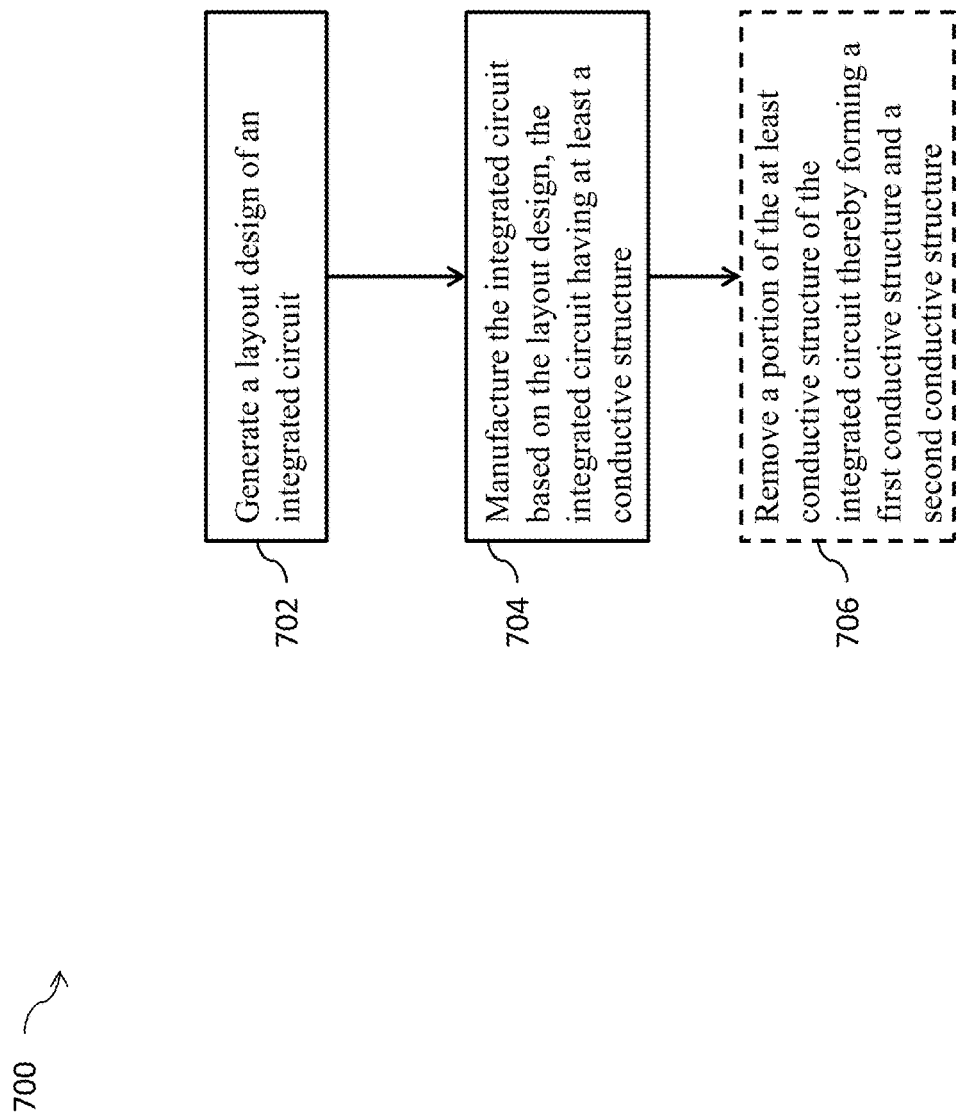
FIG. 7 is a flowchart of a method of forming or manufacturing an integrated circuit in accordance with some embodiments.

In some embodiments, cut feature layout patterns 110a, 110b, 110c identify corresponding locations of corresponding portions 110a', 110b', 110c' of conductive structure 130a' or 132a' that are removed in operation 706 of method 700 (FIG. 7). In some embodiments, at least one of the cut feature layout patterns 110a, 110b, 110c of the set of cut feature layout patterns 110 has a width W2 in the second direction Y. In some embodiments, the width W2 corresponds to a cut width (not labelled) of at least portion 110a', 110b' or 110c' of at least conductive structure 130a' or 132a'. In some embodiments, the width W2 is equal to the width W1. In some embodiments, the width W2 is different from the width W1.

Cut feature layout pattern 110a is separated from cut feature layout pattern 110b by a pitch PA1 in the second direction Y. Cut feature layout pattern 110b is separated from cut feature layout pattern 110c by a pitch PA2 in the second direction Y. In some embodiments, pitch PA1 is equal to pitch PA2. In some embodiments, pitch PA1 is different from pitch PA2.

In some embodiments, conductive feature layout pattern 130a is positioned between cut feature layout patterns 110a and 110b. In some embodiments, conductive feature layout pattern 132a is positioned between cut feature layout patterns 110b and 110c.

In some embodiments, a side of a corresponding cut feature layout pattern 110a, 110b, 110c of the set of cut feature layout patterns 110 extending in the first direction X is aligned with a corresponding gridline 102a, 104a, 104f.

In some embodiments, another side of a cut feature layout pattern 110b of the set of cut feature layout patterns 110 extending in the first direction X is aligned with cell boundary 101a of standard cell layout patterns 106a and 106b.

In some embodiments, a center of corresponding cut feature layout patterns 110a, 110b and 110c is offset in the second direction Y from corresponding gridlines 102a, 104a and 104f by a distance D1. In some embodiments, the distance D1 is equal to one half of width W2.

In some embodiments, a center of corresponding cut feature layout patterns 110a, 110b and 110c is offset in the second direction Y from corresponding cell boundaries 101b, 101a and 101c of abutting standard cell layout patterns 106a and 106b, and cut feature layout patterns 110a, 110b and 110c is referred to as "sharing space" within standard cell layout patterns 106a and 106b. In some embodiments, the set of cut feature layout patterns 110 is regular in two standard cell layout patterns (e.g., standard cell layout patterns 108a and 108b).

Other configurations or quantities of patterns in the set of cut feature layout patterns 110 are within the scope of the present disclosure.

The set of cut feature layout patterns 112 extends in the first direction X. The set of cut feature layout patterns 112 includes at least cut feature layout pattern 112a, 112b or 112c. In some embodiments, each cut feature layout pattern 112a, 112b, 112c of the set of cut feature layout patterns 112 is separated from an adjacent cut feature layout pattern in the second direction Y. The set of cut feature layout patterns 112 is located on the second layout level.

In some embodiments, the set of cut feature layout patterns 110 and 112 has a corresponding color A or B. The color A or B indicates that the set of cut feature layout patterns 110 with a same color are to be formed on a same mask of a multiple mask set, and the set of cut feature layout patterns 112 with a different color B are to be formed on a different mask of the multiple mask set. Two colors A and B are depicted in FIGS. 1A, 2A, 3A, 4A, 5A, and 6A as an example. In some embodiments, there are more or less than two colors in layout designs 100A, 200A, 300A, 400A, 500A and 600A.

In some embodiments, the set of cut feature layout patterns 112 overlaps at least a portion of a layout pattern of the set of conductive feature layout patterns 134 or 136. In some embodiments, the set of cut feature layout patterns 112 overlaps other underlying layout patterns (not shown) of other layout levels (e.g., Active, MD, M0 or the like) of layout design 100A.

In some embodiments, cut feature layout patterns 112a, 112b, 112c identify corresponding locations of corresponding portions 112a', 112b', 112c' of conductive structure 134a' or 136a' that are removed in operation 706 of method 700 (FIG. 7). In some embodiments, at least one of the cut feature layout patterns 112a, 112b, 112c of the set of cut feature layout patterns 112 has the width W2 in the second direction Y. In some embodiments, the width W2 corresponds to a cut width (not labelled) of at least portion 112a', 112b' or 112c' of at least conductive structure 134a' or 136a'.

Cut feature layout pattern 112a is separated from cut feature layout pattern 112b by the pitch PA1 in the second direction Y. Cut feature layout pattern 112b is separated from cut feature layout pattern 112c by the pitch PA2 in the second direction Y.

In some embodiments, conductive feature layout pattern 134a is positioned between cut feature layout patterns 112a and 112b. In some embodiments, conductive feature layout pattern 136a is positioned between cut feature layout patterns 112b and 112c.

In some embodiments, a side of a corresponding cut feature layout pattern 112a, 112b, 112c of the set of cut feature layout patterns 112 extending in the first direction X is aligned with a corresponding gridline 102a, 104a, 104f.

In some embodiments, another side of a cut feature layout pattern 112b of the set of cut feature layout patterns 112 extending in the first direction X is aligned with cell boundary 101a of standard cell layout patterns 108a and 108b.

In some embodiments, a center of corresponding cut feature layout patterns 112a, 112b and 112c is offset in the second direction Y from corresponding gridlines 102a, 104a and 104f by the distance D1.

In some embodiments, a center of corresponding cut feature layout patterns 112a, 112b and 112c is offset in the second direction Y from corresponding cell boundaries 101b, 101a and 101c of abutting standard cell layout patterns 108a and 108b by a distance D1, and cut feature layout patterns 112a, 112b and 112c is referred to as "sharing space" within standard cell layout patterns 108a and 108b. In some embodiments, the set of cut feature layout patterns 112 is regular in two standard cell layout patterns (e.g., standard cell layout patterns 108a and 108b).

Other configurations or quantities of patterns in the set of cut feature layout patterns 112 are within the scope of the present disclosure.

In some embodiments, by positioning a side of corresponding cut feature layout patterns 110a, 110b, 110c of the set of cut feature layout patterns 110 extending in the first direction X to be aligned with corresponding gridlines 102a, 104a, 104f, an additional conductive feature layout pattern 120f is useable as an additional routing track layout pattern in standard cell layout pattern 106a resulting in additional routing resources that are more efficiently utilized than other approaches.

In some embodiments, by positioning a side of corresponding cut feature layout patterns 112a, 112b, 112c of the set of cut feature layout patterns 112 extending in the first direction X to be aligned with corresponding gridlines 102a, 104a, 104f, an additional conductive feature layout pattern 124f is useable as an additional routing track layout pattern in standard cell layout pattern 108a resulting in additional routing resources that are more efficiently utilized than other approaches.

FIG. 1C is a diagram of a top view of an integrated circuit 100C, in accordance with some embodiments.

Components that are the same or similar to those in one or more of FIGS. 1A-1B, 2A, 3A, 4A, 5A, and 6A (shown below) are given the same reference numbers, and detailed description thereof is thus omitted.

Integrated circuit 100C is manufactured by layout design 100A. Structural relationships including alignment, lengths and widths, as well as configurations of integrated circuit 100C of FIG. 1C are similar to the corresponding structural relationships and corresponding configurations of layout design 100A of FIG. 1A or portion 100B of FIG. 1B, and similar detailed description will not be described in FIGS. 1C, 2B, 3B, 4B, 5B, and 6B for brevity.

Integrated circuit 100C includes standard cells 106a', 106b', 108a' and 108b'. In some embodiments, one or more of standard cells 106a', 106b', 108a' or 108b' is a logic gate cell. In some embodiments, one or more of standard cells 106a', 106b', 108a' or 108b' is a memory cell. In some embodiments, one or more of standard cells 106a', 106b', 108a' or 108b' includes one or more active or passive elements.

In some embodiments, standard cell 106a' includes at least a set of conductive structures 120' or 130'. In some embodiments, standard cell 106b' includes at least a set of conductive structures 122' or 132'. In some embodiments, standard cell 108a' includes at least a set of conductive structures 124' or 134'. In some embodiments, standard cell 108b' includes at least a set of conductive structures 126' or 136'.

Standard cells 106a', 108a' abut corresponding standard cells 106b', 108b' in the first direction X along a cell boundary 101a'. Standard cells 106a', 106b abut corresponding standard cells 108a', 108b' in the second direction Y along a cell boundary 101d'. In some embodiments, each of standard cells 106a', 106b', 108a' and 108b' has a same corresponding height (not labelled) in the second direction Y. The cell boundaries 101a', 101b', 101c' and 101d' are similar to the corresponding cell boundaries 101a, 101b, 101c and 101d, and similar detailed description is therefore omitted.

Integrated circuit 100C further includes a set of gridlines 102' and a set of gridlines 104'. The set of gridlines 102' and 104' are similar to the corresponding set of gridlines 102 and 104, and similar detailed description is therefore omitted. Members of the set of gridlines 102' are similar to the corresponding members of the set of gridlines 102, and similar detailed description is therefore omitted. Members of the set of gridlines 104' are similar to the corresponding members of the set of gridlines 104, and similar detailed description is therefore omitted.

The set of gridlines 102' includes at least gridline 102a', 102b', 102c', 102d', 102e' or 102f'. In some embodiments, each gridline 102a', 102b', 102c', 102d', 102e', 102f' of the set of gridlines 102' defines regions where corresponding conductive structures 120a', 120b', 120c', 120d', 120e', 120f' in the set of conductive structures 120' or corresponding conductive structures 124a', 124b', 124c', 124d', 124e', 124f in the set of conductive structures 124' are positioned.

The set of gridlines 104' includes at least gridline 104a', 104b', 104c', 104d', 104e' or 104f. In some embodiments, each gridline 104a', 104b', 104c', 104d', 104e', 104f of the set of gridlines 104' defines regions where corresponding conductive structures 122a', 122b', 122c', 122d', 122e', 122f in the set of conductive structures 122' or corresponding conductive structures 126a', 126b', 126c', 126d', 126e', 126f in the set of conductive structures 126' are positioned.

In some embodiments, integrated circuit 100C does not include one or more of the set of gridlines 102', the set of gridlines 104', cell boundaries 101a', cell boundary 101b', cell boundary 101c' or cell boundary 101d'. In some embodiments, one or more of the set of conductive structures 120', 122', 124' 126', 130', 132', 134' or 136' are not part of standard cells 106a', 106b', 108a' and 108b', but are shown in regions defined by one or more of standard cells 106a', 106b', 108a' and 108b'.

The set of conductive structures 120' includes at least conductive structures 120a', 120b', 120c', 120d', 120e' or 120f. The set of conductive structures 122' includes at least conductive structures 122a', 122b', 122c', 122d', 122e' or 122f. The set of conductive structures 124' includes at least conductive structures 124a', 124b', 124c', 124d', 124e' or 124f. The set of conductive structures 126' includes at least conductive structures 126a', 126b', 126c', 126d', 126e' or 126f. In some embodiments, at least the set of conductive structures 120', 122', 124' or 126' is on a first layer of integrated circuit 100C. In some embodiments, the first layer is the M2 layer.

In some embodiments, at least conductive structure 120b', 120c', 120d', 120e' or 120f of the set of conductive structures 120' or conductive structure 124b', 124c', 124d', 124e' or 124f of the set of conductive structures 124' are functional conductive structures.

In some embodiments, a functional conductive structure corresponds to a conductive structure that is useable in integrated circuit 100C, 200B, 300B, 400B, 500B or 600B for routing of signals, power supply voltages or power supply currents.

In some embodiments, the set of conductive structures 120' and 124' have an odd number of functional conductive structures and corresponding routing tracks. In some embodiments, the set of conductive structures 120' and 124' have 5 functional conductive structures and corresponding routing tracks.

In some embodiments, at least conductive structure 122b', 122c', 122d' or 122e' of the set of conductive structures 122' are functional conductive structures. In some embodiments, at least conductive structure 126b', 126c', 126d' or 126e' of the set of conductive structures 126' are functional conductive structures.

In some embodiments, the set of conductive structures 122' and 126' have an even number of functional conductive structures and corresponding routing tracks. In some embodiments, the set of conductive structures 122' and 126' have 4 functional conductive structures and corresponding routing tracks.

In some embodiments, conductive structures 120a', 122a', 122f, 124a', 126a' or 126f are non-functional or dummy structures. In some embodiments, a non-functional conductive structure or dummy structure corresponds to a conductive structure that is not useable in integrated circuit 100C, 200B, 300B, 400B, 500B or 600B for routing of signals, power supply voltages or power supply currents since at least a size of the non-functional conductive structure in the first direction X or the second direction Y does not have enough surface area as a landing spot for vias from lower layers (e.g., Active, MD, M0 or the like) or upper layer (e.g., M2 or the like).

The set of conductive structures 130' includes at least conductive structures 130a' or 130b'. The set of conductive structures 132' includes at least conductive structures 132a' or 132b'. The set of conductive structures 134' includes at least conductive structures 134a' or 134b'. The set of conductive structures 136' includes at least conductive structures 136a' or 136b'. In some embodiments, at least the set of conductive structures 130', 132', 134' or 136' is on a second layer of integrated circuit 100C. In some embodiments, the second layer is the M1 layer.

Conductive structure 130a' is separated from conductive structure 132a' by removed portion 110b'. Conductive structure 134a' is separated from conductive structure 136a' by removed portion 112b'.

In some embodiments, at least one structure of the set of conductive structures 120', 122', 124', 126', 130', 132', 134' or 136' includes one or more layers of metal materials, such as Al, Cu, W, Ti, Ta, TiN, TaN, NiSi, CoSi, other suitable conductive materials, or combinations thereof.

Other configurations, arrangements, number of layers or materials of the set of conductive structures 120', 122', 124', 126', 130', 132', 134' or 136' are within the contemplated scope of the present disclosure.

In some embodiments, by positioning a side of cut feature layout pattern 110b of the set of cut feature layout patterns 110 extending in the first direction X to be aligned with corresponding gridline 104a, the cut feature layout pattern 110b is sufficiently separated from conductive feature layout pattern 120f to not violate via landing spot design rules, and conductive feature layout pattern 120f is useable to manufacture corresponding conductive structure 120f. In some embodiments, by having conductive structure 120f in the set of conductive structures 120' results in a different number of functional conductive structures in the set of conductive structures 120' and 122'. In some embodiments, by having a different number of functional conductive structures in the set of conductive structures 120' and 122', integrated circuit 100C has an additional functional conductive structure 120f and corresponding routing track in standard cells 106a' and 106b' resulting in additional routing resources that are more efficiently utilized than other approaches.

In some embodiments, by positioning a side of cut feature layout pattern 112b of the set of cut feature layout patterns 112 extending in the first direction X to be aligned with corresponding gridline 104a, the cut feature layout pattern 112b is sufficiently separated from conductive feature layout pattern 124f to not violate via landing spot design rules, and conductive feature layout pattern 124f is useable to manufacture corresponding conductive structure 124f. In some embodiments, by having conductive structure 124f in the set of conductive structures 124' results in a different number of functional conductive structures in the set of conductive structures 124' and 126'. In some embodiments, by having a different number of functional conductive structures in the set of conductive structures 124' and 126', integrated circuit 100C has an additional functional conductive structure 124f and corresponding routing track in standard cells 108a' and 108b' resulting in additional routing resources that are more efficiently utilized than other approaches.

Figure 2A:
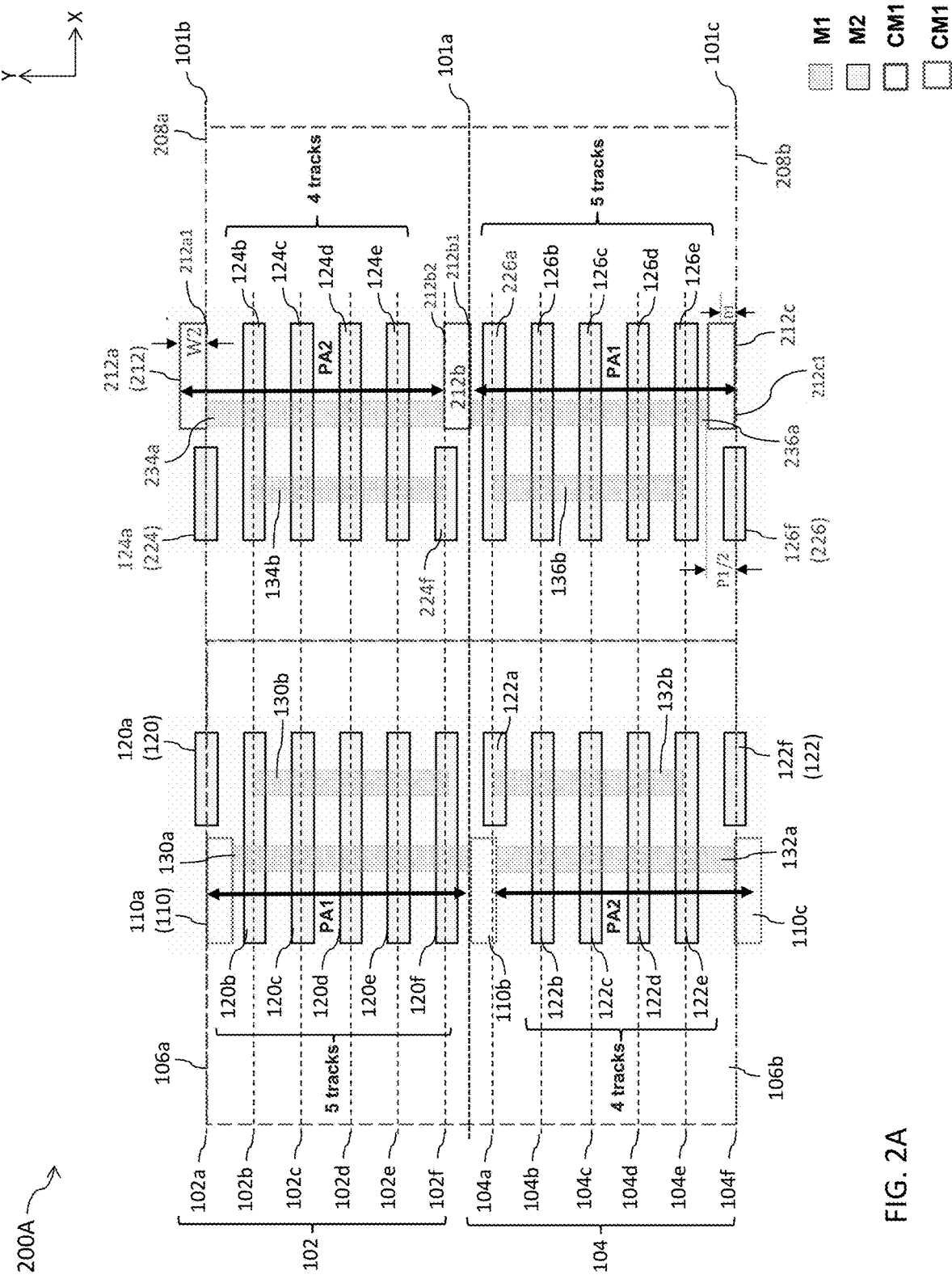
FIG. 2A is a diagram of a layout design of an integrated circuit, in accordance with some embodiments.

FIG. 2A is a diagram of a layout design 200A of an integrated circuit, in accordance with some embodiments.

Layout design 200A is a variation of layout design 100A (FIG. 1A), and therefore similar detailed description is omitted. For example, layout design 200A illustrates an example where a set of cut feature layout patterns 212 replaces the set of cut feature layout patterns 112 of FIG. 1A, causing a set of conductive feature layout patterns 224 and 226 to be mirror images of the set of conductive feature layout patterns 124 and 126 with respect to cell boundary 101a.

Figure 2B:
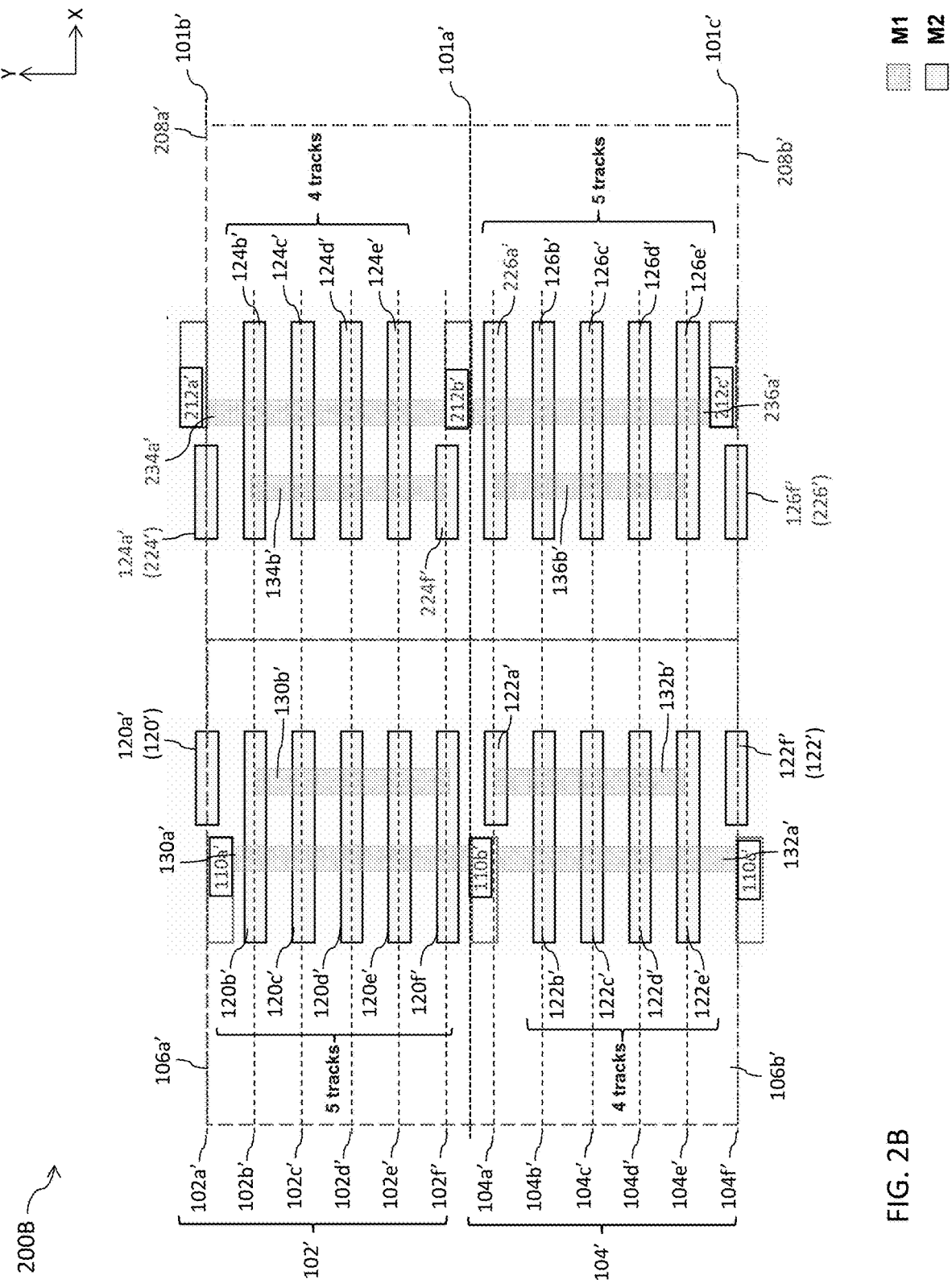
FIG. 2B is a diagram of a top view of an integrated circuit, in accordance with some embodiments.

Layout design 200A is usable to manufacture an integrated circuit similar to integrated circuit 200B of FIG. 2B.

Layout design 200A includes standard cell layout patterns 106a, 106b, 208a and 208b. In comparison with layout design 100A of FIG. 1A, standard cell layout patterns 208a and 208b replace corresponding standard cell layout patterns 108a and 108b, and similar detailed description is therefore omitted.

Layout design 200A further includes the set of gridlines 102 and 104, the set of conductive feature layout patterns 120 and 122, the set of conductive feature layout patterns 130 and 132, the set of cut feature layout patterns 110, a set of conductive feature layout patterns 224 and 226, a set of conductive feature layout patterns 234 and 236, and a set of cut feature layout patterns 212.

In comparison with layout design 100A of FIG. 1A, the set of conductive feature layout patterns 224 and 226 replace the corresponding set of conductive feature layout patterns 124 and 126, the set of conductive feature layout patterns 234 and 236 replace the corresponding set of conductive feature layout patterns 134 and 136, and the set of cut feature layout patterns 212 replaces the corresponding set of cut feature layout patterns 112, and similar detailed description is therefore omitted.

The set of cut feature layout patterns 212 includes at least cut feature layout pattern 212a, 212b or 212c. Cut feature layout patterns 212a, 212b, 212c replace corresponding cut feature layout patterns 112a, 112b, 112c of FIG. 1A, and similar detailed description is therefore omitted. In comparison with cut feature layout patterns 112a, 112b, 112c of FIG. 1A, cut feature layout patterns 212a, 212b, 212c are shifted in the second direction Y by half a gridline pitch (e.g., P1/2).

In some embodiments, by shifting the position of the set of cut feature layout patterns by half a gridline pitch (e.g., P1/2) causes conductive feature layout patterns 224f and 226a to have different lengths in the first direction X when compared with corresponding conductive feature layout patterns 124f and 126a of FIG. 1A.

In some embodiments, cut feature layout patterns 212a, 212b, 212c identify corresponding locations of corresponding portions 212a', 212b', 212c' of conductive structure 234a' or 236a' that are removed in operation 706 of method 700 (FIG. 7). In some embodiments, at least one of the cut feature layout patterns 212a, 212b, 212c of the set of cut feature layout patterns 212 has the width W2 in the second direction Y. In some embodiments, the width W2 corresponds to a cut width (not labelled) of at least portion 212a', 212b' or 212c' of at least conductive structure 234a' or 236a'.

Cut feature layout pattern 212a is separated from cut feature layout pattern 212b by the pitch PA2 in the second direction Y. Cut feature layout pattern 212b is separated from cut feature layout pattern 212c by the pitch PA1 in the second direction Y.

In some embodiments, a conductive feature layout pattern 234a is positioned between cut feature layout patterns 212a and 212b. In some embodiments, a conductive feature layout pattern 236a is positioned between cut feature layout patterns 212b and 212c.

In some embodiments, a side 212a1, 212b2, 212c1 of a corresponding cut feature layout pattern 212a, 212b, 212c of the set of cut feature layout patterns 212 extending in the first direction X is aligned with a corresponding gridline 102a, 102f, 104f.

In some embodiments, another side 212b1 of cut feature layout pattern 212b of the set of cut feature layout patterns 212 extending in the first direction X is aligned with cell boundary 101a of standard cell layout patterns 208a and 208b.

In some embodiments, a center of corresponding cut feature layout patterns 212a, 212b and 212c is offset in the second direction Y from corresponding gridlines 102a, 102f and 104f by the distance D1.

In some embodiments, a center of corresponding cut feature layout patterns 212a, 212b and 212c is offset in the second direction Y from corresponding cell boundaries 101b, 101a and 101c of abutting standard cell layout patterns 208a and 208b by distance D1, and cut feature layout patterns 212a, 212b and 212c is referred to as "sharing space" within standard cell layout patterns 208a and 208b.

In some embodiments, the set of cut feature layout patterns 212 is regular in two standard cell layout patterns (e.g., standard cell layout patterns 208a and 208b).

Other configurations or quantities of patterns in the set of cut feature layout patterns 212 are within the scope of the present disclosure.

Set of conductive feature layout patterns 224 includes at least conductive feature pattern 124a, 124b, 124c, 124d, 124e or 224f. The set of conductive feature layout patterns 224 is usable to manufacture a corresponding set of conductive structures 224' (FIG. 2B) of integrated circuit 200B. In some embodiments, conductive feature layout pattern 224f of the set of conductive feature layout patterns 224 is usable to manufacture corresponding conductive structure 224f' of the set of conductive structures 224' (FIG. 2B) of integrated circuit 200B.

Conductive feature layout pattern 224f replaces conductive feature layout pattern 124f of FIG. 1A, and similar detailed description is therefore omitted. In comparison with conductive feature layout pattern 124f of FIG. 1A, conductive feature layout pattern 224f is shorter in length in the first direction X because of the position of cut feature layout pattern 212b.

In some embodiments, layout patterns 124b, 124c, 124d and 124e of the set of conductive feature layout patterns 224 correspond to 4 M2 routing tracks in standard cell layout 208a.

Set of conductive feature layout patterns 226 includes at least conductive feature pattern 226a, 126b, 126c, 126d, 126e or 126f. The set of conductive feature layout patterns 226 is usable to manufacture a corresponding set of conductive structures 226' (FIG. 2B) of integrated circuit 200B. In some embodiments, conductive feature layout pattern 226a of the set of conductive feature layout patterns 226 is usable to manufacture corresponding conductive structure 226a' of the set of conductive structures 226' (FIG. 2B) of integrated circuit 200B.

Conductive feature layout pattern 226a replaces conductive feature layout pattern 126a of FIG. 1A, and similar detailed description is therefore omitted. In comparison with conductive feature layout pattern 126a of FIG. 1A, conductive feature layout pattern 226a is longer in length in the first direction X because of the position of cut feature layout pattern 212b.

In some embodiments, layout patterns 226a, 126b, 126c, 126d and 126e of the set of conductive feature layout patterns 226 correspond to 5 M2 routing tracks in standard cell layout 208b.

Set of conductive feature layout patterns 234 includes at least conductive feature pattern 234a or 134b. The set of conductive feature layout patterns 234 is usable to manufacture a corresponding set of conductive structures 234' (FIG. 2B) of integrated circuit 200B. In some embodiments, conductive feature layout pattern 234a of the set of conductive feature layout patterns 234 is usable to manufacture corresponding conductive structure 234a' of the set of conductive structures 234' (FIG. 2B) of integrated circuit 200B.

Conductive feature layout pattern 234a replaces conductive feature layout pattern 134a of FIG. 1A, and similar detailed description is therefore omitted. In comparison with conductive feature layout pattern 134a of FIG. 1A, conductive feature layout pattern 234a is shifted in the second direction Y because of the positions of cut feature layout patterns 212a and 212b.

Set of conductive feature layout patterns 236 includes at least conductive feature pattern 236a or 136b. The set of conductive feature layout patterns 236 is usable to manufacture a corresponding set of conductive structures 236' (FIG. 2B) of integrated circuit 200B. In some embodiments, conductive feature layout pattern 236a of the set of conductive feature layout patterns 236 is usable to manufacture corresponding conductive structure 236a' of the set of conductive structures 236' (FIG. 2B) of integrated circuit 200B.

Conductive feature layout pattern 236a replaces conductive feature layout pattern 136a of FIG. 1A, and similar detailed description is therefore omitted. In comparison with conductive feature layout pattern 136a of FIG. 1A, conductive feature layout pattern 236a is shifted in the second direction Y because of the positions of cut feature layout patterns 212b and 212c.

Other configurations or quantities of patterns in the set of conductive feature layout patterns 224, 226, 234 and 236 are within the scope of the present disclosure.

In some embodiments, by positioning a side of corresponding cut feature layout patterns 212a, 212b, 212c of the set of cut feature layout patterns 212 extending in the first direction X to be aligned with corresponding gridlines 102a, 102f, 104f, an additional conductive feature layout pattern 226a is useable as an additional routing track layout pattern in standard cell layout pattern 208b resulting in additional routing resources that are more efficiently utilized in layout design 200A than other approaches.

FIG. 2B is a diagram of a top view of an integrated circuit 200B, in accordance with some embodiments.

Integrated circuit 200B is manufactured by layout design 200A. Structural relationships including alignment, lengths and widths, as well as configurations of integrated circuits 200B, 300B, 400B, 500B, 600B of corresponding FIGS. 2B, 3B, 4B, 5B, 6B are similar to the structural relationships and configurations of corresponding layout designs 200A, 300A, 400A, 500A, 600A of corresponding FIGS. 2A, 3A, 4A, 5A, 6A, and similar detailed description will not be described in FIGS. 1C, 2B, 3B, 4B, 5B, and 6B for brevity.

Integrated circuit 200B is a variation of integrated circuit 100C (FIG. 1C), and similar detailed description is therefore omitted. For example, integrated circuit 200B illustrates an example where set of conductive structures 224' and 226' are mirror images of the set of conductive structures 124' and 126' of FIG. 1C with respect to cell boundary 101a'.

Integrated circuit 200B includes standard cells 106a', 106b', 208a' and 208b'. In comparison with integrated circuit 100C of FIG. 1C, standard cells 208a' and 208b' replace corresponding standard cells 108a' and 108b', and similar detailed description is therefore omitted.

Integrated circuit 200B further includes the set of gridlines 102' and 104', the set of conductive structures 120 and 122, the set of conductive structures 130 and 132, a set of conductive structures 224' and 226' and a set of conductive structures 234' and 236'.

In comparison with integrated circuit 100C of FIG. 1C, the set of conductive structures 224' and 226' replace the corresponding set of conductive structures 124' and 126', and the set of conductive structures 234' and 236' replace the corresponding set of conductive structures 134' and 136', and similar detailed description is therefore omitted.

Set of conductive structures 224' includes at least conductive structure 124a', 124b', 124c', 124d', 124e' or 224f. Conductive structure 224f replaces conductive structure 124f of FIG. 1C, and similar detailed description is therefore omitted. In comparison with conductive structure 124f of FIG. 1C, conductive structure 224f is shorter in length in the first direction X because of the removed portion 212b' of conductive structure 234a' or 236a' causing conductive structure 226f to be a non-functional or a dummy structure. In some embodiments, at least conductive structure 124b', 124c', 124d' or 124e' of the set of conductive structures 224' are functional conductive structures. In some embodiments, the set of conductive structures 224' has an even number of functional conductive structures and corresponding routing tracks. In some embodiments, the set of conductive structures 224' has 4 functional conductive structures and corresponding routing tracks.

Set of conductive structures 226' includes at least conductive structure 226a', 126b', 126c', 126d', 126e' or 226f. Conductive structure 226a' replaces conductive structure 126a' of FIG. 1C, and similar detailed description is therefore omitted. In comparison with conductive structure 126a' of FIG. 1C, conductive structure 226a' is longer in length in the first direction X because the removed portion 212b' of conductive structure 234a' or 236a' is shifted in the second direction Y by half a gridline pitch (e.g., P1/2). In some embodiments, by increasing the length of conductive structure 226a' causes conductive structure 226a' to be a functional structure. In some embodiments, at least conductive structure 226a', 126b', 126c', 126d' or 126e' of the set of conductive structures 226' are functional conductive structures. In some embodiments, the set of conductive structures 226' has an odd number of functional conductive structures and corresponding routing tracks. In some embodiments, the set of conductive structures 226' has 5 functional conductive structures and corresponding routing tracks.

Set of conductive structures 234' includes at least conductive structure 234a' or 134b'. Conductive structure 234a' replaces conductive structure 134a' of FIG. 1C, and similar detailed description is therefore omitted. In comparison with conductive structure 134a' of FIG. 1C, conductive structure 234a' is shifted in position in the second direction Y because of the new positions of removed portion 212a', 212b' and 212c'.

Set of conductive structures 236' includes at least conductive structure 236a' or 136b'. Conductive structure 236a' replaces conductive structure 136a' of FIG. 1C, and similar detailed description is therefore omitted. In comparison with conductive structure 136a' of FIG. 1C, conductive structure 236a' is shifted in position in the second direction Y because of the new positions of removed portion 212a', 212b' and 212c'.

In some embodiments, by positioning a side 212b2 of cut feature layout pattern 212b of the set of cut feature layout patterns 212 extending in the first direction X to be aligned with corresponding gridline 102f, the cut feature layout pattern 212b is sufficiently separated from conductive feature layout pattern 226a to not violate via landing spot design rules, and conductive feature layout pattern 226a is useable to manufacture corresponding conductive structure 226a'. In some embodiments, by having conductive structure 226a' in the set of conductive structures 226' results in a different number of functional conductive structures in the set of conductive structures 224' and 226'. In some embodiments, by having a different number of functional conductive structures in the set of conductive structures 224' and 226', integrated circuit 200B has an additional functional conductive structure 224a' and corresponding routing track in standard cells 108a' and 108b' resulting in additional routing resources that are more efficiently utilized than other approaches.

Figure 3A:
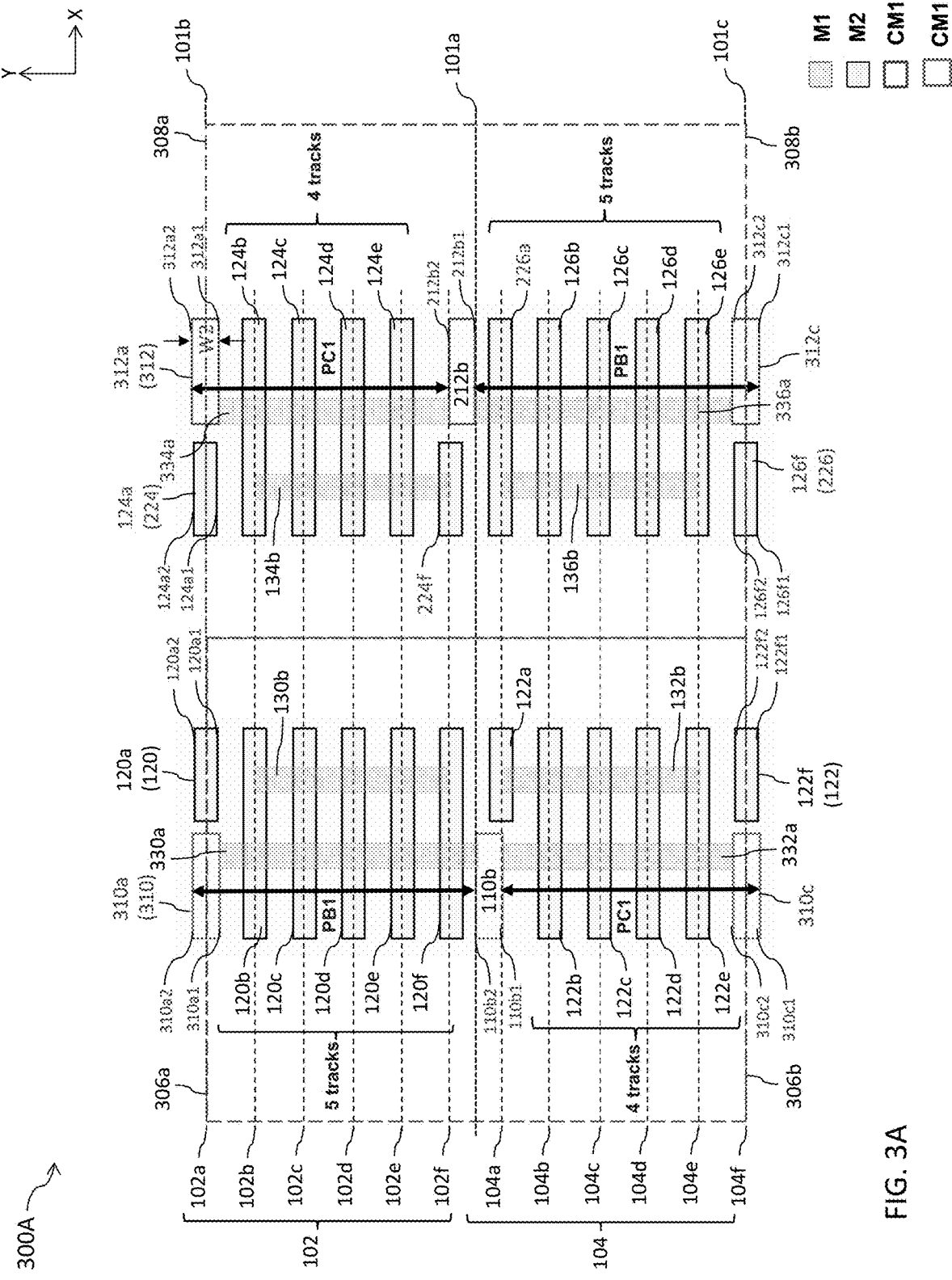
FIG. 3A is a diagram of a layout design of an integrated circuit, in accordance with some embodiments.

FIG. 3A is a diagram of a layout design 300A of an integrated circuit, in accordance with some embodiments.

Layout design 300A is a variation of layout design 200A (FIG. 2A), and therefore similar detailed description is omitted. For example, layout design 300A illustrates an example where a set of cut feature layout patterns 310 and 312 replaces the corresponding set of cut feature layout patterns 110 and 212 of FIG. 2A, causing cut feature layout patterns within the set of cut feature layout patterns 310 or 312 to be separated by different pitches (e.g., pitch PB1 and PC1).

Figure 3B:
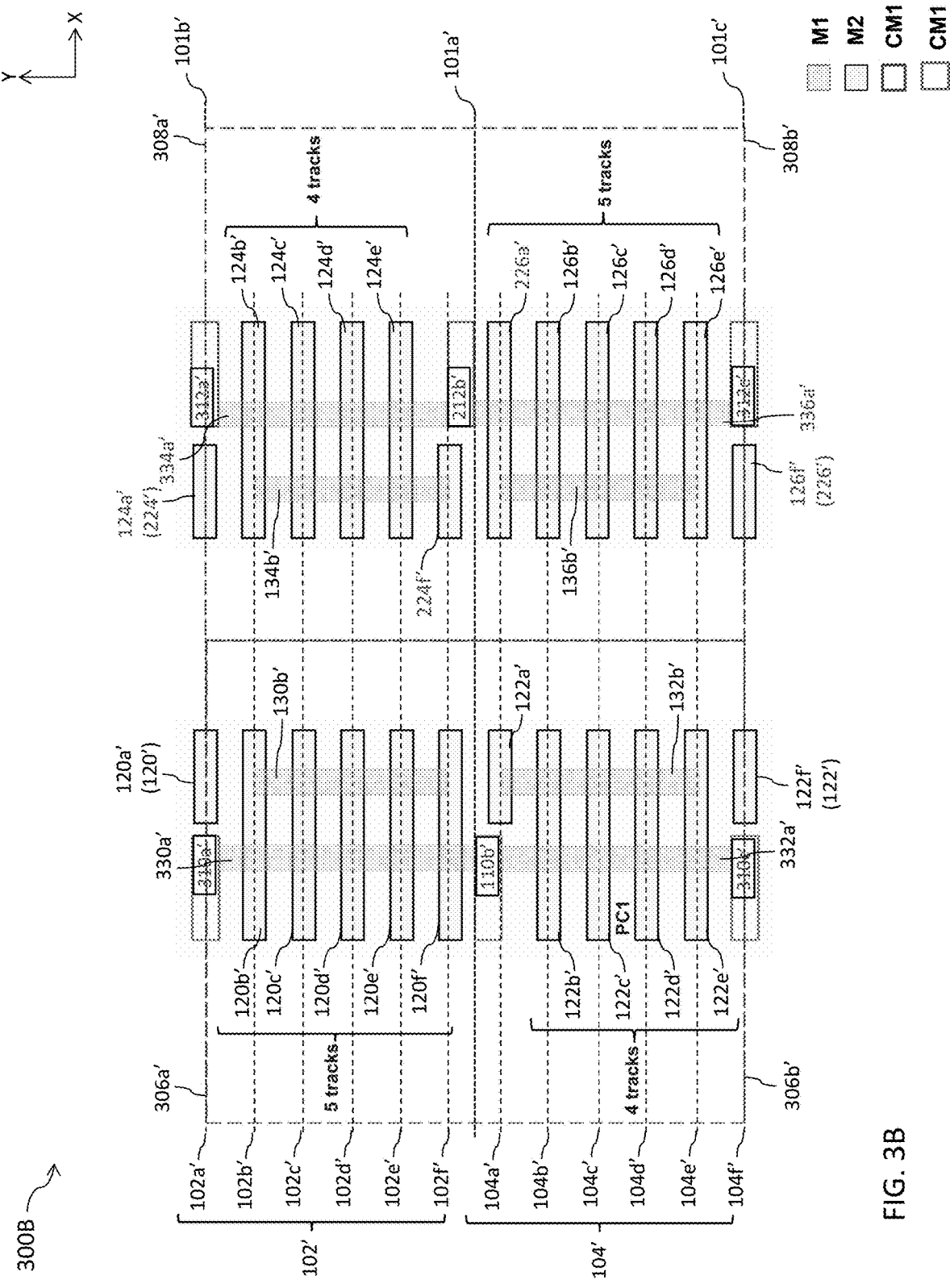
FIG. 3B is a diagram of a top view of an integrated circuit, in accordance with some embodiments.

Layout design 300A is usable to manufacture integrated circuit 300B of FIG. 3B.

Layout design 300A includes standard cell layout patterns 306a, 306b, 308a and 308b. In comparison with layout design 200A of FIG. 2A, standard cell layout patterns 306a, 306b, 308a and 308b replace corresponding standard cell layout patterns 108a, 108b, 208a and 208b, and similar detailed description is therefore omitted.

Layout design 300A further includes the set of gridlines 102 and 104, the set of conductive feature layout patterns 120, 122, 224 and 226, a set of conductive feature layout patterns 330, 332, 334 and 336, and a set of cut feature layout patterns 310 and 312.

In comparison with layout design 200A of FIG. 2A, the set of conductive feature layout patterns 330, 332, 334 and 336 replace the corresponding set of conductive feature layout patterns 130, 132, 234 and 236, and the set of cut feature layout patterns 310 and 312 replaces the corresponding set of cut feature layout patterns 110 and 212, and similar detailed description is therefore omitted.

The set of cut feature layout patterns 310 includes at least cut feature layout pattern 310a, 110b or 310c. Cut feature layout patterns 310a, 310c replace corresponding cut feature layout patterns 110a, 110c of FIG. 1A or 2A, and similar detailed description is therefore omitted. In comparison with cut feature layout patterns 110a, 110c of FIG. 2A, corresponding cut feature layout patterns 310a, 310c are shifted in the second direction Y by distance D1. In some embodiments, by shifting the position of cut feature layout patterns 310a, 310c of the set of cut feature layout patterns 310 by distance D1 changes the pitch PB1 and PC1.

In some embodiments, cut feature layout patterns 310a, 110b, 310c identify corresponding locations of corresponding portions 310a', 110b', 310c' of conductive structure 330a' or 332a' that are removed in operation 706 of method 700 (FIG. 7). In some embodiments, at least one of the cut feature layout patterns 310a, 110b, 310c of the set of cut feature layout patterns 310 has the width W2 in the second direction Y. In some embodiments, the width W2 corresponds to a cut width (not labelled) of at least portion 310a', 110b' or 310c' of at least conductive structure 330a' or 332a'.

Cut feature layout pattern 310a is separated from cut feature layout pattern 310b by a pitch PB1 in the second direction Y. Cut feature layout pattern 110b is separated from cut feature layout pattern 310c by a pitch PC1 in the second direction Y. In some embodiments, pitch PB1 is different from pitch PC1.

In some embodiments, a conductive feature layout pattern 330a is positioned between cut feature layout patterns 310a and 110b. In some embodiments, a conductive feature layout pattern 332a is positioned between cut feature layout patterns 110b and 310c.

In some embodiments, a side 310a1, 310a2 of cut feature layout pattern 310a of the set of cut feature layout patterns 310 extending in the first direction X is aligned with a corresponding side 120a1, 120a2 of conductive feature layout pattern 120a of the set of conductive feature layout patterns 120.

In some embodiments, a side 310c1, 310c2 of cut feature layout pattern 310c of the set of cut feature layout patterns 310 extending in the first direction X is aligned with a corresponding side 122f1, 122f2 of conductive feature layout pattern 122f of the set of conductive feature layout patterns 122.

In some embodiments, a center of corresponding cut feature layout patterns 310a and 310c is aligned in the first direction X with corresponding gridlines 102a and 104f or corresponding cell boundaries 101b and 101c. In some embodiments, the set of cut feature layout patterns 310 is regular in two standard cell layout patterns (e.g., standard cell layout patterns 306a and 306b).

Other configurations or quantities of patterns in the set of cut feature layout patterns 310 are within the scope of the present disclosure.

The set of cut feature layout patterns 312 includes at least cut feature layout pattern 312a, 212b or 312c. Cut feature layout patterns 312a, 312c replace corresponding cut feature layout patterns 212a, 212c of FIG. 2A, and similar detailed description is therefore omitted. In comparison with cut feature layout patterns 212a, 212c of FIG. 2A, corresponding cut feature layout patterns 312a, 312c are shifted in the second direction Y by distance D1. In some embodiments, by shifting the position of cut feature layout patterns 312a, 312c of the set of cut feature layout patterns 312 by distance D1 changes the pitch PB1 and PC1.

In some embodiments, cut feature layout patterns 312a, 212b, 312c identify corresponding locations of corresponding portions 312a', 212b', 312c' of conductive structure 334a' or 336a' that are removed in operation 706 of method 700 (FIG. 7). In some embodiments, at least one of the cut feature layout patterns 312a, 212b, 312c of the set of cut feature layout patterns 312 has the width W2 in the second direction Y. In some embodiments, the width W2 corresponds to a cut width (not labelled) of at least portion 312a', 212b' or 312c' of at least conductive structure 334a' or 336a'.

Cut feature layout pattern 312a is separated from cut feature layout pattern 312b by the pitch PC1 in the second direction Y. Cut feature layout pattern 212b is separated from cut feature layout pattern 312c by the pitch PB1 in the second direction Y.

In some embodiments, a conductive feature layout pattern 334a is positioned between cut feature layout patterns 312a and 212b. In some embodiments, a conductive feature layout pattern 336a is positioned between cut feature layout patterns 212b and 312c.

In some embodiments, a side 312a1, 312a2 of cut feature layout pattern 312a of the set of cut feature layout patterns 312 extending in the first direction X is aligned with a corresponding side 124a1, 124a2 of conductive feature layout pattern 124a of the set of conductive feature layout patterns 224.

In some embodiments, a side 312c1, 312c2 of cut feature layout pattern 312c of the set of cut feature layout patterns 312 extending in the first direction X is aligned with a corresponding side 126f1, 126f2 of conductive feature layout pattern 126f of the set of conductive feature layout patterns 226.

In some embodiments, a center of corresponding cut feature layout patterns 312a and 312c is aligned in the first direction X with corresponding gridlines 102a and 104f or corresponding cell boundaries 101b and 101c. In some embodiments, the set of cut feature layout patterns 312 is regular in two standard cell layout patterns (e.g., standard cell layout patterns 308a and 308b).

Other configurations or quantities of patterns in the set of cut feature layout patterns 312 are within the scope of the present disclosure.

Set of conductive feature layout patterns 330 includes at least conductive feature pattern 330a or 130b. The set of conductive feature layout patterns 330 is usable to manufacture a corresponding set of conductive structures 330' (FIG. 3B) of integrated circuit 300B. In some embodiments, conductive feature layout pattern 330a of the set of conductive feature layout patterns 330 is usable to manufacture corresponding conductive structure 330a' of the set of conductive structures 330' (FIG. 3B) of integrated circuit 300B.

Conductive feature layout pattern 330a replaces conductive feature layout pattern 130a of FIG. 1A, and similar detailed description is therefore omitted. In comparison with conductive feature layout pattern 130a of FIG. 1A, conductive feature layout pattern 330a is shifted in the second direction Y because of the positions of cut feature layout patterns 310a and 110b.

Set of conductive feature layout patterns 332 includes at least conductive feature pattern 332a or 132b. The set of conductive feature layout patterns 332 is usable to manufacture a corresponding set of conductive structures 332' (FIG. 3B) of integrated circuit 300B. In some embodiments, conductive feature layout pattern 332a of the set of conductive feature layout patterns 332 is usable to manufacture corresponding conductive structure 332a' of the set of conductive structures 332' (FIG. 3B) of integrated circuit 300B.

Conductive feature layout pattern 332a replaces conductive feature layout pattern 132a of FIG. 1A, and similar detailed description is therefore omitted. In comparison with conductive feature layout pattern 132a of FIG. 1A, conductive feature layout pattern 332a is shifted in the second direction Y because of the positions of cut feature layout patterns 110b and 310c.

Set of conductive feature layout patterns 334 includes at least conductive feature pattern 334a or 134b. The set of conductive feature layout patterns 334 is usable to manufacture a corresponding set of conductive structures 334' (FIG. 3B) of integrated circuit 300B. In some embodiments, conductive feature layout pattern 334a of the set of conductive feature layout patterns 334 is usable to manufacture corresponding conductive structure 334a' of the set of conductive structures 334' (FIG. 3B) of integrated circuit 300B.

Conductive feature layout pattern 334a replaces conductive feature layout pattern 234a of FIG. 2A, and similar detailed description is therefore omitted. In comparison with conductive feature layout pattern 234a of FIG. 2A, conductive feature layout pattern 334a is shifted in the second direction Y because of the positions of cut feature layout patterns 312a and 212b.

Set of conductive feature layout patterns 336 includes at least conductive feature pattern 336a or 136b. The set of conductive feature layout patterns 336 is usable to manufacture a corresponding set of conductive structures 336' (FIG. 3B) of integrated circuit 300B. In some embodiments, conductive feature layout pattern 336a of the set of conductive feature layout patterns 336 is usable to manufacture corresponding conductive structure 336a' of the set of conductive structures 336' (FIG. 3B) of integrated circuit 300B.

Conductive feature layout pattern 336a replaces conductive feature layout pattern 236a of FIG. 2A, and similar detailed description is therefore omitted. In comparison with conductive feature layout pattern 236a of FIG. 2A, conductive feature layout pattern 336a is shifted in the second direction Y because of the positions of cut feature layout patterns 212b and 312c.

Other configurations or quantities of patterns in the set of conductive feature layout patterns 330, 332, 334 and 336 are within the scope of the present disclosure.

In some embodiments, by positioning a side 110b1 of cut feature layout pattern 110b of the set of cut feature layout patterns 312 extending in the first direction X to be aligned with gridline 102f, an additional conductive feature layout pattern 120f is useable as an additional routing track layout pattern in standard cell layout pattern 308a resulting in additional routing resources that are more efficiently utilized in layout design 300A than other approaches.

In some embodiments, by positioning a side 212b2 of cut feature layout pattern 212b of the set of cut feature layout patterns 312 extending in the first direction X to be aligned with gridline 102f, an additional conductive feature layout pattern 226a is useable as an additional routing track layout pattern in standard cell layout pattern 308b resulting in additional routing resources that are more efficiently utilized in layout design 300A than other approaches.

FIG. 3B is a diagram of a top view of an integrated circuit 300B, in accordance with some embodiments.

Integrated circuit 300B is a variation of integrated circuit 200B (FIG. 2B), and similar detailed description is therefore omitted. For example, integrated circuit 300B illustrates an example where a length of corresponding conductive structure 330a', 334a' is different from a length of corresponding conductive structure 332a', 336a' from different pitches (e.g., pitch PB1 and PC1).

Integrated circuit 300B includes standard cells 306a', 306b', 308a' and 308b'. In comparison with integrated circuit 200B of FIG. 2B, standard cells 306a', 306b', 308a' and 308b' replace corresponding standard cells 106a', 106b', 208a' and 208b', and similar detailed description is therefore omitted.

Integrated circuit 300B further includes the set of gridlines 102' and 104', the set of conductive structures 120', 122', 224' and 226', and a set of conductive structures 330', 332', 334' and 336'.

In comparison with integrated circuit 200B of FIG. 2B, the set of conductive structures 330', 332', 334' and 336' replace the corresponding set of conductive structures 130', 132', 234' and 236', and similar detailed description is therefore omitted.

Set of conductive structures 330' includes at least conductive structure 330a' or 130b'. Conductive structure 330a' replaces conductive structure 130a' of FIG. 2B, and similar detailed description is therefore omitted. In comparison with conductive structure 130a' of FIG. 2B, conductive structure 330a' is shifted in position in the second direction Y because of the new positions of removed portion 310a', 110b' and 310c'.

Set of conductive structures 332' includes at least conductive structure 332a' or 132b'. Conductive structure 332a' replaces conductive structure 132a' of FIG. 2B, and similar detailed description is therefore omitted. In comparison with conductive structure 132a' of FIG. 2B, conductive structure 332a' is shifted in position in the second direction Y because of the new positions of removed portion 310a', 110b' and 310c'.

Set of conductive structures 334' includes at least conductive structure 334a' or 134b'. Conductive structure 334a' replaces conductive structure 234a' of FIG. 2B, and similar detailed description is therefore omitted. In comparison with conductive structure 234a' of FIG. 2B, conductive structure 334a' is shifted in position in the second direction Y because of the new positions of removed portion 312a', 212b' and 312c'.

Set of conductive structures 336' includes at least conductive structure 336a' or 136b'. Conductive structure 336a' replaces conductive structure 236a' of FIG. 2B, and similar detailed description is therefore omitted. In comparison with conductive structure 236a' of FIG. 2B, conductive structure 336a' is shifted in position in the second direction Y because of the new positions of removed portion 312a', 212b' and 312c'.

In some embodiments, by having a different number of functional conductive structures in the set of conductive structures 120' and 122', integrated circuit 300B has an additional functional conductive structure 120f' and corresponding routing track in standard cells 306a' and 306b' resulting in additional routing resources that are more efficiently utilized than other approaches.

In some embodiments, by having a different number of functional conductive structures in the set of conductive structures 224' and 226', integrated circuit 300B has an additional functional conductive structure 224a' and corresponding routing track in standard cells 308a' and 308b' resulting in additional routing resources that are more efficiently utilized than other approaches.

Figure 4A:
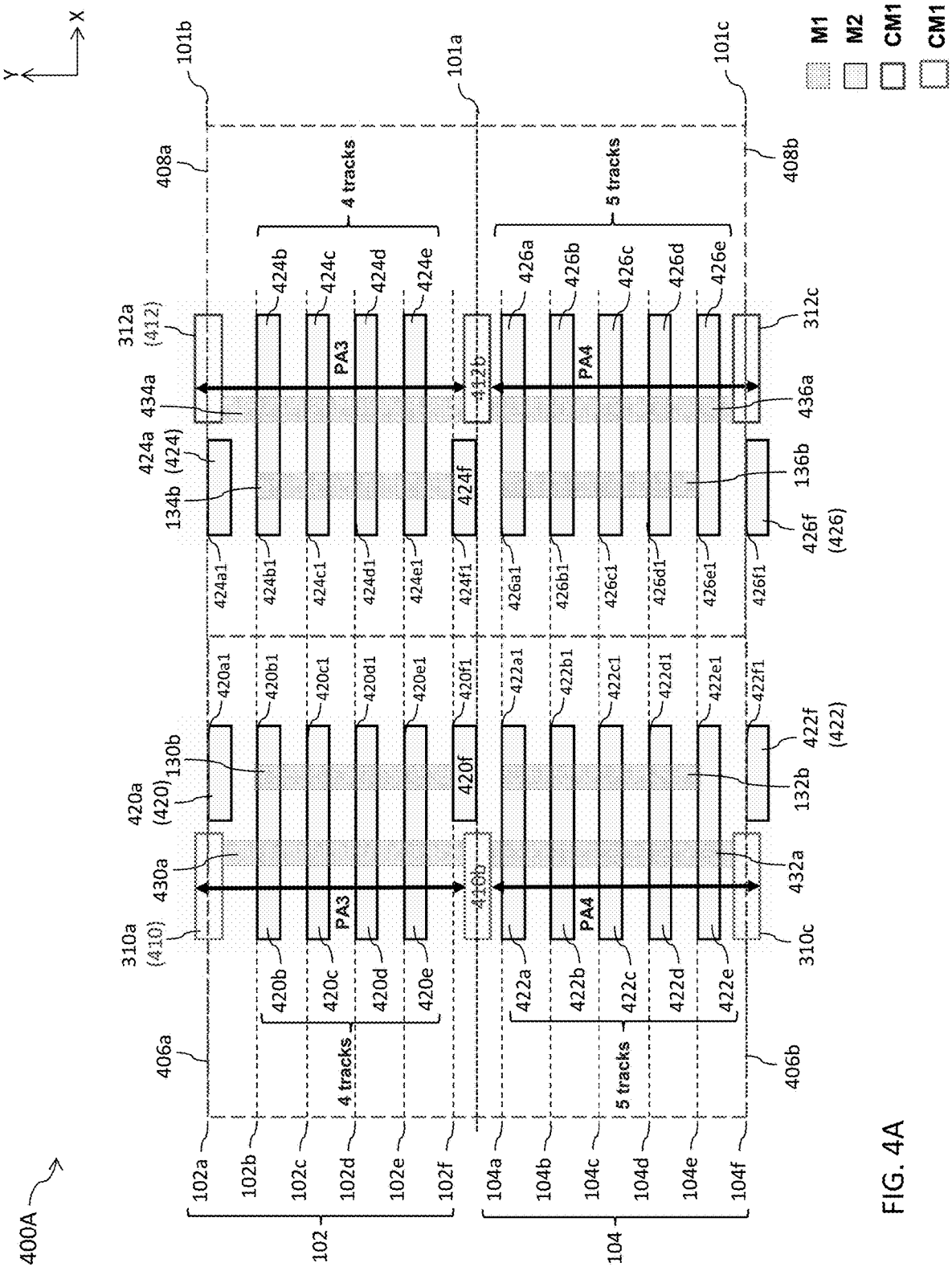
FIG. 4A is a diagram of a layout design of an integrated circuit, in accordance with some embodiments.

FIG. 4A is a diagram of a layout design 400A of an integrated circuit, in accordance with some embodiments.

Layout design 400A is a variation of layout design 300A (FIG. 3A), and therefore similar detailed description is omitted. For example, layout design 400A illustrates an example where a set of conductive feature layout patterns 420, 422, 424, 426 replaces the corresponding set of conductive feature layout patterns 120, 122, 224, 226 of FIG. 3A, causing the set of conductive feature layout patterns 420, 422, 424, 426 to be shifted in the second direction Y by half a width W1 (e.g., W1/2).

Figure 4B:
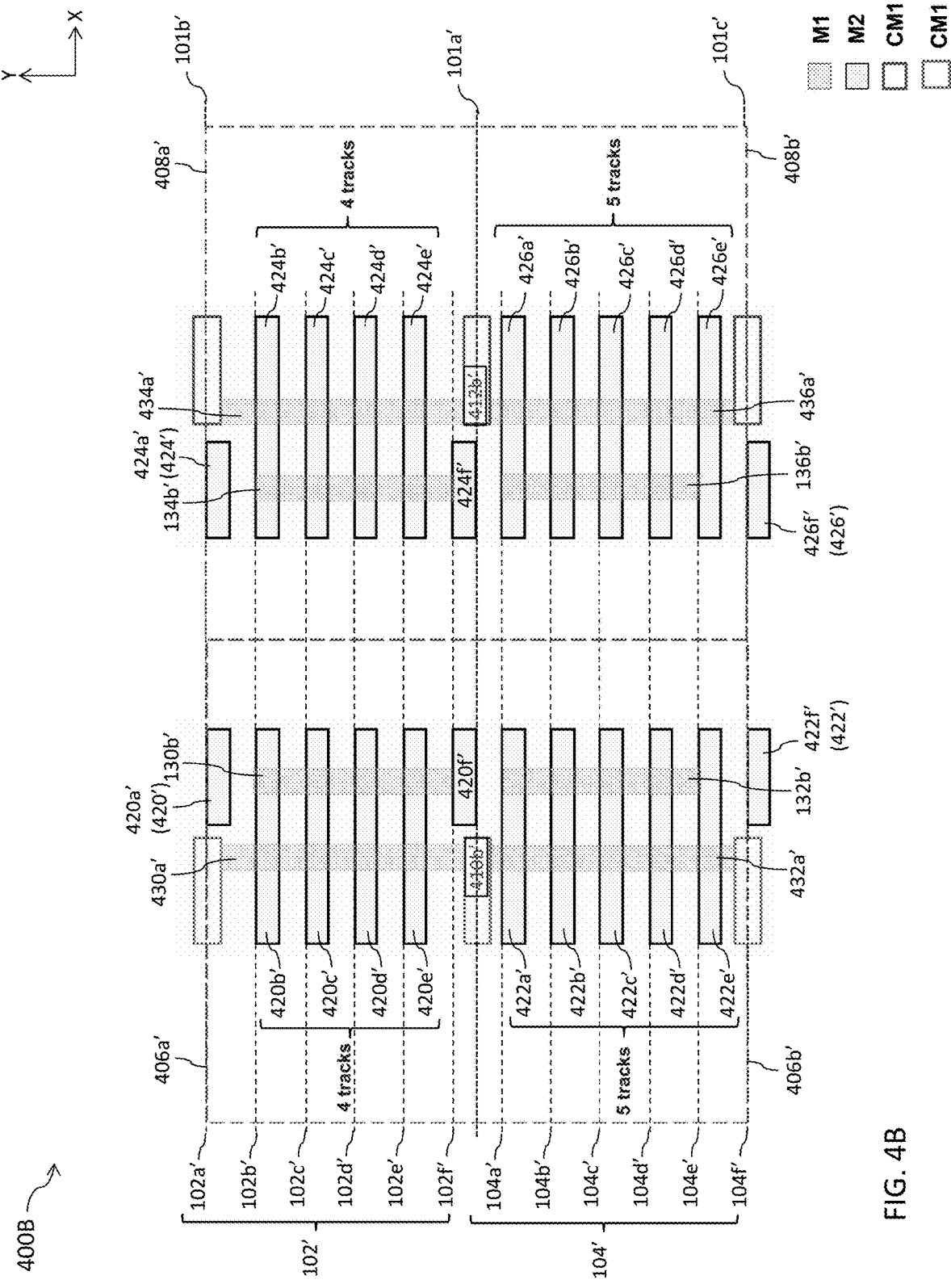
FIG. 4B is a diagram of a top view of an integrated circuit, in accordance with some embodiments.

Layout design 400A is usable to manufacture integrated circuit 400B of FIG. 4B.

Layout design 400A includes standard cell layout patterns 406a, 406b, 408a and 408b. In comparison with layout design 300A of FIG. 3A, standard cell layout patterns 406a, 406b, 408a and 408b replace corresponding standard cell layout patterns 308a, 308b, 308a and 308b, and similar detailed description is therefore omitted.

Layout design 400A further includes the set of gridlines 102 and 104, the set of conductive feature layout patterns 420, 422, 424 and 426, a set of conductive feature layout patterns 430, 432, 434 and 436, and a set of cut feature layout patterns 410 and 412.

In comparison with layout design 300A of FIG. 3A, the set of conductive feature layout patterns 420, 422, 424 and 426 replace the corresponding set of conductive feature layout patterns 120, 122, 224 and 226, the set of conductive feature layout patterns 430, 432, 434 and 436 replace the corresponding set of conductive feature layout patterns 330, 332, 334 and 336, and the set of cut feature layout patterns 410 and 412 replaces the corresponding set of cut feature layout patterns 310 and 312, and similar detailed description is therefore omitted.

Set of conductive feature layout patterns 420 includes at least conductive feature pattern 420a, 420b, 420c, 420d, 420e or 420f. The set of conductive feature layout patterns 420 is usable to manufacture a corresponding set of conductive structures 420' (FIG. 4B) of integrated circuit 400B. In some embodiments, conductive feature layout patterns 420a, 420b, 420c, 420d, 420e, 420f of the set of conductive feature layout patterns 420 is usable to manufacture corresponding conductive structures 420a', 420b', 420c', 420d', 420e', 420f' of the set of conductive structures 420' (FIG. 4B) of integrated circuit 400B.

Conductive feature layout patterns 420a, 420b, 420c, 420d, 420e, 420f replace corresponding conductive feature layout patterns 120a, 120b, 120c, 120d, 120e, 120f of FIG. 3A, and similar detailed description is therefore omitted. In comparison with conductive feature layout patterns 120a, 120b, 120c, 120d, 120e, 120f of FIG. 3A, corresponding conductive feature layout patterns 420a, 420b, 420c, 420d, 420e, 420f are shifted in the second direction Y by half a width W1 (e.g., W1/2). In some embodiments, by shifting conductive feature layout patterns 420a, 420b, 420c, 420d, 420e, 420f by half a width W1 (e.g., W1/2) in the second direction Y, a side 420a1, 420b1, 420c1, 420d1, 420e1, 420f1 of corresponding conductive feature layout patterns 420a, 420b, 420c, 420d, 420e, 420f extending in the first direction X is aligned with a corresponding gridline 102a, 102b, 102c, 102d, 120e, 102f in the first direction X.

In comparison with conductive feature layout pattern 120f of FIG. 3A, corresponding conductive feature layout patterns 420f is shorter in length in the first direction X because of the position of cut feature layout pattern 410b.

In some embodiments, layout patterns 420b, 420c, 420d and 420e of the set of conductive feature layout patterns 420 correspond to 4 M2 routing tracks in standard cell layout 406a.

Other configurations or quantities of patterns in the set of conductive feature layout patterns 420 are within the scope of the present disclosure.

Set of conductive feature layout patterns 422 includes at least conductive feature pattern 422a, 422b, 422c, 422d, 422e or 422f. The set of conductive feature layout patterns 422 is usable to manufacture a corresponding set of conductive structures 422' (FIG. 4B) of integrated circuit 400B. In some embodiments, conductive feature layout patterns 422a, 422b, 422c, 422d, 422e, 422f of the set of conductive feature layout patterns 422 is usable to manufacture corresponding conductive structures 422a', 422b', 422c', 422d', 422e', 422f' of the set of conductive structures 422' (FIG. 4B) of integrated circuit 400B.

Conductive feature layout patterns 422a, 422b, 422c, 422d, 422e, 422f replace corresponding conductive feature layout patterns 122a, 122b, 122c, 122d, 122e, 122f of FIG. 3A, and similar detailed description is therefore omitted. In comparison with conductive feature layout patterns 122a, 122b, 122c, 122d, 122e, 122f of FIG. 3A, corresponding conductive feature layout patterns 422a, 422b, 422c, 422d, 422e, 422f are shifted in the second direction Y by half a width W1 (e.g., W1/2). In some embodiments, by shifting conductive feature layout patterns 422a, 422b, 422c, 422d, 422e, 422f by half a width W1 (e.g., W1/2) in the second direction Y, a side 422a1, 422b1, 422c1, 422d1, 422e1, 422f1 of corresponding conductive feature layout patterns 422a, 422b, 422c, 422d, 422e, 422f extending in the first direction X is aligned with a corresponding gridline 104a, 104b, 104c, 104d, 104e, 104f in the first direction X.

In comparison with conductive feature layout pattern 122a of FIG. 3A, corresponding conductive feature layout patterns 422a is longer in length in the first direction X because the position of each of conductive feature layout patterns 422a and cut feature layout pattern 410b are shifted away from each other in the second direction Y.

In some embodiments, layout patterns 422a, 422b, 422c, 422d and 422e of the set of conductive feature layout patterns 422 correspond to 5 M2 routing tracks in standard cell layout 406b. In some embodiments, together the set of conductive feature layout patterns 420 and 422 are regular layout patterns within standard cell layout patterns 406a and 406b.

Other configurations or quantities of patterns in the set of conductive feature layout patterns 422 are within the scope of the present disclosure.

Set of conductive feature layout patterns 424 includes at least conductive feature pattern 424a, 424b, 424c, 424d, 424e or 424f. The set of conductive feature layout patterns 424 is usable to manufacture a corresponding set of conductive structures 424' (FIG. 4B) of integrated circuit 400B. In some embodiments, conductive feature layout patterns 424a, 424b, 424c, 424d, 424e, 424f of the set of conductive feature layout patterns 424 is usable to manufacture corresponding conductive structures 424a', 424b', 424c', 424d', 424e', 424f of the set of conductive structures 424' (FIG. 4B) of integrated circuit 400B.

Conductive feature layout patterns 424a, 424b, 424c, 424d, 424e, 424f replace corresponding conductive feature layout patterns 124a, 124b, 124c, 124d, 124e, 224f of FIG. 3A, and similar detailed description is therefore omitted. In comparison with conductive feature layout patterns 124a, 124b, 124c, 124d, 124e, 224f of FIG. 3A, corresponding conductive feature layout patterns 424a, 424b, 424c, 424d, 424e, 424f are shifted in the second direction Y by half a width W1 (e.g., W1/2). In some embodiments, by shifting conductive feature layout patterns 424a, 424b, 424c, 424d, 424e, 424f by half a width W1 (e.g., W1/2) in the second direction Y, a side 424a1, 424b1, 424c1, 424d1, 424e1, 424f1 of corresponding conductive feature layout patterns 424a, 424b, 424c, 424d, 424e, 424f extending in the first direction X is aligned with a corresponding gridline 102a, 102b, 102c, 102d, 124e, 102f in the first direction X.

In some embodiments, layout patterns 424b, 424c, 424d and 424e of the set of conductive feature layout patterns 424 correspond to 4 M2 routing tracks in standard cell layout 408a.

Other configurations or quantities of patterns in the set of conductive feature layout patterns 424 are within the scope of the present disclosure.

Set of conductive feature layout patterns 426 includes at least conductive feature pattern 426a, 426b, 426c, 426d, 426e or 426f. The set of conductive feature layout patterns 426 is usable to manufacture a corresponding set of conductive structures 426' (FIG. 4B) of integrated circuit 400B. In some embodiments, conductive feature layout patterns 426a, 426b, 426c, 426d, 426e, 426f of the set of conductive feature layout patterns 426 is usable to manufacture corresponding conductive structures 426a', 426b', 426c', 426d', 426e', 426f of the set of conductive structures 426' (FIG. 4B) of integrated circuit 400B.

Conductive feature layout patterns 426a, 426b, 426c, 426d, 426e, 426f replace corresponding conductive feature layout patterns 226a, 126b, 126c, 126d, 126e, 126f of FIG. 3A, and similar detailed description is therefore omitted. In comparison with conductive feature layout patterns 226a, 126b, 126c, 126d, 126e, 126f of FIG. 3A, corresponding conductive feature layout patterns 426a, 426b, 426c, 426d, 426e, 426f are shifted in the second direction Y by half a width W1 (e.g., W1/2). In some embodiments, by shifting conductive feature layout patterns 426a, 426b, 426c, 426d, 426e, 426f by half a width W1 (e.g., W1/2) in the second direction Y, a side 426a1, 426b1, 426c1, 426d1, 426e1, 426f1 of corresponding conductive feature layout patterns 426a, 426b, 426c, 426d, 426e, 426f extending in the first direction X is aligned with a corresponding gridline 104a, 104b, 104c, 104d, 104e, 104f in the first direction X.

In some embodiments, layout patterns 426a, 426b, 426c, 426d and 426e of the set of conductive feature layout patterns 426 correspond to 5 M2 routing tracks in standard cell layout 408b. In some embodiments, together the set of conductive feature layout patterns 424 and 426 are regular layout patterns within standard cell layout patterns 408a and 408b.

Other configurations or quantities of patterns in the set of conductive feature layout patterns 426 are within the scope of the present disclosure.

The set of cut feature layout patterns 410 includes at least cut feature layout pattern 310a, 410b or 310c.

The set of cut feature layout patterns 412 includes at least cut feature layout pattern 312a, 412b or 312c.

Cut feature layout patterns 410b, 412b replace corresponding cut feature layout patterns 110b, 212b of FIG. 3A, and similar detailed description is therefore omitted.

In comparison with cut feature layout patterns 110b, 212b of FIG. 3A, corresponding cut feature layout patterns 410b, 412b are each shifted in the second direction Y by half a cut width W2 (e.g., W2/2). In some embodiments, by shifting the position of corresponding cut feature layout patterns 410b, 412b of the set of cut feature layout patterns 410 by half a cut width W2 (e.g., W2/2) changes the pitch of set of cut feature layout patterns 410 and 412 to be pitch PA3 and PA4.

In some embodiments, cut feature layout patterns 310a, 410b, 310c identify corresponding locations of corresponding portions 410a', 410b', 410c' of conductive structure 430a' or 432a' that are removed in operation 706 of method 700 (FIG. 7).

In some embodiments, cut feature layout patterns 312a, 412b, 312c identify corresponding locations of corresponding portions 412a', 412b', 412c' of conductive structure 434a' or 436a' that are removed in operation 706 of method 700 (FIG. 7).

In some embodiments, at least one of the cut feature layout patterns 310a, 410b, 310c, 312a, 412b or 312c has the width W2 in the second direction Y. In some embodiments, the width W2 corresponds to a cut width (not labelled) of at least portion 310a', 410b', 310c', 312a', 412b' or 312c' of at least conductive structure 430a', 432a', 434a' or 436a'.

Cut feature layout pattern 310a, 312a is separated from corresponding cut feature layout pattern 410b, 412b by a pitch PA3 in the second direction Y. Cut feature layout pattern 410b, 412b is separated from corresponding cut feature layout pattern 310c, 312c by a pitch PA4 in the second direction Y. In some embodiments, at least one of pitch PA3, PA4, PA1 or PA2 is the same as at least another of pitch PA3, PA4, PA1 or PA2.

In some embodiments, conductive feature layout pattern 330a, 334a is positioned between corresponding cut feature layout pattern 310a, 312a and corresponding cut feature layout pattern 410b, 412b. In some embodiments, conductive feature layout pattern 332a, 336a is positioned between corresponding cut feature layout pattern 410b, 412b and corresponding cut feature layout pattern 310c, 312c.

In some embodiments, a center of corresponding cut feature layout patterns 410b and 412b is aligned in the first direction X with cell boundary 101a. In some embodiments, the set of cut feature layout patterns 410 or 412 is regular in a single standard cell layout pattern (e.g., standard cell layout patterns 406a and 406b). In some embodiments, in other words, the set of cut feature layout patterns 410 is regular within corresponding standard cell layout patterns 406a and 406b, and the set of cut feature layout patterns 412 is regular within corresponding standard cell layout patterns 408a and 408b.

Other configurations or quantities of patterns in the set of cut feature layout patterns 410 or 412 are within the scope of the present disclosure.

Set of conductive feature layout patterns 430 includes at least conductive feature pattern 430a or 130b. Set of conductive feature layout patterns 432 includes at least conductive feature pattern 432a or 132b. Set of conductive feature layout patterns 434 includes at least conductive feature pattern 434a or 134b. Set of conductive feature layout patterns 436 includes at least conductive feature pattern 436a or 136b.

The set of conductive feature layout patterns 430, 432, 434, 436 is usable to manufacture a corresponding set of conductive structures 430', 432', 434', 436' (FIG. 3B) of integrated circuit 400B. In some embodiments, conductive feature layout pattern 430a, 432a, 434a, 436a is usable to manufacture corresponding conductive structure 430a', 432a', 434a', 436a' of the corresponding set of conductive structures 430', 432', 434', 436' (FIG. 3B) of integrated circuit 400B.

Conductive feature layout pattern 430a, 432a, 434a, 436a replaces corresponding conductive feature layout pattern 330a, 332a, 334a, 336a of FIG. 3A, and similar detailed description is therefore omitted.

In comparison with conductive feature layout pattern 330a of FIG. 3A, conductive feature layout pattern 430a is shifted in the second direction Y because of the positions of cut feature layout patterns 310a and 410b.

In comparison with conductive feature layout pattern 332a of FIG. 3A, conductive feature layout pattern 432a is shifted in the second direction Y because of the positions of cut feature layout patterns 410b and 310c.

In comparison with conductive feature layout pattern 334a of FIG. 3A, conductive feature layout pattern 434a is shifted in the second direction Y because of the positions of cut feature layout patterns 312a and 412b.

In comparison with conductive feature layout pattern 336a of FIG. 3A, conductive feature layout pattern 436a is shifted in the second direction Y because of the positions of cut feature layout patterns 412b and 312c.

Other configurations or quantities of patterns in the set of conductive feature layout patterns 430, 332, 334 and 336 are within the scope of the present disclosure.

In some embodiments, by positioning at least a side 422a1, 422b1, 422c1, 422d1, 422e1, 422f1 of at least a corresponding conductive feature layout pattern 422a, 422b, 422c, 422d, 422e, 422f extending in the first direction X to be aligned with a corresponding gridline 104a, 104b, 104c, 104d, 104e, 104f in the first direction X, an additional conductive feature layout pattern 422a is useable as an additional routing track layout pattern in standard cell layout pattern 406b resulting in additional routing resources that are more efficiently utilized in layout design 400A than other approaches.

In some embodiments, by positioning at least a side 426a1, 426b1, 426c1, 426d1, 426e1, 426f1 of at least a corresponding conductive feature layout pattern 426a, 426b, 426c, 426d, 426e, 426f extending in the first direction X to be aligned with a corresponding gridline 104a, 104b, 104c, 104d, 104e, 104f in the first direction X, an additional conductive feature layout pattern 426a is useable as an additional routing track layout pattern in standard cell layout pattern 408b resulting in additional routing resources that are more efficiently utilized in layout design 400A than other approaches.

FIG. 4B is a diagram of a top view of an integrated circuit 400B, in accordance with some embodiments.

Integrated circuit 400B is a variation of integrated circuit 300B (FIG. 3B), and similar detailed description is therefore omitted. For example, integrated circuit 400B illustrates an example where a set of conductive structures 420', 422', 424', 426' replaces the corresponding set of conductive structures 120', 122', 224', 226' of FIG. 3A, causing the set of conductive structures 420', 422', 424', 426' to be shifted in the second direction Y by half a width W1 (e.g., W1/2).

Integrated circuit 400B includes standard cells 406a', 406b', 408a' and 408b'. In comparison with integrated circuit 300B of FIG. 3B, standard cells 406a', 406b', 408a' and 408b' replace corresponding standard cells 306a', 306b', 308a' and 308b', and similar detailed description is therefore omitted.

Integrated circuit 400B further includes the set of gridlines 102' and 104', the set of conductive structures 420', 422', 424' and 426', and a set of conductive structures 430', 432', 434' and 436'.

In comparison with integrated circuit 300B of FIG. 3B, the set of conductive structures 420', 422', 424' and 426' replace the corresponding set of conductive structures 120', 122', 224' and 226', the set of conductive structures 430', 432', 434' and 436' replace the corresponding set of conductive structures 330', 332', 334' and 336', and similar detailed description is therefore omitted.

Set of conductive structures 420' includes at least conductive structure 420a', 420b', 420c', 420d', 420e' or 420f. Conductive structures 420a', 420b', 420c', 420d', 420e', 420f replace corresponding conductive structures 120a', 120b', 120c', 120d', 120e', 120f of FIG. 3B, and similar description is therefore omitted.

In comparison with conductive structures 120a', 120b', 120c', 120d', 120e', 120f of FIG. 3B, conductive structures 420a', 420b', 420c', 420d', 420e', 420f are shifted in the second direction Y by half a width W1 (e.g., W1/2). In some embodiments, by shifting conductive structures 420a', 420b', 420c', 420d', 420e', 420f by half a width W1 (e.g., W1/2) in the second direction Y, causes conductive structure 420f to be shorter in length in the first direction X because of the proximity to the removed portion 410b' of conductive structure 430a' or 432a' causing conductive structure 420f to be a non-functional or a dummy structure.

In some embodiments, at least conductive structure 420b', 420c', 420d' or 420e' of the set of conductive structures 420' are functional conductive structures. In some embodiments, the set of conductive structures 420' has an even number of functional conductive structures and corresponding routing tracks. In some embodiments, the set of conductive structures 420' has 4 functional conductive structures and corresponding routing tracks.

Set of conductive structures 422' includes at least conductive structure 422a', 422b', 422c', 422d', 422e' or 422f. Conductive structures 422a', 422b', 422c', 422d', 422e', 422f' replace corresponding conductive structures 122a', 122b', 122c', 122d', 122e', 124f of FIG. 3B, and similar detailed description is therefore omitted.

In comparison with conductive structures 122a', 122b', 122c', 122d', 122e', 124f of FIG. 3B, conductive structures 422a', 422b', 422c', 422d', 422e', 422f' are shifted in the second direction Y by half a width W1 (e.g., W1/2). In some embodiments, by shifting conductive structures 422a', 422b', 422c', 422d', 422e', 422f' by half a width W1 (e.g., W1/2) in the second direction Y, the number of functional or non-functional conductive structures can be adjusted based on the proximity of conductive structures 422a', 422b', 422c', 422d', 422e', 422f' to removed portions 410a', 410b', 410c' of conductive structure 430a' or 432a'.

In comparison with conductive structure 122a' of FIG. 3B, conductive structure 422a' is longer in length in the first direction X because the removed portion 410b' of conductive structure 430a' or 432a' is shifted in the second direction Y by half a width W1 (e.g., W1/2). In some embodiments, by increasing the length of conductive structure 422a' causes conductive structure 422a' to be a functional structure. In some embodiments, at least conductive structure 422a', 422b', 422c', 422d' or 422e' of the set of conductive structures 422' are functional conductive structures. In some embodiments, the set of conductive structures 422' has an odd number of functional conductive structures and corresponding routing tracks. In some embodiments, the set of conductive structures 422' has 5 functional conductive structures and corresponding routing tracks.

Set of conductive structures 424' includes at least conductive structure 424a', 424b', 424c', 424d', 424e' or 424f. Conductive structures 424a', 424b', 424c', 424d', 424e', 424f' replace corresponding conductive structures 124a', 124b', 124c', 124d', 124e', 224f of FIG. 3B, and similar detailed description is therefore omitted.

In comparison with conductive structures 124a', 124b', 124c', 124d', 124e', 224f of FIG. 3B, conductive structures 424a', 424b', 424c', 424d', 424e', 424f' are shifted in the second direction Y by half a width W1 (e.g., W1/2). In some embodiments, by shifting conductive structures 424a', 424b', 424c', 424d', 424e', 424f' by half a width W1 (e.g., W1/2) in the second direction Y, the number of functional or non-functional conductive structures can be adjusted based on the proximity of conductive structures 424a', 424b', 424c', 424d', 424e', 424f' to removed portions 410a', 410b', 410c' of conductive structure 434a' or 436a'. Conductive structure 424f has a length shorter in the first direction X than conductive structures 424b', 424c', 424d', 424e' and conductive structure 424f is therefore a non-functional or a dummy structure.

In some embodiments, at least conductive structure 424b', 424c', 424d' or 424e' of the set of conductive structures 424' are functional conductive structures. In some embodiments, the set of conductive structures 424' has an even number of functional conductive structures and corresponding routing tracks. In some embodiments, the set of conductive structures 424' has 4 functional conductive structures and corresponding routing tracks.

Set of conductive structures 426' includes at least conductive structure 426a', 426b', 426c', 426d', 426e' or 426f. Conductive structures 426a', 426b', 426c', 426d', 426e', 426f' replace corresponding conductive structures 226a', 126b', 126c', 126d', 126e', 126f of FIG. 3B, and similar detailed description is therefore omitted.

In comparison with conductive structures 226a', 126b', 126c', 126d', 126e', 126f of FIG. 3B, conductive structures 426a', 426b', 426c', 426d', 426e', 426f' are shifted in the second direction Y by half a width W1 (e.g., W1/2). In some embodiments, by shifting conductive structures 426a', 426b', 426c', 426d', 426e', 426f' by half a width W1 (e.g., W1/2) in the second direction Y, the number of functional or non-functional conductive structures can be adjusted based on the proximity of conductive structures 426a', 426b', 426c', 426d', 426e', 426f' to removed portions 410a', 410b', 410c' of conductive structure 434a' or 436a'.

In some embodiments, at least conductive structure 426a', 426b', 426c', 426d' or 426e' of the set of conductive structures 426' are functional conductive structures. In some embodiments, the set of conductive structures 426' has an odd number of functional conductive structures and corresponding routing tracks. In some embodiments, the set of conductive structures 426' has 5 functional conductive structures and corresponding routing tracks.

Set of conductive structures 430' includes at least conductive structure 430a' or 130b'. Set of conductive structures 432' includes at least conductive structure 432a' or 132b'. Conductive structure 430a', 432a' replaces corresponding conductive structure 330a', 332a' of FIG. 3B, and similar detailed description is therefore omitted. In comparison with conductive structure 330a', 332a' of FIG. 3B, corresponding conductive structure 430a', 432a' is shifted in corresponding position in the second direction Y because of the new positions of removed portions 310a', 410b' and 310c'.

Set of conductive structures 434' includes at least conductive structure 434a' or 134b'. Set of conductive structures 436' includes at least conductive structure 436a' or 136b'. Conductive structure 434a', 436a' replaces corresponding conductive structure 334a', 336a' of FIG. 3B, and similar detailed description is therefore omitted. In comparison with conductive structure 334a', 336a' of FIG. 3B, corresponding conductive structure 434a', 436a' is shifted in corresponding position in the second direction Y because of the new positions of removed portions 312a', 412b' and 312c'.

In some embodiments, by shifting the position of the set of conductive feature layout patterns 420, 422, 424, 426 to be shifted in the second direction Y by half a width W1 (e.g., W1/2), the corresponding sides of conductive feature layout patterns in the set of conductive feature layout patterns 420, 422, 424, 426 extending in the first direction X are aligned with corresponding gridlines in the set of gridlines 102 and 104, causing at least conductive feature layout pattern 422a, 426a to sufficiently separated from the corresponding cut feature layout pattern 410b, 412b to not violate via landing spot design rules, and conductive feature layout patterns 422a and 426a are useable to manufacture corresponding conductive structure 422a' and 426a' which are additional functional conductive structure in the corresponding set of conductive structures 422' and 426'.

In some embodiments, by shifting the position of the set of conductive structures 420', 422', 424', 426' to be shifted in the second direction Y by half a width W1 (e.g., W1/2), results in a different number of functional conductive structures in the set of conductive structures 420' and 422', or a different number of functional conductive structures in the set of conductive structures 424' and 426'. In some embodiments, by having a different number of functional conductive structures in the set of conductive structures 420' and 422' or a different number of functional conductive structures in the set of conductive structures 424' and 426', integrated circuit 400B has an additional functional conductive structure 422a' and corresponding routing track in standard cells 406a' and 406b', and an additional functional conductive structure 426a' and corresponding routing track in standard cells 408a' and 408b', resulting in additional routing resources that are more efficiently utilized than other approaches.

Figure 5A:
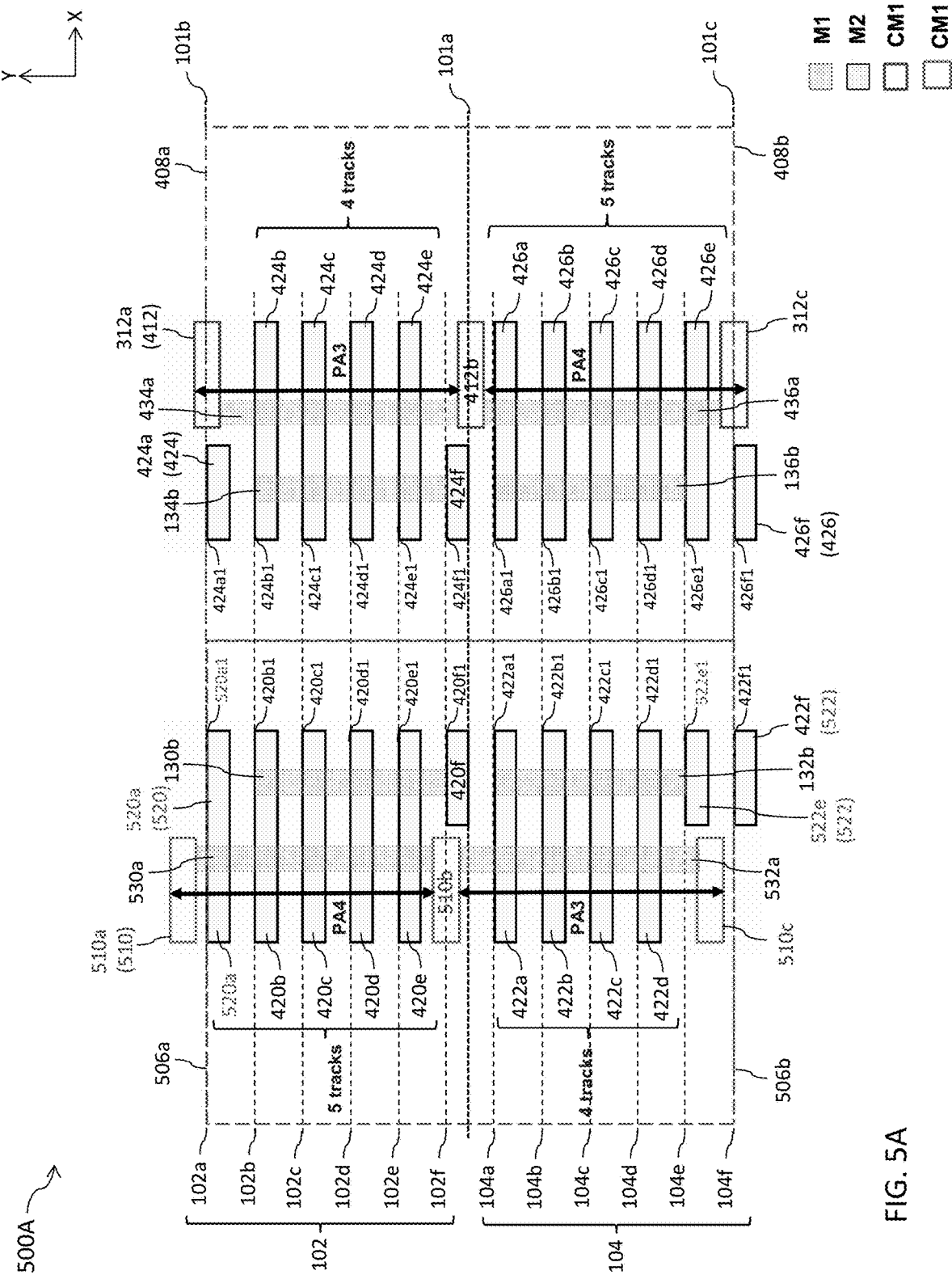
FIG. 5A is a diagram of a layout design of an integrated circuit, in accordance with some embodiments.

FIG. 5A is a diagram of a layout design 500A of an integrated circuit, in accordance with some embodiments.

Layout design 500A is a variation of layout design 400A (FIG. 4A), and therefore similar detailed description is omitted. For example, layout design 500A illustrates an example where a set of cut feature layout patterns 510 replaces the corresponding set of cut feature layout patterns 410 of FIG. 4A, causing the set of cut feature layout patterns 510 to be shifted in the second direction Y by a width W1.

Layout design 500A is usable to manufacture integrated circuit 500B of FIG. 4B.

Layout design 500A includes standard cell layout patterns 506a, 506b, 408a and 408b. In comparison with layout design 400A of FIG. 4A, standard cell layout patterns 506a and 506b replace corresponding standard cell layout patterns 406a and 406b, and similar detailed description is therefore omitted.

Layout design 500A further includes the set of gridlines 102 and 104, the set of conductive feature layout patterns 520, 522, 424 and 426, a set of conductive feature layout patterns 530, 532, 434 and 436, and the set of cut feature layout patterns 510 and 412.

In comparison with layout design 400A of FIG. 4A, the set of conductive feature layout patterns 520 and 522 replace the corresponding set of conductive feature layout patterns 420 and 422, the set of conductive feature layout patterns 530 and 532 replace the corresponding set of conductive feature layout patterns 430 and 432, and the set of cut feature layout patterns 510 replaces the corresponding set of cut feature layout patterns 410, and similar detailed description is therefore omitted.

The set of cut feature layout patterns 510 includes at least cut feature layout pattern 510a, 510b or 510c. Cut feature layout patterns 510a, 510b, 510c replace corresponding cut feature layout patterns 310a, 410b, 310c of FIG. 4A, and similar detailed description is therefore omitted. In comparison with cut feature layout patterns 310a, 410b, 310c of FIG. 4A, cut feature layout patterns 510a, 510b, 510c are shifted in the second direction Y by a width W1. In some embodiments, by shifting the position of the set of cut feature layout patterns by width W1 causes conductive feature layout patterns 520a and 522e to have different corresponding lengths in the first direction X from corresponding conductive feature layout patterns 420a and 422e of FIG. 4A.

In some embodiments, cut feature layout patterns 510a, 510b, 510c identify corresponding locations of corresponding portions 510a', 510b', 510c' of conductive structure 530a' or 530a' that are removed in operation 706 of method 700 (FIG. 7). In some embodiments, at least one of the cut feature layout patterns 510a, 510b, 510c of the set of cut feature layout patterns 510 has the width W2 in the second direction Y. In some embodiments, the width W2 corresponds to a cut width (not labelled) of at least portion 510a', 510b' or 510c' of at least conductive structure 530a' or 532a'.

Cut feature layout pattern 510a is separated from cut feature layout pattern 510b by the pitch PA4 in the second direction Y. Cut feature layout pattern 510b is separated from cut feature layout pattern 510c by the pitch PA3 in the second direction Y.

In some embodiments, a conductive feature layout pattern 530a is positioned between cut feature layout patterns 510a and 510b. In some embodiments, a conductive feature layout pattern 532a is positioned between cut feature layout patterns 510b and 510c.

In some embodiments, a center of cut feature layout pattern 510b is offset in the second direction Y from cell boundary 101a by half a pitch (e.g., P1/2). In some embodiments, a center of cut feature layout pattern 510b is aligned in the first direction X with gridline 102f.

In some embodiments, a center of corresponding cut feature layout pattern 510a, 510c is offset in the second direction Y from corresponding cell boundary 101b, 101c by width W1. In some embodiments, a center of cut feature layout pattern 510c is offset in the second direction Y from gridline 104e by width W1. In some embodiments, the set of cut feature layout patterns 510 is regular in a single standard cell layout pattern (e.g., standard cell layout patterns 506a and 506b). In some embodiments, in other words, the set of cut feature layout patterns 410 is regular within corresponding standard cell layout patterns 406a and 406b, and the set of cut feature layout patterns 412 is regular within corresponding standard cell layout patterns 408a and 408b.

Other configurations or quantities of patterns in the set of cut feature layout patterns 510 are within the scope of the present disclosure.

Set of conductive feature layout patterns 520 includes at least conductive feature pattern 520a, 420b, 420c, 420d, 420e or 420f. The set of conductive feature layout patterns 520 is usable to manufacture a corresponding set of conductive structures 520' (FIG. 5B) of integrated circuit 500B. In some embodiments, conductive feature layout pattern 520a of the set of conductive feature layout patterns 520 is usable to manufacture corresponding conductive structure 520a' of the set of conductive structures 520' (FIG. 5B) of integrated circuit 500B.

Conductive feature layout pattern 520a replaces conductive feature layout pattern 420a of FIG. 4A, and similar detailed description is therefore omitted. In comparison with conductive feature layout pattern 420a of FIG. 4A, conductive feature layout pattern 520a is longer in length in the first direction X because the position of cut feature layout pattern 510a is shifted away from the conductive feature layout pattern 520a in the second direction Y.

In some embodiments, layout patterns 520a, 420b, 420c, 420d and 420e of the set of conductive feature layout patterns 520 correspond to 5 M2 routing tracks in standard cell layout 506a.

Other configurations or quantities of patterns in the set of conductive feature layout patterns 520 are within the scope of the present disclosure.

Set of conductive feature layout patterns 522 includes at least conductive feature pattern 422a, 422b, 422c, 422d, 522e or 422f. The set of conductive feature layout patterns 522 is usable to manufacture a corresponding set of conductive structures 522' (FIG. 5B) of integrated circuit 500B. In some embodiments, conductive feature layout pattern 522e of the set of conductive feature layout patterns 522 is usable to manufacture corresponding conductive structure 522e' of the set of conductive structures 522' (FIG. 5B) of integrated circuit 500B.

Conductive feature layout pattern 522e replaces conductive feature layout pattern 422e of FIG. 4A, and similar detailed description is therefore omitted. In comparison with conductive feature layout pattern 422e of FIG. 4A, conductive feature layout pattern 522e is shorter in length in the first direction X because the position of cut feature layout pattern 510c is shifted towards the conductive feature layout pattern 522e in the second direction Y.

In some embodiments, layout patterns 422a, 422b, 422c and 422d of the set of conductive feature layout patterns 522 correspond to 4 M2 routing tracks in standard cell layout 506b.

Other configurations or quantities of patterns in the set of conductive feature layout patterns 522 are within the scope of the present disclosure.

Set of conductive feature layout patterns 530 includes at least conductive feature pattern 530a or 130b. Set of conductive feature layout patterns 532 includes at least conductive feature pattern 532a or 132b.

The set of conductive feature layout patterns 530, 532 is usable to manufacture a corresponding set of conductive structures 530', 532' (FIG. 5B) of integrated circuit 500B. In some embodiments, conductive feature layout pattern 530a, 532a is usable to manufacture corresponding conductive structure 530a', 532a' of the corresponding set of conductive structures 530', 532' (FIG. 5B) of integrated circuit 500B.

Conductive feature layout pattern 530a, 532a replaces corresponding conductive feature layout pattern 430a, 432a of FIG. 4A, and similar detailed description is therefore omitted.

In comparison with conductive feature layout pattern 430a of FIG. 4A, conductive feature layout pattern 530a is shifted in the second direction Y because of the positions of cut feature layout patterns 510a and 510b.

In comparison with conductive feature layout pattern 432a of FIG. 4A, conductive feature layout pattern 532a is shifted in the second direction Y because of the positions of cut feature layout patterns 510b and 510c.

Other configurations or quantities of patterns in the set of conductive feature layout patterns 530 and 532, are within the scope of the present disclosure.

In some embodiments, by shifting the position of cut feature layout pattern 510a away from conductive feature layout pattern 520a in the second direction Y, an additional conductive feature layout pattern 520a is useable as an additional routing track layout pattern in standard cell layout pattern 506a resulting in additional routing resources that are more efficiently utilized in layout design 500A than other approaches.

Figure 5B:
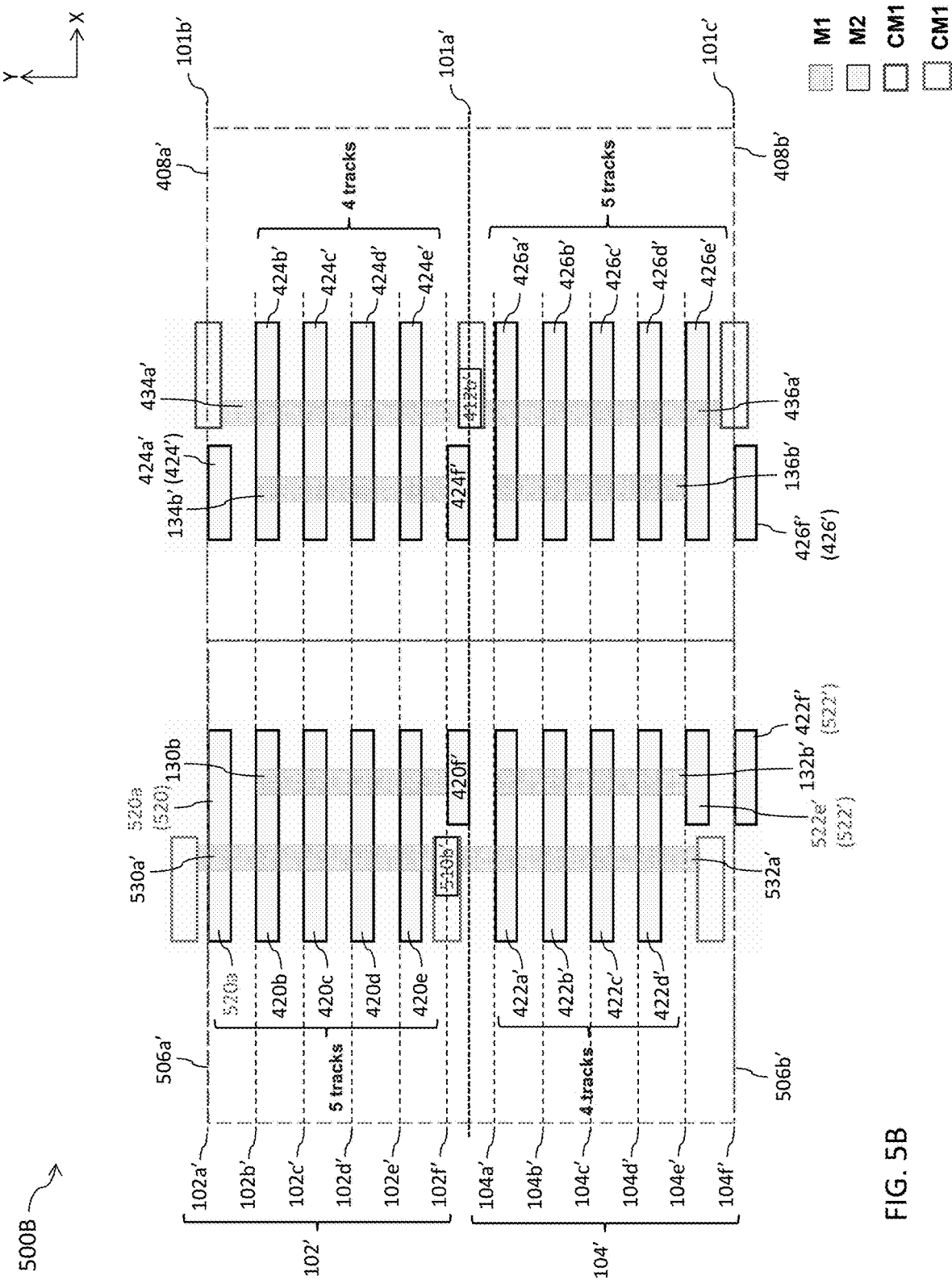
FIG. 5B is a diagram of a top view of an integrated circuit, in accordance with some embodiments.

FIG. 5B is a diagram of a top view of an integrated circuit 500B, in accordance with some embodiments.

Integrated circuit 500B is a variation of integrated circuit 400B (FIG. 4B), and similar detailed description is therefore omitted. For example, integrated circuit 500B illustrates an example where conductive structures 520a' and 522e' replace corresponding conductive structures 420a' and 422e' of FIG. 4A, and conductive structures 520a' and 522e' have different corresponding lengths in the first direction X from corresponding conductive structures 420a' and 422e' of FIG. 4A.

Integrated circuit 500B includes standard cells 506a', 506b', 408a' and 408b'. In comparison with integrated circuit 400B of FIG. 4B, standard cells 506a' and 506b' replace corresponding standard cells 406a' and 406b', and similar detailed description is therefore omitted.

In comparison with integrated circuit 400B of FIG. 4B, the set of conductive structures 520' and 522' replace the corresponding set of conductive structures 420' and 422', the set of conductive structures 530' and 532' replace the corresponding set of conductive structures 430' and 432', and similar detailed description is therefore omitted.

Set of conductive structures 520' includes at least conductive structure 520a', 420b', 420c', 420d', 420e' or 420f.

Conductive structure 520a' replaces conductive structure 420a' of FIG. 4B, and similar detailed description is therefore omitted.

In comparison with conductive structure 420a' of FIG. 4B, conductive structure 520a' is longer in length in the first direction X because the removed portion 510a' of conductive structure 530a is shifted in the second direction Y by a width W1. In some embodiments, by increasing the length of conductive structure 520a' causes conductive structure 520a' to be a functional conductive structure. In some embodiments, at least conductive structure 520a', 420b', 420c', 420d' or 420e' of the set of conductive structures 520' are functional conductive structures. In some embodiments, the set of conductive structures 520' has an odd number of functional conductive structures and corresponding routing tracks. In some embodiments, the set of conductive structures 520' has 5 functional conductive structures and corresponding routing tracks.

Set of conductive structures 522' includes at least conductive structure 422a', 422b', 422c', 422d', 522e' or 422f.

Conductive structure 522e' replaces conductive structure 422e' of FIG. 4B, and similar detailed description is therefore omitted.

In comparison with conductive structure 422e' of FIG. 4B, conductive structure 522e' is shorter in length in the first direction X because the removed portion 510c' of conductive structure 532a' is shifted in the second direction Y by a width W1 towards conductive structure 522e'. In some embodiments, by shifting the position of removed portion 510a', 510b', 510c' of conductive structure 530a or 532a in the second direction Y, the number of functional or non-functional conductive structures can be adjusted based on the proximity of conductive structures 422a', 422b', 422c', 422d', 522e', 422f to removed portion 510a', 510b', 510c' of conductive structure 530a or 532a.

Conductive structure 522e' has a length shorter in the first direction X than conductive structures 422e' and is therefore a non-functional or a dummy structure. In some embodiments, at least conductive structure 422a', 422b', 422c' or 422d' of the set of conductive structures 522' are functional conductive structures. In some embodiments, the set of conductive structures 522' has an even number of functional conductive structures and corresponding routing tracks. In some embodiments, the set of conductive structures 522' has 4 functional conductive structures and corresponding routing tracks.

Set of conductive structures 530' includes at least conductive structure 530a' or 130b'. Set of conductive structures 532' includes at least conductive structure 532a' or 132b'. Conductive structure 530a', 532a' replaces corresponding conductive structure 430a', 432a' of FIG. 4B, and similar detailed description is therefore omitted. In comparison with conductive structure 430a', 432a' of FIG. 4B, corresponding conductive structure 530a', 532a' is shifted in corresponding position in the second direction Y because of the new positions of removed portions 510a', 510b' and 510c'.

In some embodiments, conductive feature layout patterns 522a' is useable to manufacture corresponding conductive structure 522a' which is an additional functional conductive structure in the corresponding set of conductive structures 522' causing a different number of functional conductive structures in the set of conductive structures 520' and 522'. In some embodiments, by having a different number of functional conductive structures in the set of conductive structures 520' and 522', integrated circuit 500B has an additional functional conductive structure 522a' and corresponding routing track in standard cells 506a' and 506b' resulting in additional routing resources that are more efficiently utilized than other approaches.

Figure 6A:
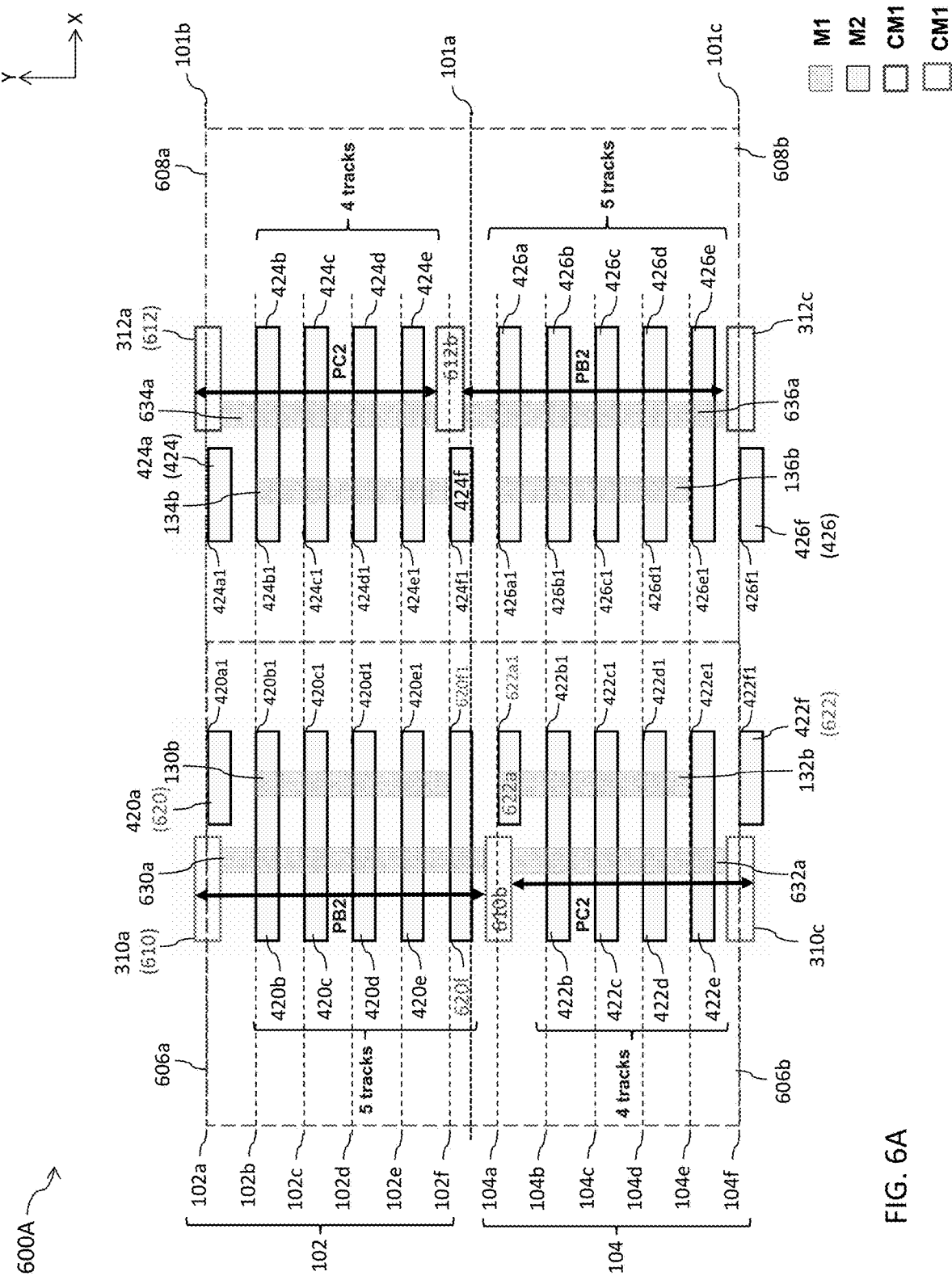
FIG. 6A is a diagram of a layout design of an integrated circuit, in accordance with some embodiments.

FIG. 6A is a diagram of a layout design 600A of an integrated circuit, in accordance with some embodiments.

Layout design 600A is a variation of layout design 500A (FIG. 5A), and therefore similar detailed description is omitted. For example, layout design 600A illustrates an example where a set of cut feature layout patterns 610 and 612 replaces the corresponding set of cut feature layout patterns 510 and 412 of FIG. 5A, causing cut feature layout patterns within the set of cut feature layout patterns 610 or 612 to be separated by different pitches (e.g., pitch PB2 and PC2).

Figure 6B:
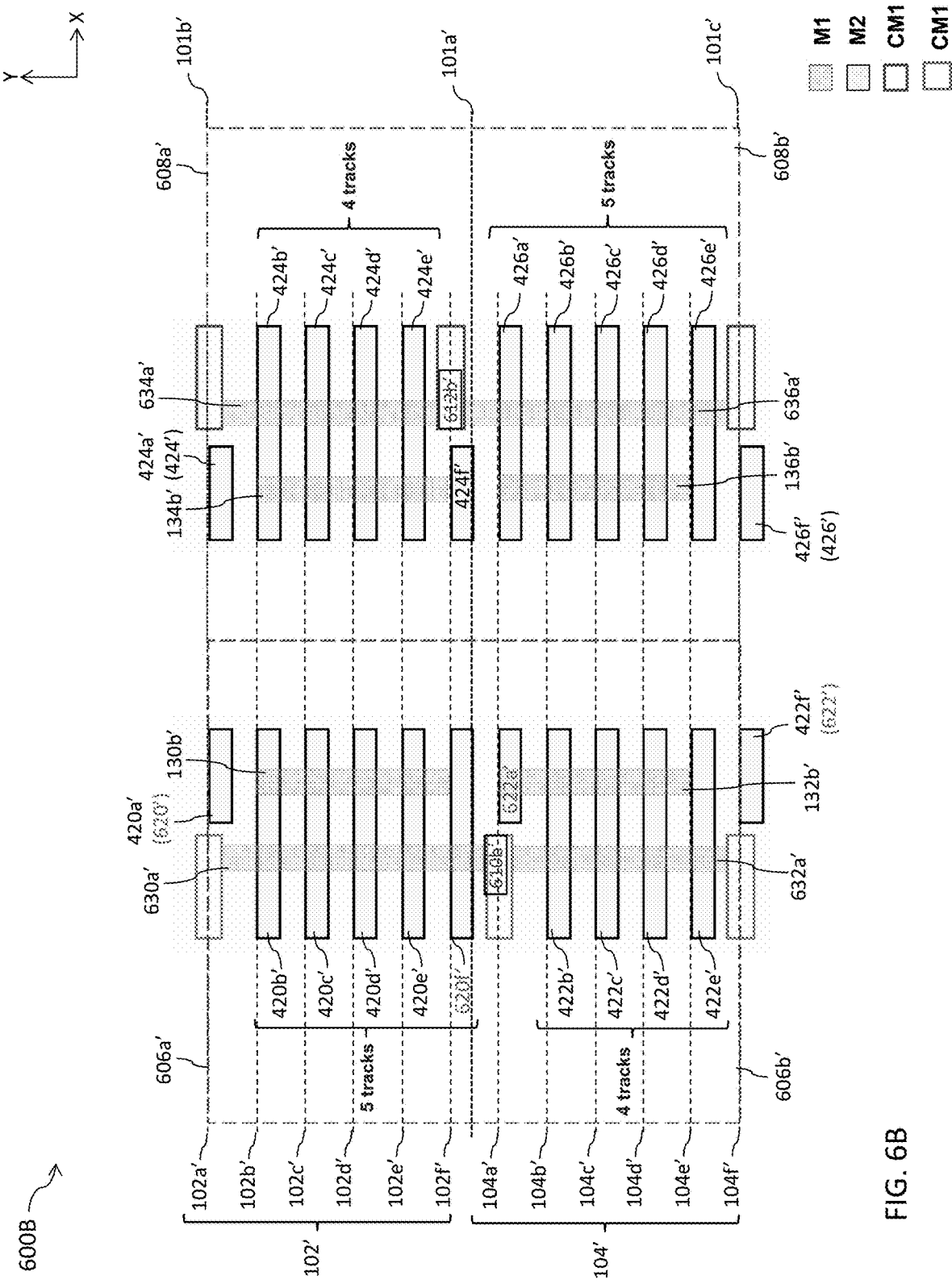
FIG. 6B is a diagram of a top view of an integrated circuit, in accordance with some embodiments.

Layout design 600A is usable to manufacture integrated circuit 600B of FIG. 6B.

Layout design 600A includes standard cell layout patterns 606a, 606b, 608a and 608b. In comparison with layout design 500A of FIG. 5A, standard cell layout patterns 606a, 606b, 608a and 608b replace corresponding standard cell layout patterns 506a, 506b, 408a and 408b, and similar detailed description is therefore omitted.

In comparison with layout design 500A of FIG. 5A, the set of conductive feature layout patterns 620 and 622 replace the corresponding set of conductive feature layout patterns 520 and 522, the set of conductive feature layout patterns 630, 632, 634 and 636 replace the corresponding set of conductive feature layout patterns 530, 532, 534 and 536, and the set of cut feature layout patterns 610 and 612 replace the corresponding set of cut feature layout patterns 510 and 412, and similar detailed description is therefore omitted.

The set of cut feature layout patterns 610 includes at least cut feature layout pattern 310a, 610b or 310c.

The set of cut feature layout patterns 612 includes at least cut feature layout pattern 312a, 612b or 312c.

Cut feature layout patterns 610b, 612b replace corresponding cut feature layout patterns 510b, 412b of FIG. 5A, and similar detailed description is therefore omitted.

In comparison with cut feature layout patterns 510b, 412b of FIG. 5A, corresponding cut feature layout patterns 610b, 612b are each shifted in the second direction Y by a pitch P1. In some embodiments, by shifting the position of corresponding cut feature layout patterns 610b, 612b of the set of cut feature layout patterns 610 by a pitch P1 changes the pitch of the set of cut feature layout patterns 610 and 612 to be pitch PB2 and PC2.

In some embodiments, cut feature layout patterns 310a, 610b, 310c identify corresponding locations of corresponding portions 610a', 610b', 610c' of conductive structure 630a' or 632a' that are removed in operation 706 of method 700 (FIG. 7).

In some embodiments, cut feature layout patterns 312a, 612b, 312c identify corresponding locations of corresponding portions 612a', 612b', 612c' of conductive structure 634a' or 636a' that are removed in operation 706 of method 700 (FIG. 7).

In some embodiments, at least one of the cut feature layout patterns 310a, 610b, 310c, 312a, 612b or 312c has the width W2 in the second direction Y. In some embodiments, the width W2 corresponds to a cut width (not labelled) of at least portion 310a', 610b', 310c', 312a', 612b' or 312c' of at least conductive structure 630a', 632a', 634a' or 636a'.

Cut feature layout pattern 310a, 312c is separated from corresponding cut feature layout pattern 610b, 612b by a pitch PB2 in the second direction Y. Cut feature layout pattern 610b, 612b is separated from corresponding cut feature layout pattern 310c, 312a by a pitch PC2 in the second direction Y. In some embodiments, at least one of pitch PB1, PB2, PC1 or PC2 is different from at least another of pitch PB1, PB2, PC1 or PC2.

In some embodiments, conductive feature layout pattern 630a, 634a is positioned between corresponding cut feature layout pattern 310a, 312a and corresponding cut feature layout pattern 610b, 612b. In some embodiments, conductive feature layout pattern 632a, 636a is positioned between corresponding cut feature layout pattern 610b, 612b and corresponding cut feature layout pattern 310c, 312c.

In some embodiments, a center of corresponding cut feature layout patterns 610b and 612b is aligned in the first direction X with corresponding gridlines 104a and 102f. In some embodiments, the set of cut feature layout patterns 610 is regular within corresponding standard cell layout patterns 606a and 606b, and the set of cut feature layout patterns 612 is regular within corresponding standard cell layout patterns 608a and 608b.

Other configurations or quantities of patterns in the set of cut feature layout patterns 610 or 612 are within the scope of the present disclosure.

Set of conductive feature layout patterns 620 includes at least conductive feature pattern 420a, 420b, 420c, 420d, 420e or 620f. The set of conductive feature layout patterns 620 is usable to manufacture a corresponding set of conductive structures 620' (FIG. 6B) of integrated circuit 500B. In some embodiments, conductive feature layout pattern 620f of the set of conductive feature layout patterns 620 is usable to manufacture corresponding conductive structure 620f of the set of conductive structures 620' (FIG. 6B) of integrated circuit 600B.

Conductive feature layout pattern 620f replaces conductive feature layout pattern 420f of FIG. 5A, and similar detailed description is therefore omitted. In comparison with conductive feature layout pattern 420f of FIG. 5A, conductive feature layout pattern 620f is longer in length in the first direction X because the position of cut feature layout pattern 610b is shifted away from the conductive feature layout pattern 620f in the second direction Y.

In some embodiments, layout patterns 420b, 420c, 420d, 420e and 620f of the set of conductive feature layout patterns 620 correspond to 5 M2 routing tracks in standard cell layout 506a.

Other configurations or quantities of patterns in the set of conductive feature layout patterns 620 are within the scope of the present disclosure.

Set of conductive feature layout patterns 622 includes at least conductive feature pattern 622a, 422b, 422c, 422d, 422e or 422f. The set of conductive feature layout patterns 622 is usable to manufacture a corresponding set of conductive structures 622' (FIG. 6B) of integrated circuit 600B. In some embodiments, conductive feature layout pattern 622e of the set of conductive feature layout patterns 622 is usable to manufacture corresponding conductive structure 622e' of the set of conductive structures 622' (FIG. 6B) of integrated circuit 600B.

Conductive feature layout pattern 622a replaces conductive feature layout pattern 422a of FIG. 5A, and similar detailed description is therefore omitted. In comparison with conductive feature layout pattern 422a of FIG. 5A, conductive feature layout pattern 622a is shorter in length in the first direction X because the position of cut feature layout pattern 610b is shifted towards the conductive feature layout pattern 622a in the second direction Y.

In some embodiments, layout patterns 422b, 422c, 422d and 422e of the set of conductive feature layout patterns 622 correspond to 4 M2 routing tracks in standard cell layout 606b.

Other configurations or quantities of patterns in the set of conductive feature layout patterns 622 are within the scope of the present disclosure.

Set of conductive feature layout patterns 630 includes at least conductive feature pattern 630a or 130b. Set of conductive feature layout patterns 632 includes at least conductive feature pattern 632a or 132b. Set of conductive feature layout patterns 634 includes at least conductive feature pattern 634a or 134b. Set of conductive feature layout patterns 636 includes at least conductive feature pattern 636a or 136b.

The set of conductive feature layout patterns 630, 632, 634, 636 is usable to manufacture a corresponding set of conductive structures 630', 632', 634', 636' (FIG. 6B) of integrated circuit 600B. In some embodiments, conductive feature layout pattern 630a, 632a, 634a, 636a is usable to manufacture corresponding conductive structure 630a', 632a', 634a', 636a' of the corresponding set of conductive structures 630', 632', 634', 636' (FIG. 6B) of integrated circuit 600B.

Conductive feature layout pattern 630a, 632a, 634a, 636a replaces corresponding conductive feature layout pattern 530a, 532a, 434a, 436a of FIG. 5A, and similar detailed description is therefore omitted.

In comparison with conductive feature layout pattern 530a of FIG. 5A, conductive feature layout pattern 630a is shifted in the second direction Y because of the positions of cut feature layout patterns 310a and 610b.

In comparison with conductive feature layout pattern 532a of FIG. 5A, conductive feature layout pattern 632a is shifted in the second direction Y because of the positions of cut feature layout patterns 610b and 310c.

In comparison with conductive feature layout pattern 434a of FIG. 5A, conductive feature layout pattern 634a is shifted in the second direction Y because of the positions of cut feature layout patterns 312a and 612b.

In comparison with conductive feature layout pattern 436a of FIG. 5A, conductive feature layout pattern 636a is shifted in the second direction Y because of the positions of cut feature layout patterns 612b and 312c.

Other configurations or quantities of patterns in the set of conductive feature layout patterns 630, 632, 634 and 636 are within the scope of the present disclosure.

In some embodiments, by shifting the position of cut feature layout pattern 610b away from conductive feature layout pattern 620f in the second direction Y, an additional conductive feature layout pattern 620f is useable as an additional routing track layout pattern in standard cell layout pattern 606a resulting in additional routing resources that are more efficiently utilized in layout design 600A than other approaches.

FIG. 6B is a diagram of a top view of an integrated circuit 600B, in accordance with some embodiments.

Integrated circuit 600B is a variation of integrated circuit 500B (FIG. 5B), and similar detailed description is therefore omitted. For example, integrated circuit 600B illustrates an example where conductive structures 620f and 622a' replace corresponding conductive structures 420f and 422a' of FIG. 5A, and conductive structures 620f and 622a' have different corresponding lengths in the first direction X from corresponding conductive structures 420f and 422a' of FIG. 5A. In some embodiments, integrated circuit 600B also illustrates an example where a length of corresponding conductive structure 630a', 634a' is different from a length of corresponding conductive structure 632a', 636a' from different pitches (e.g., pitch PB2 and PC2).

Integrated circuit 600B includes standard cells 606a', 606b', 608a' and 608b'. In comparison with integrated circuit 500B of FIG. 5B, standard cells 606a', 606b', 608a' and 608b' replace corresponding standard cells 506a', 506b', 408a' and 408b', and similar detailed description is therefore omitted.

In comparison with integrated circuit 500B of FIG. 5B, the set of conductive structures 620' and 622' replace the corresponding set of conductive structures 520' and 522', the set of conductive structures 630', 632', 634' and 636' replace the corresponding set of conductive structures 530', 532', 434' and 436', and similar detailed description is therefore omitted.

Set of conductive structures 620' includes at least conductive structure 420a', 420b', 420c', 420d', 420e' or 620f. Conductive structure 620f replaces conductive structure 420f of FIG. 5B, and similar detailed description is therefore omitted.

In comparison with conductive structure 420f of FIG. 5B, conductive structure 620f is longer in length in the first direction X because the removed portion 610b' of conductive structure 630a or 632a is shifted away from conductive structure 620f in the second direction Y by the pitch P1. In some embodiments, by increasing the length of conductive structure 620f causes conductive structure 620f to be a functional conductive structure. In some embodiments, at least conductive structure 420b', 420c', 420d', 420e' or 620f of the set of conductive structures 620' are functional conductive structures. In some embodiments, the set of conductive structures 620' has an odd number of functional conductive structures and corresponding routing tracks. In some embodiments, the set of conductive structures 620' has 5 functional conductive structures and corresponding routing tracks.

Set of conductive structures 622' includes at least conductive structure 622a', 422b', 422c', 422d', 422e' or 422f. Conductive structure 622a' replaces conductive structure 422a' of FIG. 5B, and similar detailed description is therefore omitted.

In comparison with conductive structure 422a' of FIG. 5B, conductive structure 622a' is shorter in length in the first direction X because the removed portion 610b' of conductive structure 630a' or 632a' is shifted in the second direction Y by the pitch P1 towards conductive structure 622a'. In some embodiments, by shifting the position of removed portion 310a', 610b', 310c' of conductive structure 630a' or 632a' in the second direction Y, the number of functional or non-functional conductive structures can be adjusted based on the proximity of conductive structures 622a', 422b', 422c', 422d', 422e', 422f to removed portion 310a', 610b', 310c' of conductive structure 630a or 632a.

Conductive structure 622a' has a length shorter in the first direction X than conductive structures 422a' and is therefore a non-functional or a dummy structure. In some embodiments, at least conductive structure 422b', 422c', 422d' or 422e' of the set of conductive structures 622' are functional conductive structures. In some embodiments, the set of conductive structures 622' has an even number of functional conductive structures and corresponding routing tracks. In some embodiments, the set of conductive structures 622' has 4 functional conductive structures and corresponding routing tracks.

In some embodiments, conductive feature layout patterns 620f is useable to manufacture corresponding conductive structure 520f which is an additional functional conductive structure in the corresponding set of conductive structures 620' causing a different number of functional conductive structures in the set of conductive structures 620' and 622'. In some embodiments, by having a different number of functional conductive structures in the set of conductive structures 620' and 622', integrated circuit 600B has an additional functional conductive structure 622f' and corresponding routing track in standard cells 606a' and 606b' resulting in additional routing resources that are more efficiently utilized than other approaches.

Method

FIG. 7 is a flowchart of a method 700 of forming or manufacturing an integrated circuit in accordance with some embodiments. It is understood that additional operations may be performed before, during, and/or after the method 700 depicted in FIG. 7, and that some other operations may only be briefly described herein. In some embodiments, the method 700 is usable to form integrated circuits, such as at least integrated circuit 100C (FIG. 1C), integrated circuit 200B (FIG. 2B), integrated circuit 400B (FIG. 4B), integrated circuit 500B (FIG. 5B) or integrated circuit 600B (FIG. 6B). In some embodiments, the method 700 is usable to form integrated circuits having similar structural relationships as one or more of layout design 100A (FIG. 1A), layout design 200A (FIG. 2A), layout design 300A (FIG. 3A), layout design 400A (FIG. 4A), layout design 500A (FIG. 5A), layout design 600A (FIG. 6A).

In operation 702 of method 700, a layout design of an integrated circuit is generated. In some embodiments the layout design of method 700 includes one or more of layout design 100A (FIG. 1A), layout design 200A (FIG. 2A), layout design 300A (FIG. 3A), layout design 400A (FIG. 4A), layout design 500A (FIG. 5A), layout design 600A (FIG. 6A). In some embodiments, the integrated circuit of method 700 includes one or more of integrated circuit 100C (FIG. 1C), integrated circuit 200B (FIG. 2B), integrated circuit 300B (FIG. 3B), integrated circuit 400B (FIG. 4B), integrated circuit 500B (FIG. 5B) or integrated circuit 600B (FIG. 6B).

Operation 702 is performed by a processing device (e.g., processor 902 (FIG. 9)) configured to execute instructions for generating a layout design. In some embodiments, the layout design is a graphic database system (GDSII) file format.

In operation 704 of method 700, the integrated circuit is manufactured based on the layout design. In some embodiments, operation 704 of method 700 comprises manufacturing at least one mask based on the layout design, and manufacturing the integrated circuit based on the at least one mask.

Method 700 continues with operation 706, where a portion 110b' of conductive structure 130a' or 132a' is removed thereby forming conductive structure 130a' or 132a' of integrated circuit 100C.

In some embodiments, the removed portion 110b' of conductive structure 130a' or 132a' is identified by a cut region (e.g., metal cut feature layout pattern 110b (FIG. 1A-1B)). In some embodiments, operation 706 of method 700 is referred to as a cut-metal one process. In some embodiments, operation 706 results in the formation of IC 100A (FIG. 1A).

In some embodiments, the portion 110b' of conductive structure 130a' or 132a' that is removed in operation 706 is identified in layout design 100A by metal cut feature layout pattern 110b' (FIGS. 1A-1B). In some embodiments, the metal cut feature layout pattern 110b' identifies a location of the removed portion 110b' of conductive structure 130a' or 132a' of integrated circuit 100C.

In some embodiments, the removed portion 110b' of conductive structure 130a' or 132a' comprises a cut width (not labelled) in the second direction Y, and a cut length (not labelled) in the first direction X. In some embodiments, the metal cut feature layout pattern 110b (FIGS. 1A-1B) comprises a pattern width (not labelled) in the second direction Y, and a pattern length (not labelled) in the first direction X. In some embodiments, the pattern width (not labelled) of metal cut feature layout pattern 110b corresponds to the cut width (not labelled) of the removed portion 110b'. In some embodiments, the pattern length (not labelled) of metal cut feature layout pattern 110b corresponds to the cut length (not labelled) of the removed portion 110b'.

In some embodiments, operation 706 of method 700 is performed on conductive structures in integrated circuit 100C that are not sufficiently separated from each other in the second direction Y to ensure a consistent manufactured yield. For example, in these embodiments, if the distance between conductive structure 130a' and corresponding conductive structure 132a' in the second direction Y is less than a minimum distance (e.g., dependent upon manufacturing process), then conductive structure 130a' and corresponding conductive structure 132a' are not sufficiently separated from each other to ensure a consistent manufactured yield, and therefore operation 706 of method 700 is applied to ensure sufficient separation between conductive structure 130a' and corresponding conductive structure 132a'. The minimum distance is the minimum spacing between conductive structures manufactured to ensure a consistent yield. In some embodiments, if the distance between conductive structure 130a' and corresponding conductive structure 132a' in the second direction Y is greater than a minimum distance (e.g., dependent upon manufacturing process), then operation 706 of method 700 is not performed on conductive structure 130a' and corresponding conductive structure 132a'.

In some embodiments, operation 706 is performed by a removal process. In some embodiments, the removal process includes one or more etching processes suitable to remove a portion 110b' of conductive structure 130a' or 132a'. In some embodiments, the etching process of operation 706 includes identifying a portion 110b' of conductive structure 130a' or 132a' that is to be removed, and etching the portion 110b' of conductive structure 130a' or 132a' that is to be removed. In some embodiments, a mask is used to specify portion 110b' of conductive structure 130a' or 132a' that are to be cut or removed. In some embodiments the mask is a hard mask. In some embodiments, the mask is a soft mask. In some embodiments, etching corresponds to plasma etching, reactive ion etching, chemical etching, dry etching, wet etching, other suitable processes, any combination thereof, or the like. In some embodiments, operation 704 or 706 of method 700 is useable to manufacture one or more integrated circuits having one or more of the advantages described in FIG. 1A-1C, 2A-2B, 3A-3B, 4A-4B, 5A-5B or 6A-6B, and similar detailed description is therefore omitted.

While operation 706 was described with respect to conductive structure 130a' and 132a' and portion 110b', it is understood that operation 706 is also applicable to one or more other portions of integrated circuit 100C, 200B, 300B, 400B, 500B or 600B including at least conductive structure 130b', 132b, 134a', 134b, 136a, 136b', 234a, 236a, 430a, 432a, 434a, 436a', 530a', 532a', 630a', 632a', 634a' or 636a', portion 110b', 212b', 410b', 412b', 510b', 610b' or 612b' or the like, or other portions of integrated circuit 100C, 200B, 400B, 500B or 600B identified by one or more cut feature layout patterns in the set of cut feature layout patterns 110, 112, 212, 310, 312, 410, 412, 510, 610 or 612.

Figure 8:
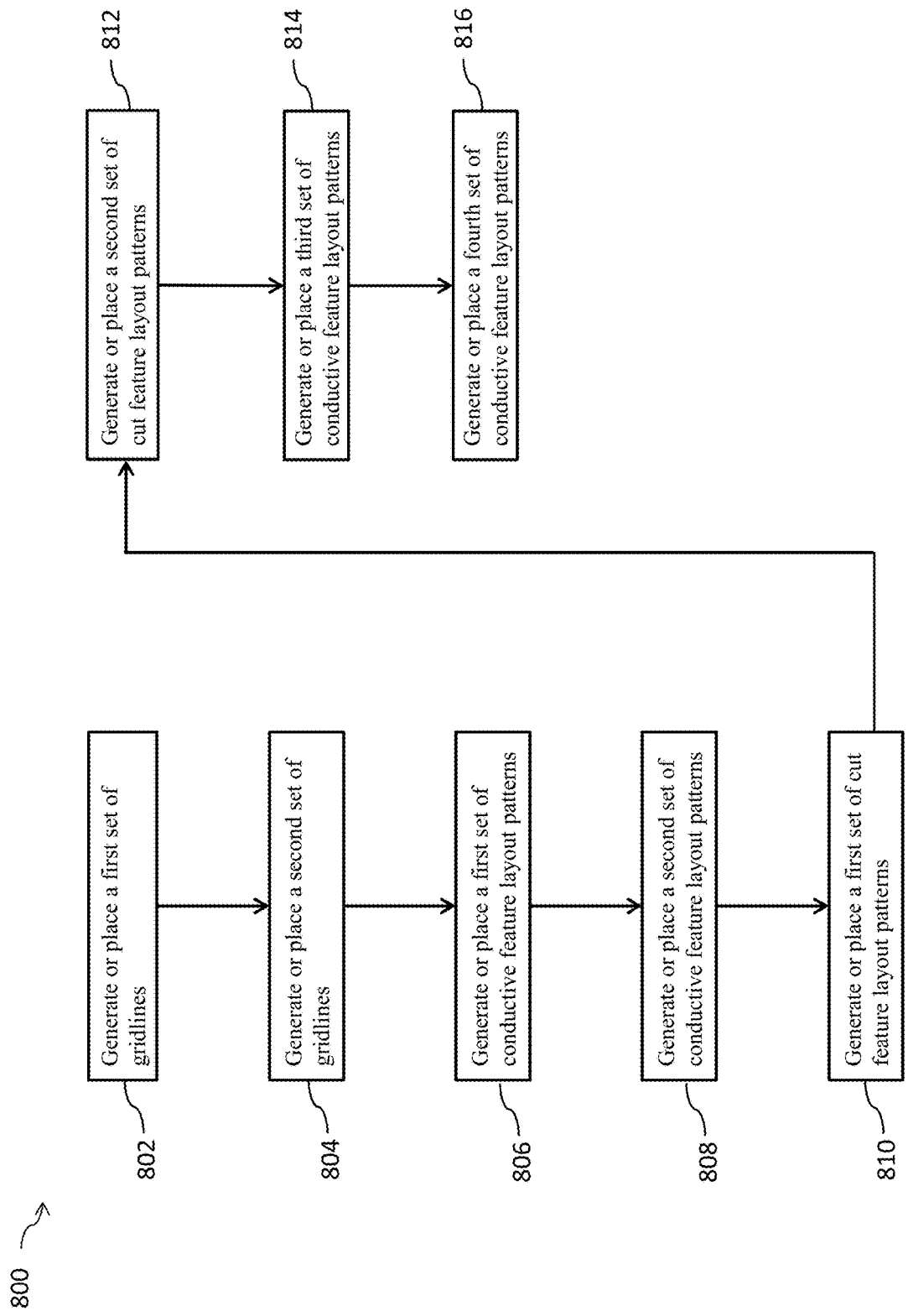
FIG. 8 is a flowchart of a method of generating a layout design of an integrated circuit, in accordance with some embodiments.

FIG. 8 is a flowchart of a method 800 of generating a layout design of an integrated circuit, in accordance with some embodiments. It is understood that additional operations may be performed before, during, and/or after the method 800 depicted in FIG. 8, and that some other processes may only be briefly described herein.

In some embodiments, the method 800 is usable to generate one or more layout patterns of a layout design of an integrated circuit. In some embodiments, the method 800 is usable to generate one or more layout designs, such as layout design 100A (FIG. 1A), layout design 200A (FIG. 2A), layout design 300A (FIG. 3A), layout design 400A (FIG. 4A), layout design 500A (FIG. 5A), layout design 600A (FIG. 6A). In some embodiments, the method 800 is usable to generate one or more layout patterns of a layout design of an integrated circuit, such as at least integrated circuit 100C (FIG. 1C), integrated circuit 200B (FIG. 2B), integrated circuit 300B (FIG. 3B), integrated circuit 400B (FIG. 4B), integrated circuit 500B (FIG. 5B) or integrated circuit 600B (FIG. 6B).

In operation 802 of method 800, a first set of gridlines is generated or placed. In some embodiments, the first set of gridlines is placed on a layout design. In some embodiments, the layout design of method 800 includes at least layout design 100A (FIG. 1A), layout design 200A (FIG. 2A), layout design 300A (FIG. 3A), layout design 400A (FIG. 4A), layout design 500A (FIG. 5A) or layout design 600A (FIG. 6A). In some embodiments, the first set of gridlines of method 800 includes at least the set of gridlines 102 or 104.

In operation 804 of method 800, a second set of gridlines is generated or placed. In some embodiments, the second set of gridlines is placed on the layout design. In some embodiments, the second set of gridlines of method 800 includes at least the set of gridlines 102 or 104.

In operation 806 of method 800, a first set of conductive feature layout patterns is generated or placed. In some embodiments, the first set of conductive feature layout patterns of method 800 is placed on a first layout level. In some embodiments, the first layout level is the M2 layout level. In some embodiments, the first set of conductive feature layout patterns of method 800 includes at least the set of conductive feature layout patterns 120, 122, 124, 126, 224, 226, 420, 422, 424, 426, 520, 522, 620 or 622.

In operation 808 of method 800, a second set of conductive feature layout patterns is generated or placed. In some embodiments, the second set of conductive feature layout patterns of method 800 is placed on the first layout level. In some embodiments, the second set of conductive feature layout patterns of method 800 includes at least the set of conductive feature layout patterns 120, 122, 124, 126, 224, 226, 420, 422, 424, 426, 520, 522, 620 or 622.

In operation 810 of method 800, a first set of cut feature layout patterns is generated or placed. In some embodiments, the first set of cut feature layout patterns of method 800 is placed on a second layout level different from the first layout level. In some embodiments, the second layout level is the M1 layout level. In some embodiments, the first set of cut feature layout patterns of method 800 includes at least the set of cut feature layout patterns 110, 112, 212, 310, 312, 410, 412, 510, 610 or 612.

In operation 812 of method 800, a second set of cut feature layout patterns is generated or placed. In some embodiments, the second set of cut feature layout patterns of method 800 is placed on the second layout level. In some embodiments, the second set of cut feature layout patterns of method 800 includes at least the set of cut feature layout patterns 110, 112, 212, 310, 312, 410, 412, 510, 610 or 612.

In operation 814 of method 800, a third set of conductive feature layout patterns is generated or placed. In some embodiments, the third set of conductive feature layout patterns of method 800 is placed on the second layout level. In some embodiments, the third set of conductive feature layout patterns of method 800 includes at least the set of conductive feature layout patterns 130, 132, 134, 136, 234, 236, 330, 332, 334, 336, 430, 432, 434, 436, 530, 532, 630, 632, 634 or 636.

In operation 814 of method 800, a fourth set of conductive feature layout patterns is generated or placed. In some embodiments, the fourth set of conductive feature layout patterns of method 800 is placed on the second layout level. In some embodiments, the fourth set of conductive feature layout patterns of method 800 includes at least the set of conductive feature layout patterns 130, 132, 134, 136, 234, 236, 330, 332, 334, 336, 430, 432, 434, 436, 530, 532, 630, 632, 634 or 636.

In some embodiments, one or more of operations 806, 808, 810, 812, 814, 816 further includes generating or placing a first set of standard cell layout designs. In some embodiments, one or more of operations 806, 808, 810, 812, 814, 816 further includes generating or placing a second set of standard cell layout designs. In some embodiments, one or more of operations 806, 808, 810, 812, 814, 816 further includes generating or placing a third set of standard cell layout designs. In some embodiments, one or more of operations 806, 808, 810, 812, 814, 816 further includes generating or placing a fourth set of standard cell layout designs.

In some embodiments, at least the first set of standard cell layout designs, the second set of standard cell layout designs, the third set of standard cell layout designs or the fourth set of standard cell layout designs of method 800 includes one or more of standard cell layout designs 106a, 106b, 108a, 108b, 208a, 208b, 306a, 306b, 308a, 308b, 406a, 406b, 408a, 408b, 506a, 506b, 606a, 606b, 608a or 608b.

In some embodiments, at least one of the layout designs, such as layout design 100A, 200A, 300, 400A, 500A or 600A, of the present disclosure, is a standard cell. In some embodiments, one or more of the operations, such as operation 802, 804, 806, 808, 810, 812 or 814, of method 800 is not performed.

One or more of the operations of methods 700-800 is performed by a processing device configured to execute instructions for manufacturing an integrated circuit, such as integrated circuit 100C, 200B, 400B, 500B or 600B. In some embodiments, one or more operations of methods 700-800 is performed using a same processing device as that used in a different one or more operations of methods 700-800. In some embodiments, a different processing device is used to perform one or more operations of methods 700-800 from that used to perform a different one or more operations of methods 700-800.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Figure 9:
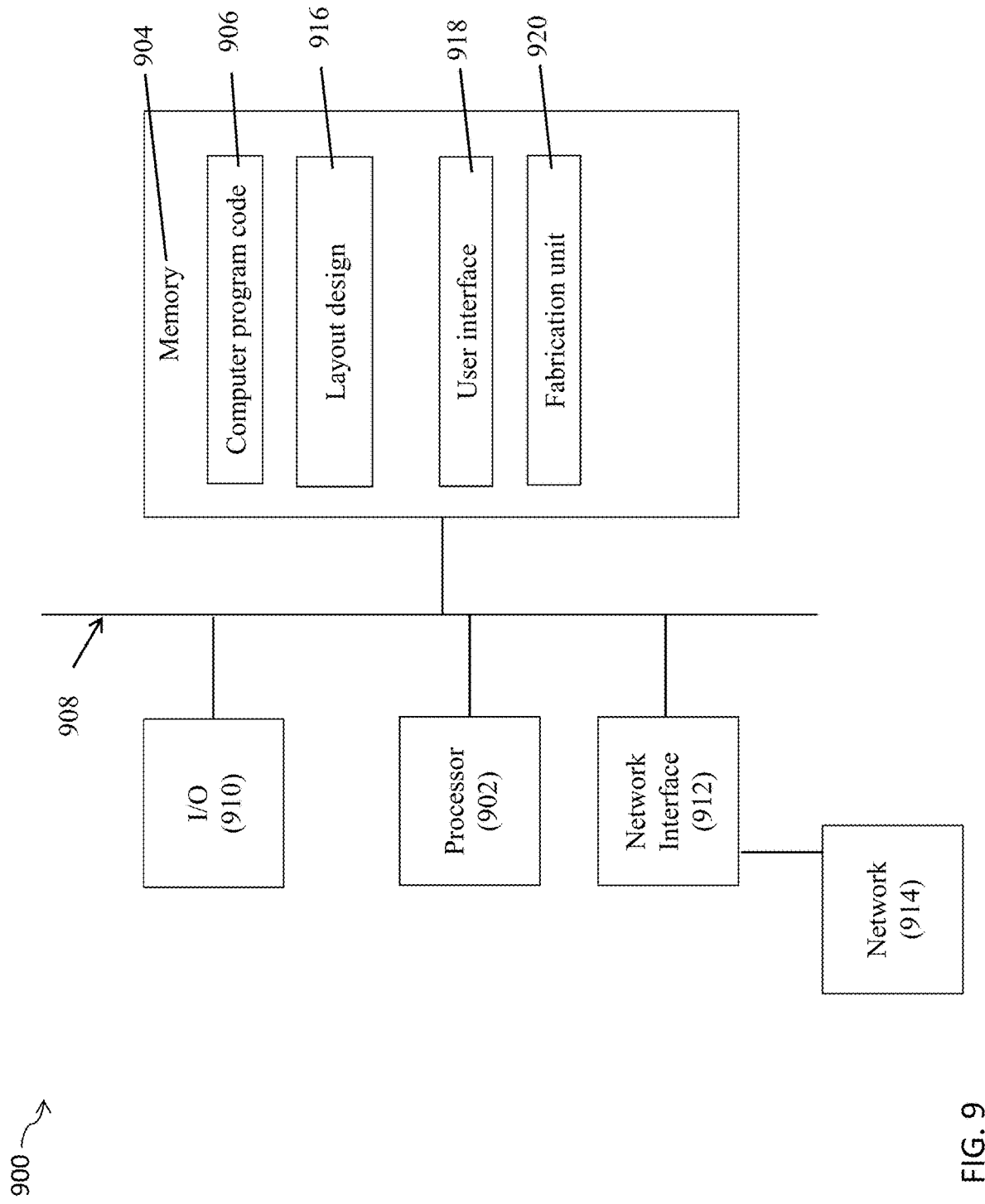
FIG. 9 is a schematic view of a system for designing and manufacturing an IC layout design, in accordance with some embodiments.

FIG. 9 is a schematic view of a system 900 for designing and manufacturing an IC layout design in accordance with some embodiments. In some embodiments, system 900 generates or places one or more IC layout designs described herein. In some embodiments, system 900 manufactures one or more ICs based on the one or more IC layout designs described herein. System 900 includes a hardware processor 902 and a non-transitory, computer readable storage medium 904 encoded with, i.e., storing, the computer program code 906, i.e., a set of executable instructions. Computer readable storage medium 904 is configured for interfacing with manufacturing machines for producing the integrated circuit. The processor 902 is electrically coupled to the computer readable storage medium 904 by a bus 908. The processor 902 is also electrically coupled to an I/O interface 910 by bus 908. A network interface 912 is also electrically connected to the processor 902 by bus 908. Network interface 912 is connected to a network 914, so that processor 902 and computer readable storage medium 904 are capable of connecting to external elements via network 914. The processor 902 is configured to execute the computer program code 906 encoded in the computer readable storage medium 904 in order to cause system 900 to be usable for performing a portion or all of the operations as described in method 700 or 800.

In some embodiments, the processor 902 is a central processing unit (CPU), a multi-processor, a distributed processing system, an application specific integrated circuit (ASIC), and/or a suitable processing unit.

In some embodiments, the computer readable storage medium 904 is an electronic, magnetic, optical, electromagnetic, infrared, and/or a semiconductor system (or apparatus or device). For example, the computer readable storage medium 904 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 904 includes a compact disk-read only memory (CD-ROM), a compact disk-read/write (CD-R/W), and/or a digital video disc (DVD).

In some embodiments, the storage medium 904 stores the computer program code 906 configured to cause system 900 to perform method 700 or 800. In some embodiments, the storage medium 904 also stores information needed for performing method 700 or 800 as well as information generated during performance of method 700 or 800, such as layout design 916, user interface 918 and fabrication unit 920, and/or a set of executable instructions to perform the operation of method 700 or 800. In some embodiments, layout design 916 comprises one or more layout patterns of layout design 100A (FIG. 1A), layout design 200A (FIG. 2A), layout design 300A (FIG. 3A), layout design 400A (FIG. 4A), layout design 500A (FIG. 5A), layout design 600A (FIG. 6A).

In some embodiments, the storage medium 904 stores instructions (e.g., computer program code 906) for interfacing with manufacturing machines. The instructions (e.g., computer program code 906) enable processor 902 to generate manufacturing instructions readable by the manufacturing machines to effectively implement method 700 or 800 during a manufacturing process.

System 900 includes I/O interface 910. I/O interface 910 is coupled to external circuitry. In some embodiments, I/O interface 910 includes a keyboard, keypad, mouse, trackball, trackpad, and/or cursor direction keys for communicating information and commands to processor 902.

System 900 also includes network interface 912 coupled to the processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interface such as ETHERNET, USB, or IEEE-1394. In some embodiments, method 700 or 800 is implemented in two or more systems 900, and information such as layout design, user interface and fabrication unit are exchanged between different systems 900 by network 914.

System 900 is configured to receive information related to a layout design through I/O interface 910 or network interface 912. The information is transferred to processor 902 by bus 908 to determine a layout design for producing an IC (e.g., integrated circuit 100C (FIG. 1C), integrated circuit 200B (FIG. 2B), integrated circuit 400B (FIG. 4B), integrated circuit 500B (FIG. 5B) or integrated circuit 600B (FIG. 6B)). The layout design is then stored in computer readable medium 904 as layout design 916. System 900 is configured to receive information related to a user interface through I/O interface 910 or network interface 912. The information is stored in computer readable medium 904 as user interface 918. System 900 is configured to receive information related to a fabrication unit through I/O interface 910 or network interface 912. The information is stored in computer readable medium 904 as fabrication unit 920. In some embodiments, the fabrication unit 920 includes fabrication information utilized by system 900.

In some embodiments, method 700 or 800 is implemented as a standalone software application for execution by a processor. In some embodiments, method 700 or 800 is implemented as a software application that is a part of an additional software application. In some embodiments, method 700 or 800 is implemented as a plug-in to a software application. In some embodiments, method 700 or 800 is implemented as a software application that is a portion of an EDA tool. In some embodiments, method 700 or 800 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, method 700 or 800 is implemented by a manufacturing device to manufacture an integrated circuit using a set of masks manufactured based on one or more layout designs generated by system 900. In some embodiments, system 900 is a manufacturing device to manufacture an integrated circuit using a set of masks manufactured based on one or more layout designs of the present disclosure. In some embodiments, system 900 of FIG. 9 generates layout designs of an IC that are smaller than other approaches. In some embodiments, system 900 of FIG. 9 generates layout designs of an IC structure that occupy less area than other approaches. In some embodiments, the IC or IC structure of FIG. 9 includes an IC (e.g., integrated circuit 100C (FIG. 1C), integrated circuit 200B (FIG. 2B), integrated circuit 300B (FIG. 3B), integrated circuit 400B (FIG. 4B), integrated circuit 500B (FIG. 5B) or integrated circuit 600B (FIG. 6B)) of the present description.

Figure 10:
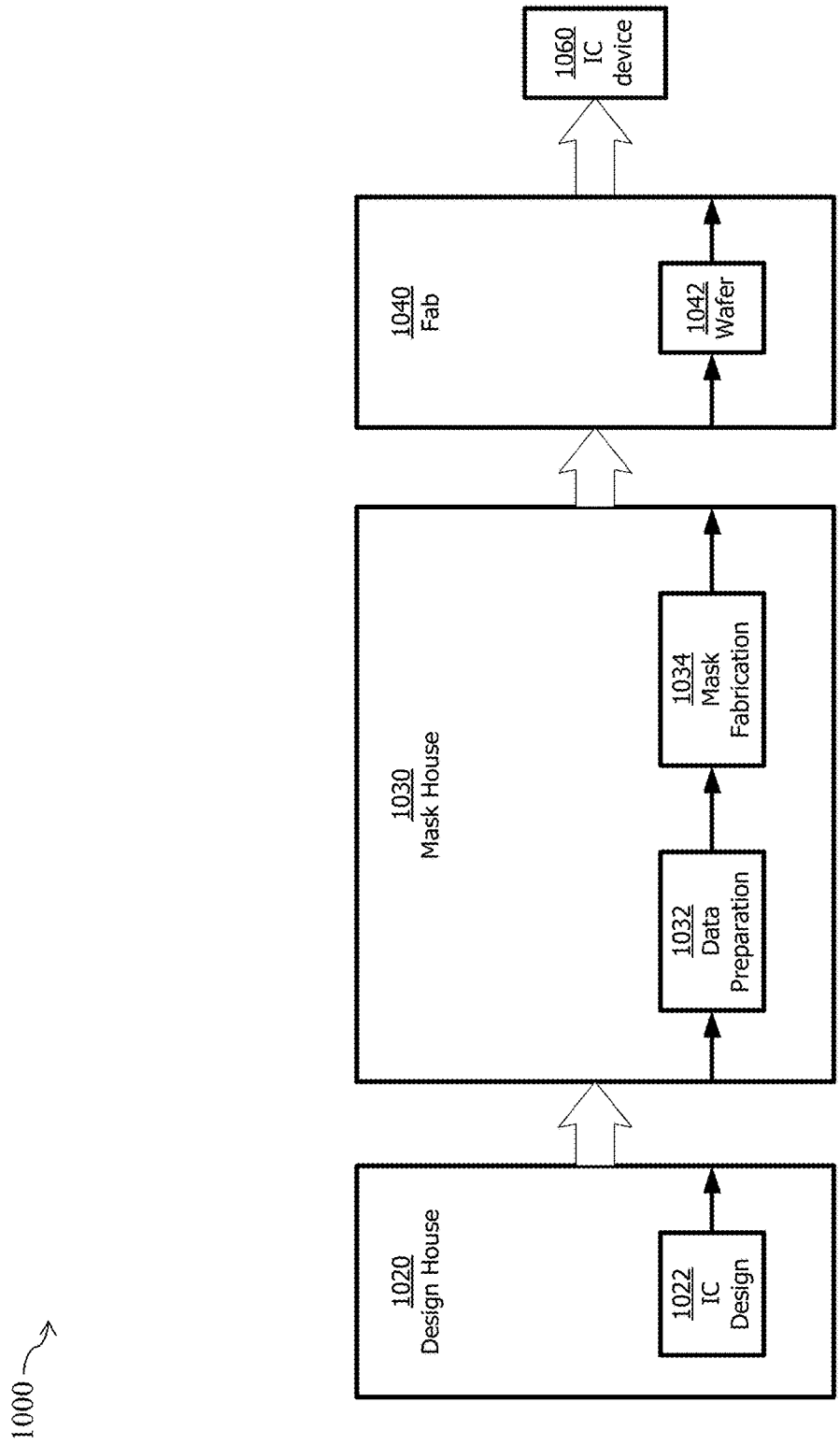
FIG. 10 is a block diagram of an IC manufacturing system, and an IC manufacturing flow associated therewith, in accordance with at least one embodiment of the present disclosure.

FIG. 10 is a block diagram of an integrated circuit (IC) manufacturing system 1000, and an IC manufacturing flow associated therewith, in accordance with at least one embodiment of the present disclosure.

In FIG. 10, IC manufacturing system 1000 includes entities, such as a design house 1020, a mask house 1030, and an IC manufacturer/fabricator ("fab") 1040, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1040 is owned by a single larger company. In some embodiments, two or more of design house 1020, mask house 1030, and IC fab 1040 coexist in a common facility and use common resources.

Design house (or design team) 1020 generates an IC design layout 1022. IC design layout 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout 1022 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout 1022. The design procedure includes one or more of logic design, physical design or place and route. IC design layout 1022 is presented in one or more data files having information of the geometrical patterns. For example, IC design layout 1022 can be expressed in a GDSII file format or DFII file format.

Mask house 1030 includes data preparation 1032 and mask fabrication 1034. Mask house 1030 uses IC design layout 1022 to manufacture one or more masks to be used for fabricating the various layers of IC device 1060 according to IC design layout 1022. Mask house 1030 performs mask data preparation 1032, where IC design layout 1022 is translated into a representative data file ("RDF"). Mask data preparation 1032 provides the RDF to mask fabrication 1034. Mask fabrication 1034 includes a mask writer. A mask writer converts the RDF to an image on a substrate, such as a mask (reticle) or a semiconductor wafer. The design layout is manipulated by mask data preparation 1032 to comply with particular characteristics of the mask writer and/or requirements of IC fab 1040. In FIG. 10, mask data preparation 1032 and mask fabrication 1034 are illustrated as separate elements. In some embodiments, mask data preparation 1032 and mask fabrication 1034 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1034, which may undo part of the modifications performed by OPC in order to meet mask creation rules.

In some embodiments, mask data preparation 1032 includes lithography process checking (LPC) that simulates processing that will be implemented by IC fab 1040 to fabricate IC device 1060. LPC simulates this processing based on IC design layout 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1022.

It should be understood that the above description of mask data preparation 1032 has been simplified for the purposes of clarity. In some embodiments, data preparation 1032 includes additional features such as a logic operation (LOP) to modify the IC design layout according to manufacturing rules. Additionally, the processes applied to IC design layout 1022 during data preparation 1032 may be executed in a variety of different orders.

After mask data preparation 1032 and during mask fabrication 1034, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1034 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1040 is an IC fabrication entity that includes one or more manufacturing facilities for the fabrication of a variety of different IC products. In some embodiments, IC Fab 1040 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1040 uses the mask (or masks) fabricated by mask house 1030 to fabricate IC device 1060. Thus, IC fab 1040 at least indirectly uses IC design layout 1022 to fabricate IC device 1060. In some embodiments, a semiconductor wafer 1042 is fabricated by IC fab 1040 using the mask (or masks) to form IC device 1060. Semiconductor wafer 1042 includes a silicon substrate or other proper substrate having material layers formed thereon. Semiconductor wafer further includes one or more of various doped regions, dielectric features, multilevel interconnects, and the like (formed at subsequent manufacturing steps).

System 1000 is shown as having design house 1020, mask house 1030 or IC fab 1040 as separate components or entities. However, it is understood that one or more of design house 1020, mask house 1030 or IC fab 1040 are part of the same component or entity.

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a method of forming an integrated circuit (IC). In some embodiments, the method includes generating, by a processor, a first standard cell layout design of the integrated circuit, generating a second standard cell layout design of the integrated circuit, generating a first set of cut feature layout patterns extending in a first direction, and manufacturing the integrated circuit based on at least the first standard cell layout design or the second standard cell layout design. In some embodiments, the second standard cell layout design abuts the first standard cell layout design in the first direction. In some embodiments, a side of a first cut feature layout pattern of the first set of cut feature layout patterns extends in the first direction, and is aligned with a first gridline of the first set of gridlines or the second set of gridlines. In some embodiments, the generating the first standard cell layout design includes generating a first set of conductive feature layout patterns extending in the first direction, being located on a first metal level and overlapping a first set of gridlines extending in the first direction. In some embodiments, the first set of conductive feature layout patterns corresponds to fabricating a first set of conductive structures. In some embodiments, the generating the second standard cell layout design includes generating a second set of conductive feature layout patterns extending in the first direction, being located on the first metal level and overlapping a second set of gridlines extending in the first direction. In some embodiments, the second set of conductive feature layout patterns corresponds to fabricating a second set of conductive structures. In some embodiments, the second set of gridlines is separated from the first set of gridlines in a second direction different from the first direction. In some embodiments, a center of each conductive feature layout pattern of the first set of conductive feature layout patterns is aligned with a corresponding gridline of the first set of gridlines. In some embodiments, a center of each conductive feature layout pattern of the second set of conductive feature layout patterns is aligned with a corresponding gridline of the second set of gridlines. In some embodiments, the first set of cut feature layout patterns includes the first cut feature layout pattern, a second cut feature layout pattern separated from the first cut feature layout pattern by a first pitch in the second direction, and a third cut feature layout pattern separated from the first cut feature layout pattern by a second pitch in the second direction. In some embodiments, generating the first standard cell layout design further includes generating a first conductive feature layout pattern extending in the second direction. In some embodiments, the first conductive feature layout pattern is located on a second metal level below the first metal level. In some embodiments, the first conductive feature layout pattern corresponds to fabricating a first conductive structure. In some embodiments, the first conductive feature layout pattern is positioned between the first cut feature layout pattern and the second cut feature layout pattern. In some embodiments, generating the second standard cell layout design further includes generating a second conductive feature layout pattern extending in the second direction. In some embodiments, the second conductive feature layout pattern is located on the second metal level. In some embodiments, the second conductive feature layout pattern corresponds to fabricating a second conductive structure. In some embodiments, the second conductive feature layout pattern is positioned between the first cut feature layout pattern and the third cut feature layout pattern. In some embodiments, the first cut feature layout pattern corresponds to identifying a location of a removed portion of the first conductive structure or the second conductive structure. In some embodiments, the method further includes generating a third standard cell layout design of the integrated circuit. In some embodiments, the third standard cell layout design abuts the first standard cell layout design in the second direction. In some embodiments, generating the third standard cell layout design includes generating a third set of conductive feature layout patterns extending in the first direction, being located on the first metal level and overlapping the first set of gridlines. In some embodiments, the third set of conductive feature layout patterns corresponds to fabricating a third set of conductive structures. In some embodiments, the method further includes generating a fourth standard cell layout design of the integrated circuit. In some embodiments, the fourth standard cell layout design abuts the third standard cell layout design in the first direction, and abuts the second standard cell layout design in the second direction. In some embodiments, generating the fourth standard cell layout design includes generating a fourth set of conductive feature layout patterns extending in the first direction, being located on the first metal level and overlapping the second set of gridlines. In some embodiments, the fourth set of conductive feature layout patterns corresponds to fabricating a fourth set of conductive structures. In some embodiments, generating the fourth standard cell layout design includes generating a second set of cut feature layout patterns extending in the first direction. In some embodiments, the first set of conductive structures includes an odd number of conductive structures, the second set of conductive structures includes an even number of conductive structures, the third set of conductive structures includes the odd number of conductive structures, and the fourth set of conductive structures includes the even number of conductive structures. In some embodiments, the first set of conductive structures includes an odd number of conductive structures, the second set of conductive structures includes an even number of conductive structures, the third set of conductive structures includes the even number of conductive structures, and the fourth set of conductive structures includes the odd number of conductive structures. In some embodiments, the second set of cut feature layout patterns includes a fourth cut feature layout pattern, a fifth cut feature layout pattern separated from the fourth cut feature layout pattern by a third pitch in the second direction, and a sixth cut feature layout pattern separated from the fourth cut feature layout pattern by a fourth pitch in the second direction. In some embodiments, the first pitch is equal to the third pitch, and the second pitch is equal to the fourth pitch. In some embodiments, each of the first pitch, the second pitch, the third pitch, and the fourth pitch are equal to each other.

Another aspect of this description relates to a system for designing an integrated circuit. In some embodiments, the system includes a non-transitory computer readable medium configured to store executable instructions, and a processor coupled to the non-transitory computer readable medium. In some embodiments, the processor is configured to execute the instructions for generating a first set of routing tracks and a second set of routing tracks extending in a first direction. In some embodiments, the second set of routing tracks is separated from the first set of routing tracks in a second direction different from the first direction. In some embodiments, the processor is further configured to execute the instructions for generating a first set of conductive feature layout patterns extending in the first direction, and being located on a first metal level. In some embodiments, the first set of conductive feature layout patterns corresponds to fabricating a first set of conductive structures having an odd number of conductive structures. In some embodiments, a side of each layout pattern of the first set of conductive feature layout patterns is aligned in the first direction with a corresponding routing track of the first set of routing tracks. In some embodiments, the processor is further configured to execute the instructions for generating a second set of conductive feature layout patterns extending in the first direction, and being located on the first metal level. In some embodiments, the second set of conductive feature layout patterns corresponds to fabricating a second set of conductive structures having an even number of conductive structures. In some embodiments, a side of each layout pattern of the second set of conductive feature layout patterns is aligned in the first direction with a corresponding routing track of the second set of routing tracks. In some embodiments, the processor is further configured to execute the instructions for generating a third set of conductive feature layout patterns extending in the second direction, and being located on a second metal level different from the first metal level. In some embodiments, the third set of conductive feature layout patterns corresponds to fabricating a third set of conductive structures. In some embodiments, the processor is configured to execute instructions for generating a fourth set of conductive feature layout patterns extending in the first direction, and being located on the first metal level. In some embodiments, the fourth set of conductive feature layout patterns corresponds to fabricating a fourth set of conductive structures. In some embodiments, the side of each layout pattern of the first set of conductive feature layout patterns is aligned in the first direction with a corresponding side of each layout pattern of the fourth set of conductive feature layout patterns. In some embodiments, the processor is configured to execute instructions for generating a fifth set of conductive feature layout patterns extending in the first direction, and being located on the first metal level. In some embodiments, the fifth set of conductive feature layout patterns corresponds to fabricating a fifth set of conductive structures. In some embodiments, the side of each layout pattern of the second set of conductive feature layout patterns is aligned in the first direction with a corresponding side of each layout pattern of the fifth set of conductive feature layout patterns. In some embodiments, the processor is configured to execute instructions for generating a first set of cut feature layout patterns extending in the first direction, a first cut feature layout pattern of the first set of cut feature layout patterns identifying a first location of a first removed portion of a first conductive structure of the third set of conductive structures of the integrated circuit. In some embodiments, the processor is configured to execute instructions for generating a second set of cut feature layout patterns extending in the first direction, and a second cut feature layout pattern of the second set of cut feature layout patterns identifying a second location of a second removed portion of a second conductive structure of the third set of conductive structures of the integrated circuit. In some embodiments, the processor is configured to execute instructions for generating the first set of cut feature layout patterns, where a center of each cut feature layout pattern of the first set of cut feature layout patterns is aligned in the first direction with a corresponding routing track of the first set of routing tracks. In some embodiments, the processor is configured to execute instructions for generating the second set of cut feature layout patterns, where a center of each cut feature layout pattern of the second set of cut feature layout patterns is aligned in the first direction with a corresponding routing track of the second set of routing tracks. In some embodiments, the processor is configured to execute instructions for generating the first set of cut feature layout patterns that includes generating the first set of cut feature layout patterns that includes the first cut feature layout pattern, a third cut feature layout pattern separated from the first cut feature layout pattern by a first pitch in the second direction, and a fourth cut feature layout pattern separated from the first cut feature layout pattern by a second pitch in the second direction. In some embodiments, the processor is configured to execute instructions for generating the second set of cut feature layout patterns that includes generating the second set of cut feature layout patterns that includes the second cut feature layout pattern, a fifth cut feature layout pattern separated from the second cut feature layout pattern by a third pitch in the second direction, and a sixth cut feature layout pattern separated from the second cut feature layout pattern by a fourth pitch in the second direction. In some embodiments, the processor is configured to execute instructions where the first pitch is equal to the third pitch, and the second pitch is equal to the fourth pitch.

In some embodiments, the processor is configured to execute instructions where each of the first pitch, the second pitch, the third pitch, and the fourth pitch are equal to each other.

Still another aspect of this description relates to an integrated circuit. In some embodiments, the integrated circuit includes a first region, a second region, a third region, and a fourth region. In some embodiments, the first region of the integrated circuit includes a first set of conductive structures extending in a first direction, being located on a first metal layer and having an odd number of functional conductive structures. In some embodiments, the second region of the integrated circuit includes a second set of conductive structures extending in the first direction, being located on the first metal layer and having an even number of functional conductive structures. In some embodiments, the second set of conductive structures is separated from the first set of conductive structures in a second direction different from the first direction. In some embodiments, the third region of the integrated circuit includes a third set of conductive structures extending in the first direction, being located on the first metal layer and having the odd number of functional conductive structures. In some embodiments, the fourth region of the integrated circuit includes a fourth set of conductive structures. In some embodiments, the first region of the integrated circuit further includes a first conductive structure extending in the second direction, being located on a second metal layer below the first metal layer. In some embodiments, the second region of the integrated circuit further includes a second conductive structure extending in the second direction, being located on the second metal layer; and being separated from the first conductive structure in the second direction. In some embodiments, the third region of the integrated circuit further includes a third conductive structure extending in the second direction, and being located on the second metal layer. In some embodiments, the fourth region of the integrated circuit further includes a fourth conductive structure extending in the second direction, being located on the second metal layer, and being separated from the third conductive structure in the second direction. In some embodiments, the first region of the integrated circuit has a first height in the second direction. In some embodiments, the second region of the integrated circuit has a second height in the second direction. In some embodiments, the third region of the integrated circuit has a third height in the second direction. In some embodiments, the fourth region of the integrated circuit has a fourth height and the second direction. In some embodiments, each of the first height, the second height, the third height and the fourth height are equal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC), the method comprising:
generating, by a processor, a first standard cell layout design of the integrated circuit, wherein the generating the first standard cell layout design comprises:
generating a first set of conductive feature layout patterns extending in a first direction, being located on a first metal level and overlapping a first set of gridlines extending in the first direction;
generating a second standard cell layout design of the integrated circuit, the second standard cell layout design abutting the first standard cell layout design in the first direction, wherein the generating the second standard cell layout design comprises:
generating a second set of conductive feature layout patterns extending in the first direction, being located on the first metal level and overlapping a second set of gridlines extending in the first direction, and the second set of gridlines being separated from the first set of gridlines in a second direction different from the first direction;
generating a first set of cut feature layout patterns extending in the first direction, a side of a first cut feature layout pattern of the first set of cut feature layout patterns extending in the first direction is aligned with a first gridline of the first set of gridlines or the second set of gridlines; and
manufacturing the integrated circuit based on at least the first standard cell layout design or the second standard cell layout design.

2. The method of claim 1, wherein
a center of each conductive feature layout pattern of the first set of conductive feature layout patterns is aligned with a corresponding gridline of the first set of gridlines; and
a center of each conductive feature layout pattern of the second set of conductive feature layout patterns is aligned with a corresponding gridline of the second set of gridlines.

3. The method of claim 1, wherein
the first set of cut feature layout patterns comprises:
the first cut feature layout pattern;
a second cut feature layout pattern separated from the first cut feature layout pattern by a first pitch in the second direction; and
a third cut feature layout pattern separated from the first cut feature layout pattern by a second pitch in the second direction.

4. The method of claim 3, wherein
generating the first standard cell layout design further comprises:
generating a first conductive feature layout pattern extending in the second direction, the first conductive feature layout pattern being located on a second metal level below the first metal level, the first conductive feature layout pattern corresponding to fabricating a first conductive structure, the first conductive feature layout pattern positioned between the first cut feature layout pattern and the second cut feature layout pattern; and
generating the second standard cell layout design further comprises:
generating a second conductive feature layout pattern extending in the second direction, the second conductive feature layout pattern being located on the second metal level, the second conductive feature layout pattern corresponding to fabricating a second conductive structure, the second conductive feature layout pattern positioned between the first cut feature layout pattern and the third cut feature layout pattern, and the first cut feature layout pattern corresponding to identifying a location of a removed portion of the first conductive structure or the second conductive structure.

5. The method of claim 3, further comprising:
generating a third standard cell layout design of the integrated circuit, the third standard cell layout design abutting the first standard cell layout design in the second direction, wherein the generating the third standard cell layout design comprises:
generating a third set of conductive feature layout patterns extending in the first direction, being located on the first metal level and overlapping the first set of gridlines;
generating a fourth standard cell layout design of the integrated circuit, the fourth standard cell layout design abutting the third standard cell layout design in the first direction, and abutting the second standard cell layout design in the second direction, wherein the generating the fourth standard cell layout design comprises:
generating a fourth set of conductive feature layout patterns extending in the first direction, being located on the first metal level and overlapping the second set of gridlines; and
generating a second set of cut feature layout patterns extending in the first direction.

6. The method of claim 5, wherein
the first set of conductive feature layout patterns corresponds to fabricating a first set of conductive structures, the first set of conductive structures including an odd number of conductive structures;
the second set of conductive feature layout patterns corresponds to fabricating a second set of conductive structures, the second set of conductive structures including an even number of conductive structures;
the third set of conductive feature layout patterns corresponds to fabricating a third set of conductive structures, the third set of conductive structures including the odd number of conductive structures; and
the fourth set of conductive feature layout patterns corresponds to fabricating a fourth set of conductive structures, the fourth set of conductive structures including the even number of conductive structures.

7. The method of claim 5, wherein
the first set of conductive feature layout patterns corresponds to fabricating a first set of conductive structures, the first set of conductive structures including an odd number of conductive structures;
the second set of conductive feature layout patterns corresponds to fabricating a second set of conductive structures, the second set of conductive structures including an even number of conductive structures;
the third set of conductive feature layout patterns corresponds to fabricating a third set of conductive structures, the third set of conductive structures including the even number of conductive structures; and
the fourth set of conductive feature layout patterns corresponds to fabricating a fourth set of conductive structures, the fourth set of conductive structures including the odd number of conductive structures.

8. The method of claim 5, wherein the second set of cut feature layout patterns comprises:
a fourth cut feature layout pattern;
a fifth cut feature layout pattern separated from the fourth cut feature layout pattern by a third pitch in the second direction; and a sixth cut feature layout pattern separated from the fourth cut feature layout pattern by a fourth pitch in the second direction.

9. The method of claim 8, wherein
the first pitch is equal to the third pitch, and
the second pitch is equal to the fourth pitch.

10. The method of claim 8, wherein each of the first pitch, the second pitch, the third pitch, and the fourth pitch are equal to each other.

11. An integrated circuit comprising:
a first region of the integrated circuit comprising:
a first set of conductive structures extending in a first direction, being located on a first metal layer and having an odd number of functional conductive structures; and
a first conductive structure extending in a second direction different from the first direction, being located on a second metal layer below the first metal layer;
a second region of the integrated circuit comprising:
a second set of conductive structures extending in the first direction, being located on the first metal layer and having an even number of functional conductive structures, the second set of conductive structures being separated from the first set of conductive structures in the second direction;
a third region of the integrated circuit comprising:
a third set of conductive structures extending in the first direction, being located on the first metal layer and having the odd number of functional conductive structures; and
a fourth region of the integrated circuit comprising:
a fourth set of conductive structures extending in the first direction, being located on the first metal layer and having the even number of functional conductive structures, the fourth set of conductive structures being separated from the third set of conductive structures in the second direction.

12. The integrated circuit of claim 11, wherein
the second region of the integrated circuit further comprises:
a second conductive structure extending in the second direction, being located on the second metal layer; and being separated from the first conductive structure in the second direction;
the third region of the integrated circuit further comprises:
a third conductive structure extending in the second direction, and being located on the second metal layer; and
the fourth region of the integrated circuit further comprises:
a fourth conductive structure extending in the second direction, being located on the second metal layer, and being separated from the third conductive structure in the second direction.

13. The integrated circuit of claim 11, wherein
the first region of the integrated circuit has a first height in the second direction,
the second region of the integrated circuit has a second height in the second direction,
the third region of the integrated circuit has a third height in the second direction,
the fourth region of the integrated circuit has a fourth height in the second direction, and
each of the first height, the second height, the third height and the fourth height being equal.

14. A method of forming an integrated circuit (IC), the method comprising:
- generating, by a processor, a first standard cell layout design of the integrated circuit, wherein the generating the first standard cell layout design comprises:
  - placing a first set of conductive feature layout patterns on a first metal level, extending in a first direction, and overlapping a first set of gridlines extending in the first direction;
- generating a second standard cell layout design of the integrated circuit, the second standard cell layout design abutting the first standard cell layout design in the first direction, wherein the generating the second standard cell layout design comprises:
  - placing a second set of conductive feature layout patterns on the first metal level, extending in the first direction, and overlapping a second set of gridlines extending in the first direction, and the second set of gridlines being separated from the first set of gridlines in a second direction different from the first direction;
- generating a first set of cut feature layout patterns extending in the first direction, a side of a first cut feature layout pattern of the first set of cut feature layout patterns extending in the first direction is aligned with a first gridline of the first set of gridlines or the second set of gridlines; and
- manufacturing the integrated circuit based on at least the first standard cell layout design or the second standard cell layout design.

15. The method of claim 14, wherein
- a center of each conductive feature layout pattern of the first set of conductive feature layout patterns is aligned with a corresponding gridline of the first set of gridlines; and
- a center of each conductive feature layout pattern of the second set of conductive feature layout patterns is aligned with a corresponding gridline of the second set of gridlines.

16. The method of claim 14, wherein
the first set of cut feature layout patterns comprises:
- the first cut feature layout pattern;
- a second cut feature layout pattern separated from the first cut feature layout pattern by a first pitch in the second direction; and
- a third cut feature layout pattern separated from the first cut feature layout pattern by a second pitch in the second direction.

17. The method of claim 16, wherein
generating the first standard cell layout design further comprises:
- placing a first conductive feature layout pattern located on a second metal level below the first metal level, the first conductive feature layout pattern extending in the second direction, the first conductive feature layout pattern corresponding to fabricating a first conductive structure, the first conductive feature layout pattern positioned between the first cut feature layout pattern and the second cut feature layout pattern; and generating the second standard cell layout design further comprises:
- placing a second conductive feature layout pattern on the second metal level, the second conductive feature layout pattern extending in the second direction, the second conductive feature layout pattern corresponding to fabricating a second conductive structure, the second conductive feature layout pattern positioned between the first cut feature layout pattern and the third cut feature layout pattern, and the first cut feature layout pattern corresponding to identifying a location of a removed portion of the first conductive structure or the second conductive structure.

18. The method of claim 16, further comprising:
generating a third standard cell layout design of the integrated circuit, the third standard cell layout design abutting the first standard cell layout design in the second direction, wherein the generating the third standard cell layout design comprises:
- placing a third set of conductive feature layout patterns on the first metal level, extending in the first direction, and overlapping the first set of gridlines;

generating a fourth standard cell layout design of the integrated circuit, the fourth standard cell layout design abutting the third standard cell layout design in the first direction, and abutting the second standard cell layout design in the second direction, wherein the generating the fourth standard cell layout design comprises:
- placing a fourth set of conductive feature layout patterns on the first metal level, extending in the first direction, and overlapping the second set of gridlines; and generating a second set of cut feature layout patterns extending in the first direction.

19. The method of claim 18, wherein
- the first set of conductive feature layout patterns corresponds to fabricating a first set of conductive structures, the first set of conductive structures including an odd number of conductive structures;
- the second set of conductive feature layout patterns corresponds to fabricating a second set of conductive structures, the second set of conductive structures including an even number of conductive structures;
- the third set of conductive feature layout patterns corresponds to fabricating a third set of conductive structures, the third set of conductive structures including the odd number of conductive structures; and
- the fourth set of conductive feature layout patterns corresponds to fabricating a fourth set of conductive structures, the fourth set of conductive structures including the even number of conductive structures.

20. The method of claim 18, wherein
- the first set of conductive feature layout patterns corresponds to fabricating a first set of conductive structures, the first set of conductive structures including an odd number of conductive structures;
- the second set of conductive feature layout patterns corresponds to fabricating a second set of conductive structures, the second set of conductive structures including an even number of conductive structures;
- the third set of conductive feature layout patterns corresponds to fabricating a third set of conductive structures, the third set of conductive structures including the even number of conductive structures; and
- the fourth set of conductive feature layout patterns corresponds to fabricating a fourth set of conductive structures, the fourth set of conductive structures including the odd number of conductive structures.

* * * * *